(12) United States Patent
Song et al.

(10) Patent No.: US 9,748,246 B2
(45) Date of Patent: Aug. 29, 2017

(54) SEMICONDUCTOR INTEGRATED CIRCUITS HAVING CONTACTS SPACED APART FROM ACTIVE REGIONS

(71) Applicants: Tae-Joong Song, Seongnam-si (KR); Jung-Han Kim, Hwaseong-si (KR)

(72) Inventors: Tae-Joong Song, Seongnam-si (KR); Jung-Han Kim, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/877,247

(22) Filed: Oct. 7, 2015

(65) Prior Publication Data

US 2016/0133569 A1    May 12, 2016

Related U.S. Application Data

(60) Provisional application No. 62/075,984, filed on Nov. 6, 2014.

(30) Foreign Application Priority Data

Feb. 24, 2015    (KR) ........................ 10-2015-0026079

(51) Int. Cl.
   *H01L 27/092* (2006.01)
   *H01L 27/02* (2006.01)
   *H03K 3/356* (2006.01)

(52) U.S. Cl.
   CPC ...... *H01L 27/0928* (2013.01); *H01L 27/0207* (2013.01); *H01L 27/092* (2013.01); *H03K 3/356156* (2013.01)

(58) Field of Classification Search
   CPC ....... G09G 2310/08; G09G 2300/0426; G09G 2330/021; H01L 27/0928; H01L 27/0207; H01L 27/092; H03K 3/356156
   See application file for complete search history.

(56) References Cited

U.S. PATENT DOCUMENTS 5,436,485 A    7/1995   Shikatani et al.
5,994,726 A    11/1999  Ikeda et al.
(Continued)

FOREIGN PATENT DOCUMENTS

JP    1994-275802    9/1994
JP    1996-055971    2/1996
(Continued)

*Primary Examiner* — Marc Armand
*Assistant Examiner* — Shannon Yi
(74) *Attorney, Agent, or Firm* — Harness, Dickey & Pierce, PLC

(57) ABSTRACT

First and second active regions are doped with different types of impurities, and extend in a first direction and spaced apart from each other in a second direction. First and third gate structures, which are on the first active region and a first portion of the isolation layer between the first and second active regions, extend in the second direction and are spaced apart from each other in the first direction. Second and fourth gate structures, which are on the second active region and the first portion, extend in the second direction, are spaced apart from each other in the first direction, and face and are spaced apart from the first and third gate structures, respectively, in the second direction. First to fourth contacts are on portions of the first to fourth gate structures, respectively. The first and fourth contacts are connected, and the second and third contacts are connected.

20 Claims, 31 Drawing Sheets

(56) References Cited

U.S. PATENT DOCUMENTS

| | | | |
|---|---|---|---|
| 6,084,255 A | 7/2000 | Ueda et al. | |
| 7,808,017 B2 | 10/2010 | Hamada | |
| 7,842,975 B2 | 11/2010 | Becker et al. | |
| 7,956,421 B2 * | 6/2011 | Becker | H01L 27/0207 257/369 |
| 8,030,689 B2 | 10/2011 | Becker et al. | |
| 8,129,753 B2 | 3/2012 | Becker et al. | |
| 8,217,428 B2 | 7/2012 | Becker et al. | |
| 8,258,547 B2 | 9/2012 | Becker et al. | |
| 8,258,550 B2 | 9/2012 | Becker et al. | |
| 8,258,552 B2 | 9/2012 | Becker et al. | |
| 8,264,044 B2 | 9/2012 | Becker | |
| 8,264,049 B2 | 9/2012 | Becker | |
| 8,723,574 B2 | 5/2014 | Tomita | |
| 8,729,606 B2 | 5/2014 | Becker et al. | |
| 8,735,944 B2 | 5/2014 | Becker et al. | |
| 8,872,283 B2 | 10/2014 | Becker et al. | |
| 2009/0115468 A1 * | 5/2009 | Berthold | H03K 3/356156 327/141 |
| 2010/0133589 A1 * | 6/2010 | Aruga | H01L 27/0207 257/206 |
| 2016/0128135 A1 * | 5/2016 | Forde | H04B 1/3888 370/345 |

FOREIGN PATENT DOCUMENTS

| | | |
|---|---|---|
| JP | 1998-092948 | 4/1998 |
| JP | 2007-073885 A | 3/2007 |

* cited by examiner

FIG. 2A
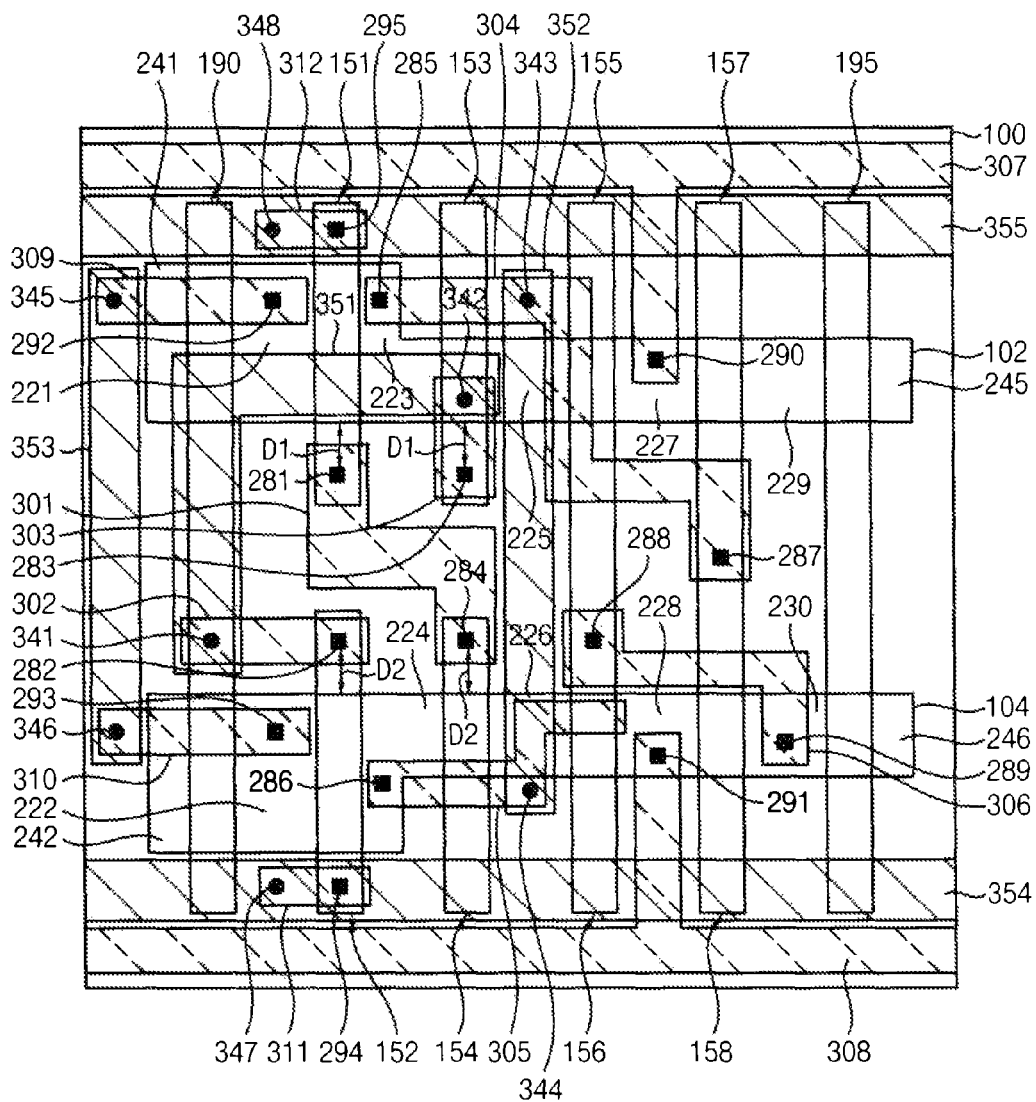
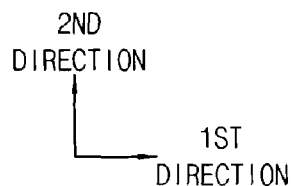

FIG.2B
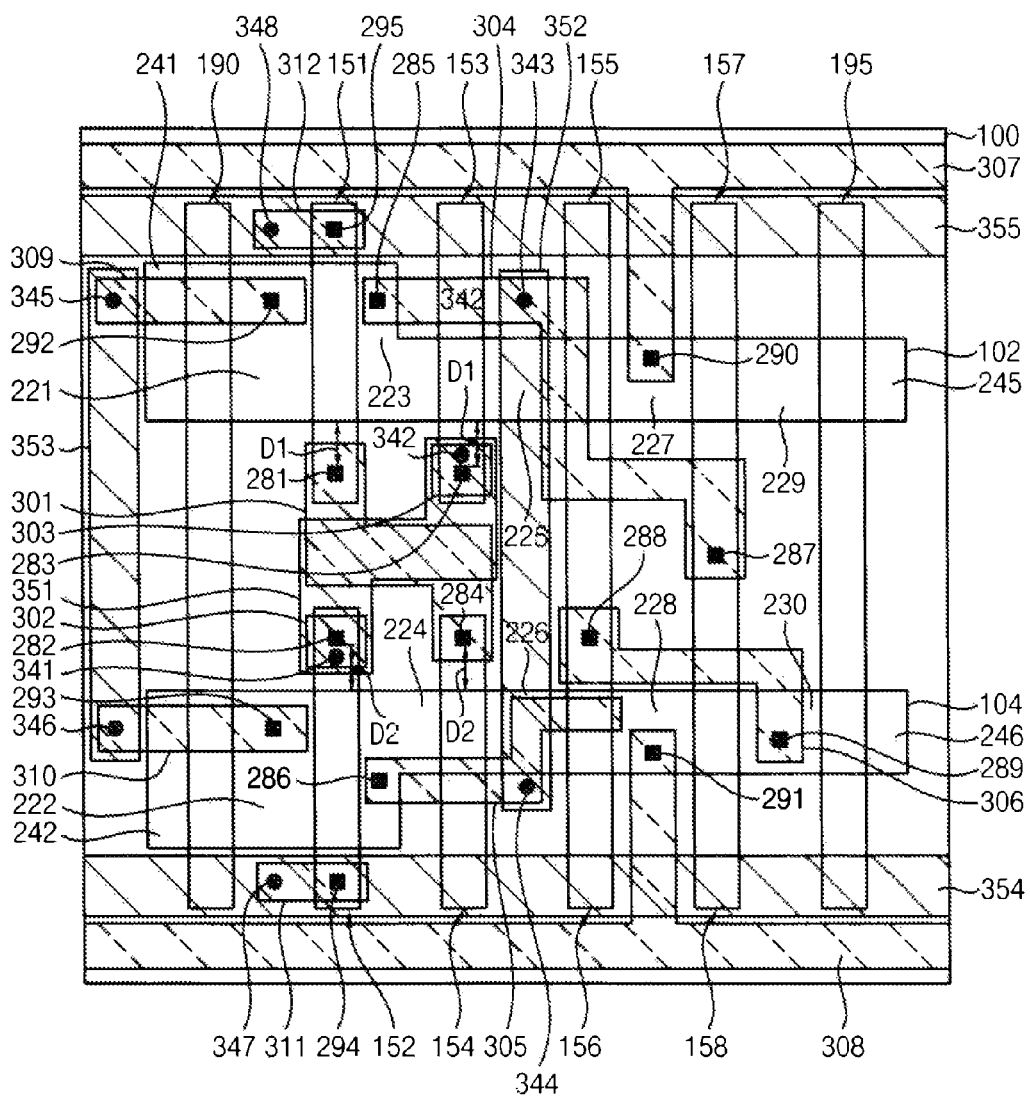
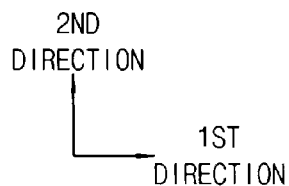

FIG. 3
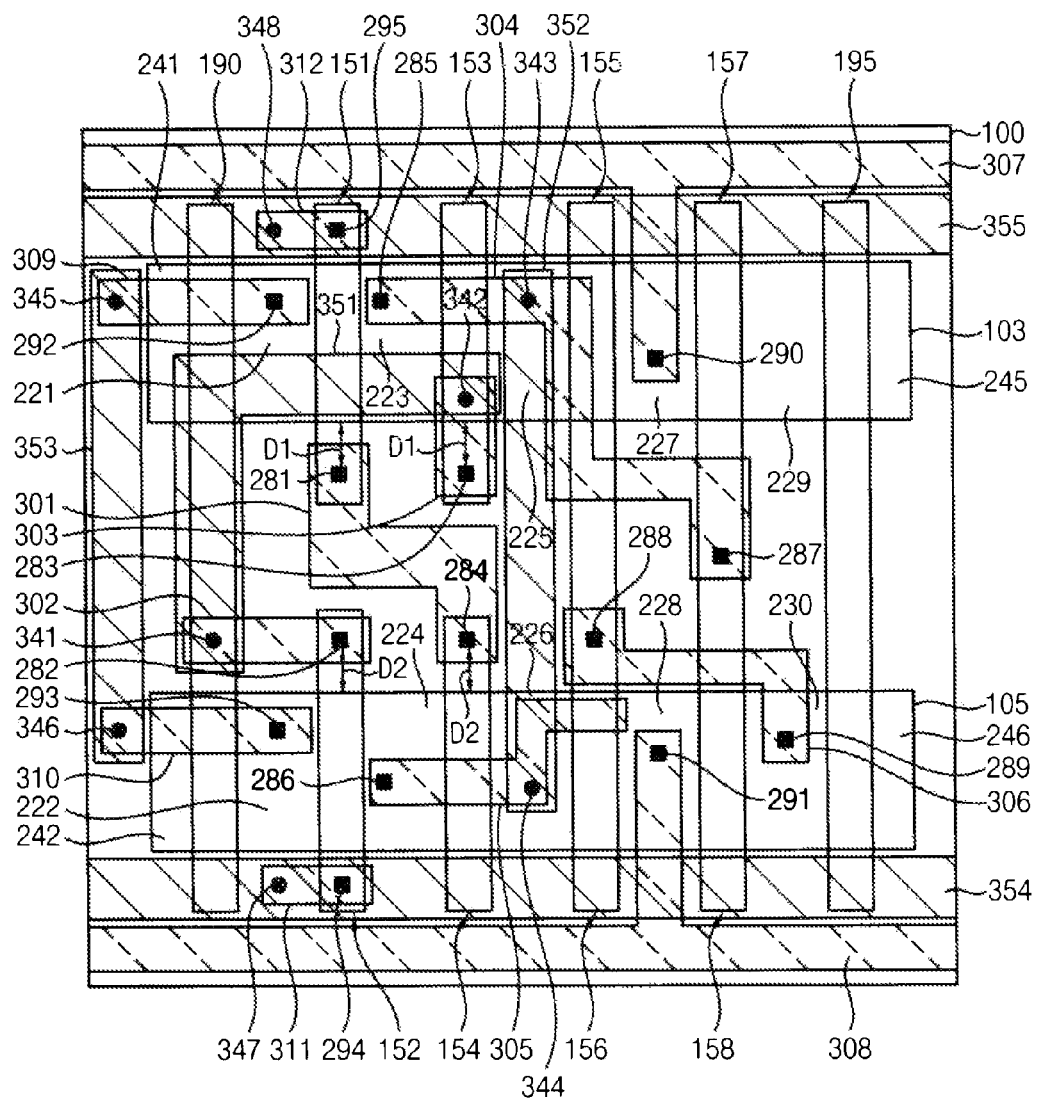
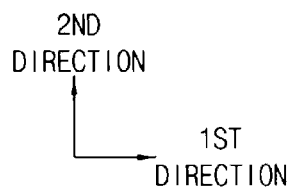

FIG. 4
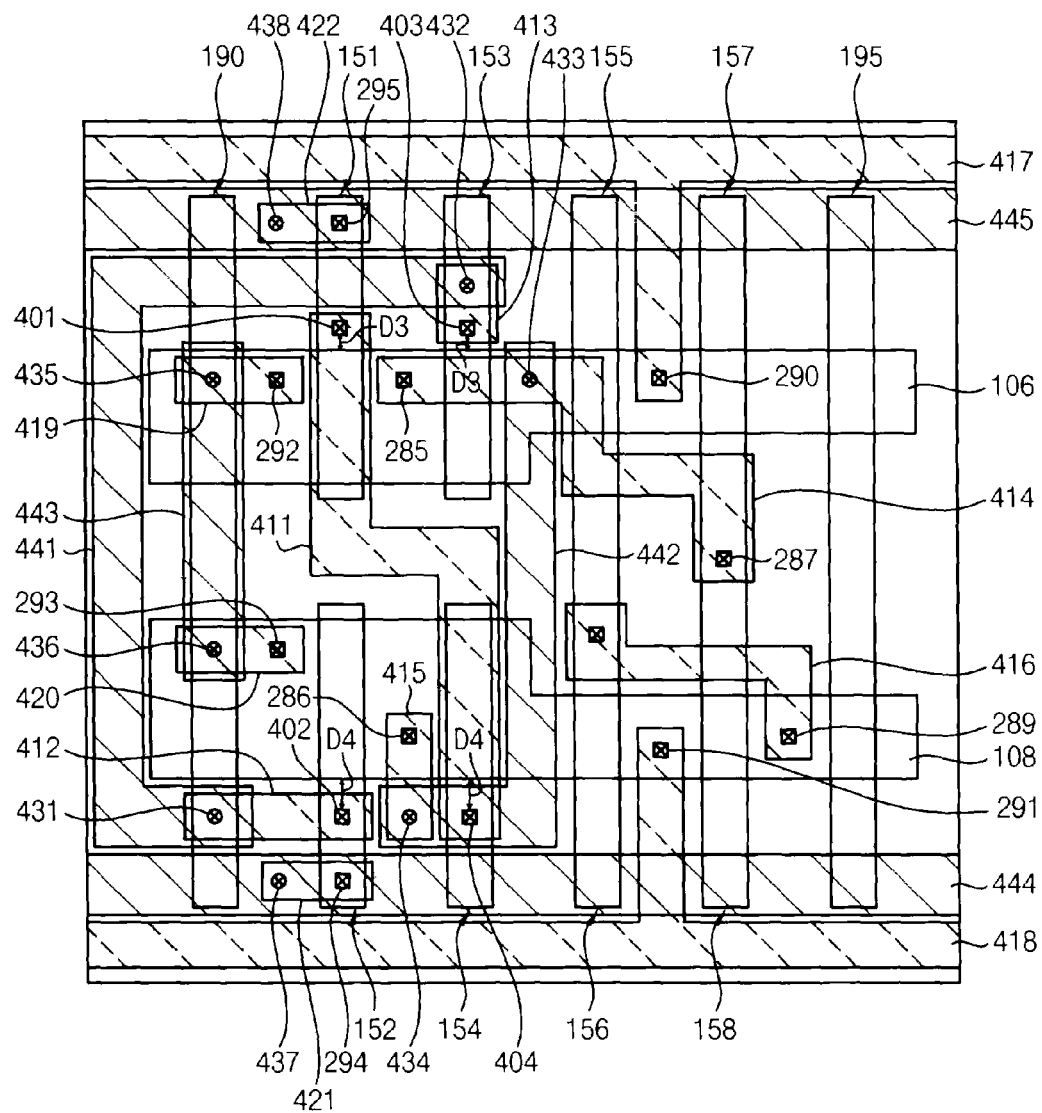
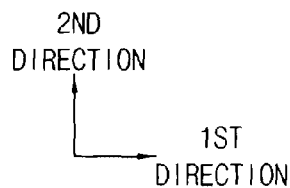

FIG. 5
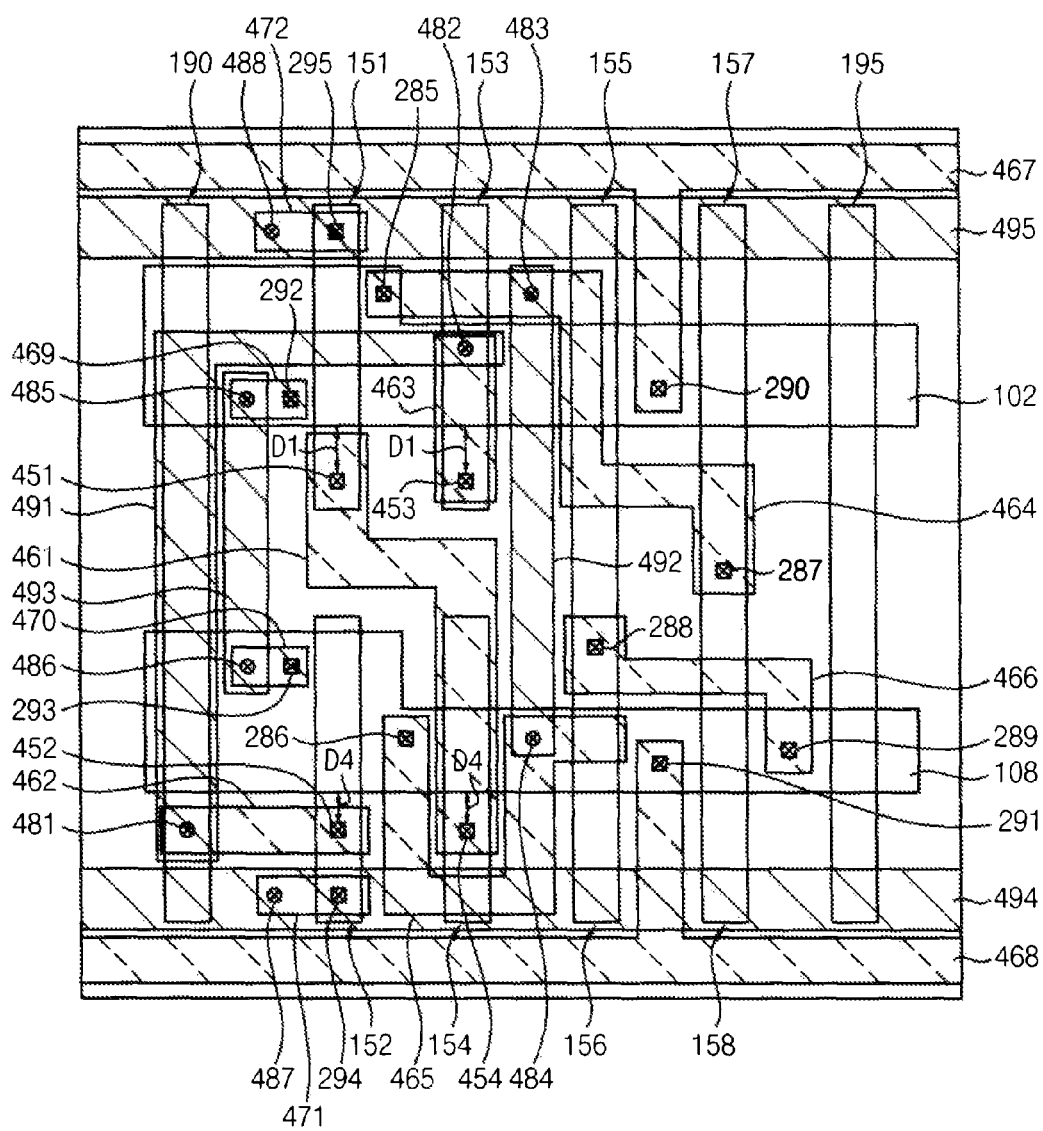
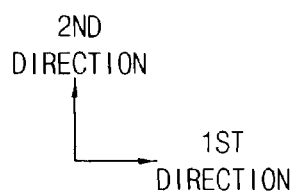

FIG. 12
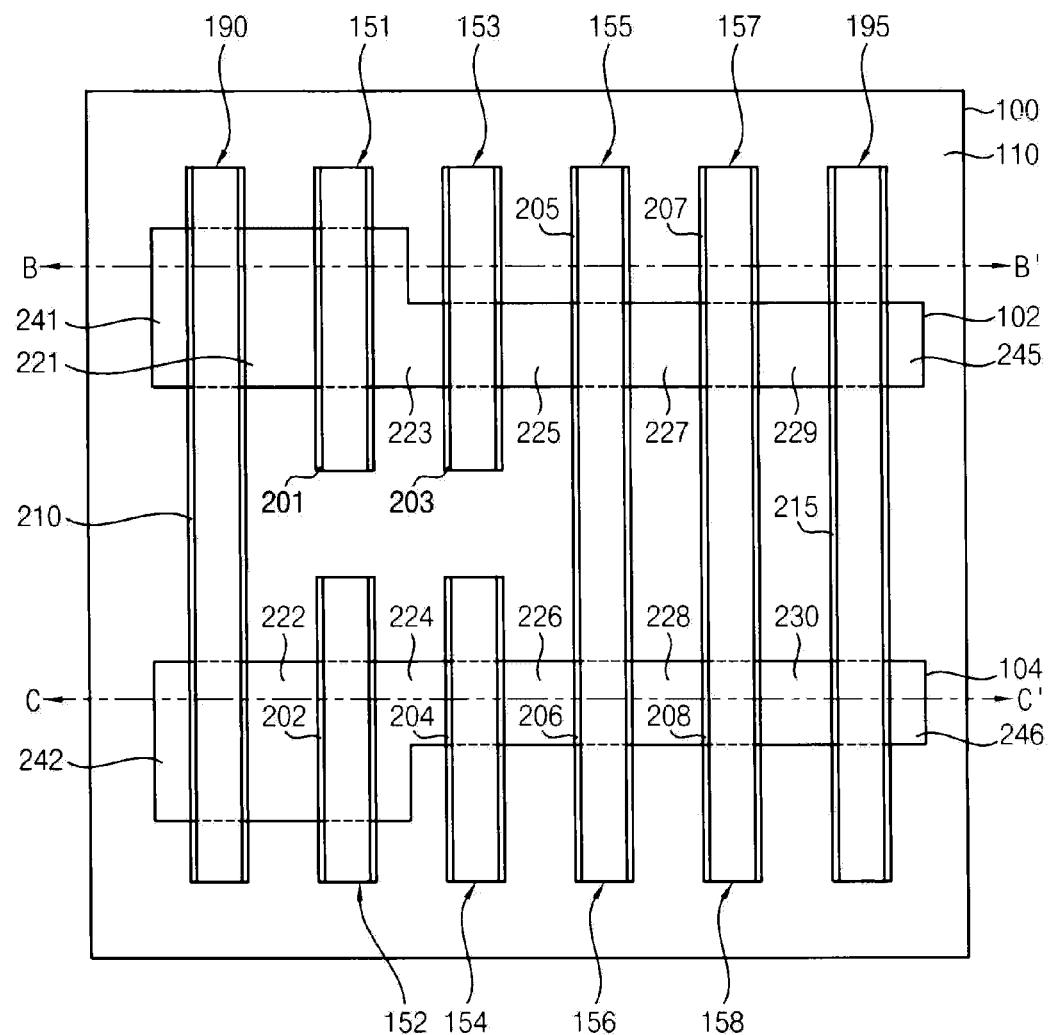
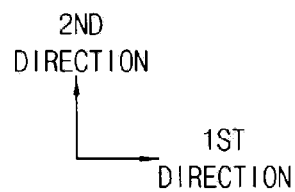

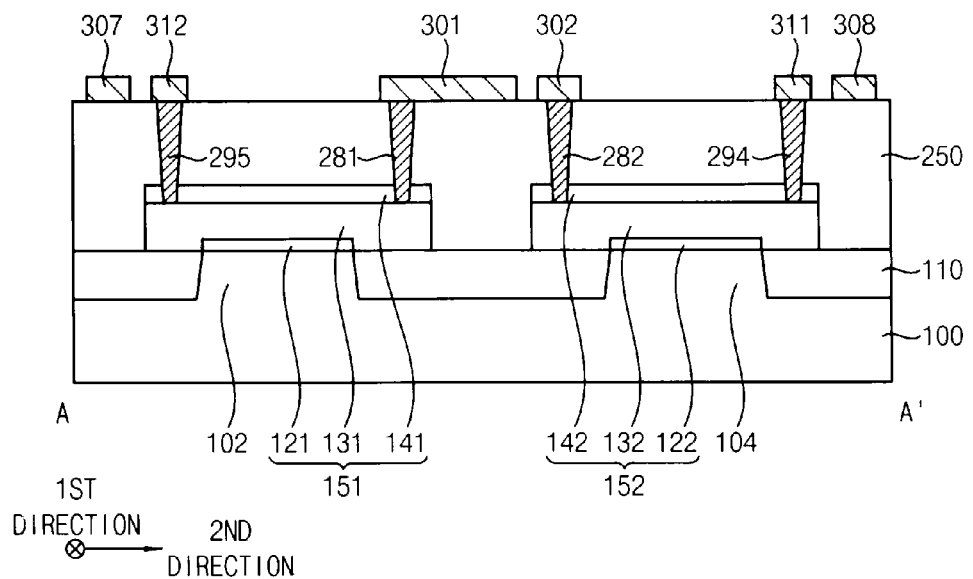
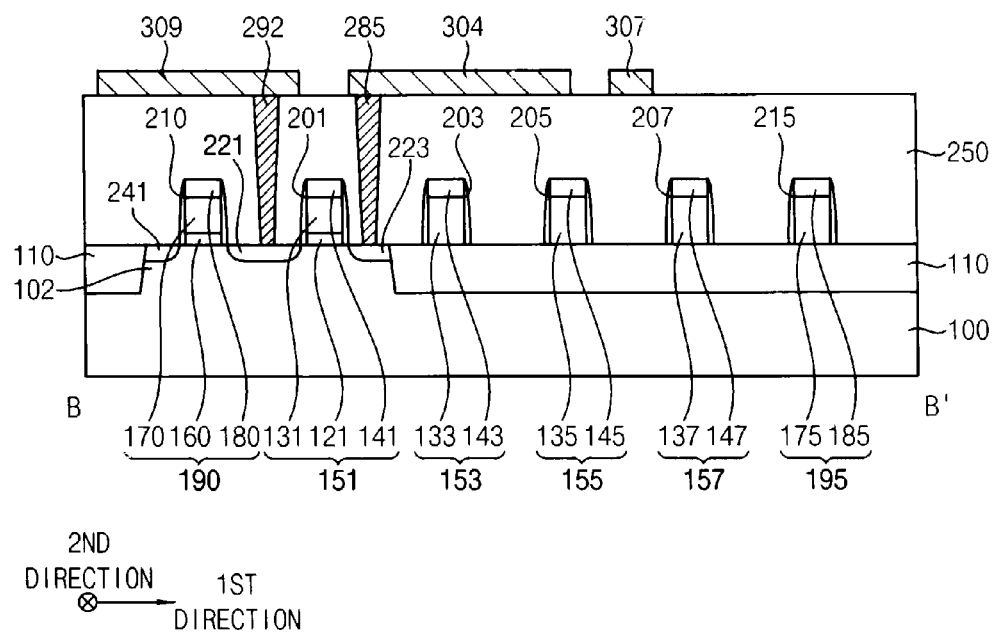

FIG. 25
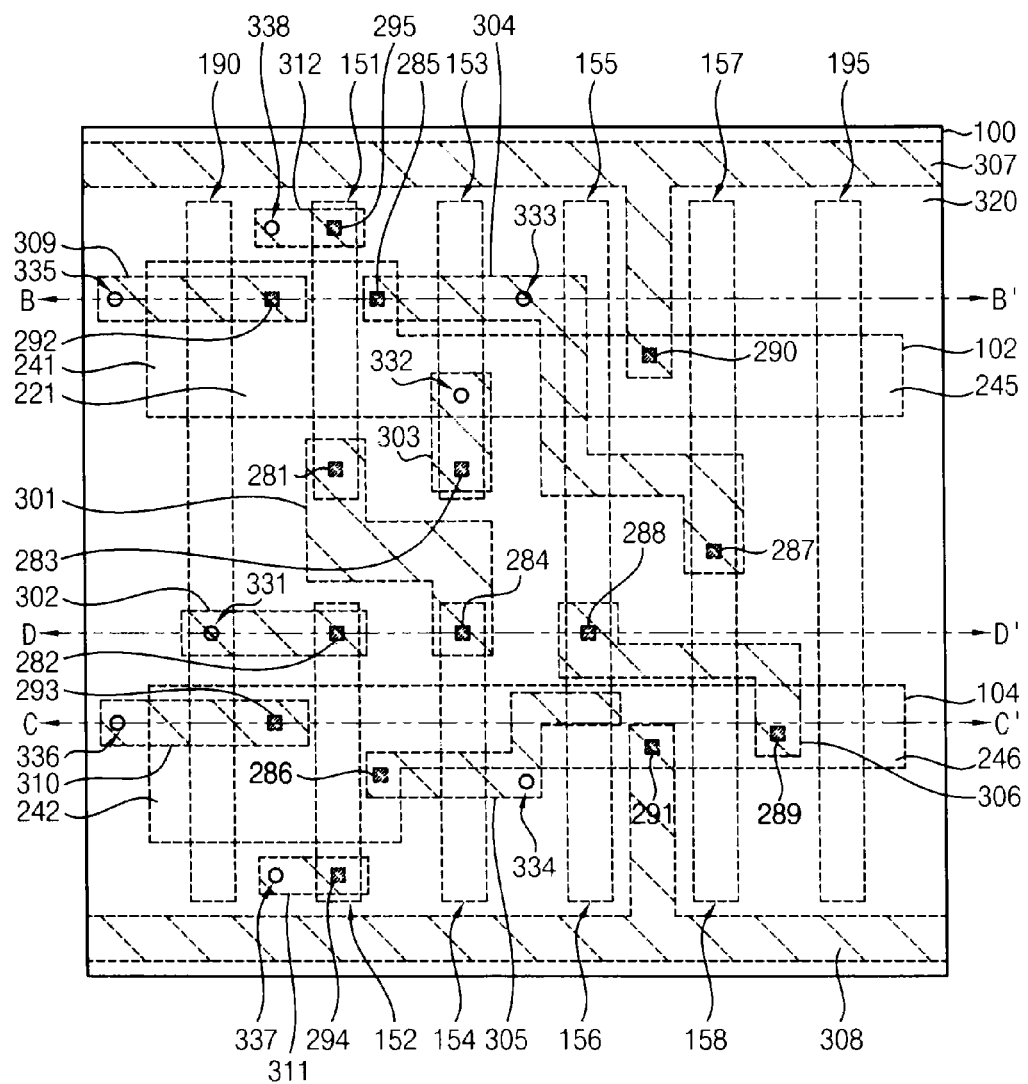
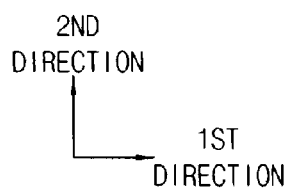

SEMICONDUCTOR INTEGRATED CIRCUITS HAVING CONTACTS SPACED APART FROM ACTIVE REGIONS

CROSS-REFERENCE TO RELATED APPLICATION(S)

This application is a non-provisional application that claims priority under 35 U.S.C. §119 to U.S. Provisional Application No. 62/075,984 filed on Nov. 6, 2014, and also claims priority under 35 U.S.C. §119 to Korean Patent Application No. 10-2015-0026079 filed on Feb. 24, 2015 in the Korean Intellectual Property Office (KIPO), the contents of each of which are incorporated herein by reference in their entirety.

BACKGROUND

Field

Example embodiments relate to semiconductor integrated circuits and/or methods of manufacturing the same. More particularly, example embodiments relate to semiconductor integrated circuits including clock latch circuits and/or methods of manufacturing the same.

Description of the Related Art

In order to implement a conventional clock latch circuit, a PMOS gate and an NMOS gate need to be connected to each other. Conventionally, a dummy gate may be used, however, in this case, the use of a dummy gate may increase the area required by the conventional latch circuit.

SUMMARY

At least some example embodiments provide semiconductor integrated circuits including clock latch circuits having reduced areas.

One or more example embodiments provide methods of manufacturing semiconductor integrated circuits including clock latch circuits having reduced areas.

At least one example embodiment provides a semiconductor integrated circuit. The semiconductor integrated circuit includes: first and second active regions; first and third gate structures; second and fourth gate structures; and first to fourth contacts. The first and second active regions are defined by an isolation layer on a substrate and doped with different types of impurities from each other. The first and second active regions extend in a first direction and are spaced apart from each other in a second direction perpendicular or substantially perpendicular to the first direction. The first and third gate structures are on the first active region and a first portion of the isolation layer between the first and second active regions. The first and third gate structures extend in the second direction and are spaced apart from each other in the first direction. The second and fourth gate structures are on the second active region and the first portion of the isolation layer. The second and fourth gate structures extend in the second direction and are spaced apart from each other in the first direction. The second and fourth gate structures face and are spaced apart from the first and third gate structures, respectively, in the second direction. The first to fourth contacts are on portions of the first to fourth gate structures, respectively, on the first portion of the isolation layer. The first and fourth contacts are electrically connected to each other, and the second and third contacts are electrically connected to each other. The first and third contacts are spaced apart from the first active region in the second direction by substantially the same distance, and the second and fourth contacts are spaced apart from the second active region in the second direction by substantially the same distance.

In at least some example embodiments, the first active region may be doped with p-type impurities, and the second active region may be doped with n-type impurities.

In at least some example embodiments, the first and fourth contacts may be electrically connected to each other through a first lower wiring on the first and fourth contacts.

In at least some example embodiments, the semiconductor integrated circuit may further include a second lower wiring on the second contact, a third lower wiring on the third contact, a first via on the second lower wiring, a second via on the third lower wiring, and a first upper wiring on both of the first and second vias. The second and third contacts may be electrically connected to each other through the second and third lower wirings, the first and second vias, and the first upper wiring.

In at least some example embodiments, the semiconductor integrated circuit may further include first and third impurity regions, and second and fourth impurity regions. The first and third impurity regions may be at upper portions of the first active region at opposite sides of the first gate structure, respectively, and may be doped with impurities of a first conductivity type. The second and fourth impurity regions may be at upper portions of the second active region at opposite sides of the second gate structure, respectively, and may be doped with impurities of a second conductivity type.

In at least some example embodiments, the semiconductor integrated circuit may further include fifth and sixth contacts on the first and second impurity regions, respectively. The fifth and sixth contacts may be electrically connected to each other.

In at least some example embodiments, the semiconductor integrated circuit may further include a fourth lower wiring on the fifth contact, a fifth lower wiring on the sixth contact, a third via on the fourth lower wiring, a fourth via on the fifth lower wiring, and a second upper wiring on both of the third and fourth vias. The fifth and sixth contacts may be electrically connected to each other through the fourth and fifth lower wirings, the third and fourth vias, and the second upper wiring.

In at least some example embodiments, the semiconductor integrated circuit may further include seventh and eighth contacts on the third and fourth impurity regions, respectively. The seventh and eighth contacts may be electrically connected to each other.

In at least some example embodiments, the semiconductor integrated circuit may further include a sixth lower wiring on the seventh contact, a seventh lower wiring on the eighth contact, a fifth via on the sixth lower wiring, a sixth via on the seventh lower wiring, and a third upper wiring on both of the fifth and sixth vias. The seventh and eighth contacts may be electrically connected to each other through the sixth and seventh lower wirings, the fifth and sixth vias, and the third upper wiring.

In at least some example embodiments, the semiconductor integrated circuit may further include a fifth gate structure and a sixth gate structure. The fifth gate structure may be on the first active region and the first portion of the isolation layer. The fifth gate structure may extend in the second direction and may be spaced apart from the third gate structure in the first direction. The sixth gate structure may be on the second active region and the first portion of the isolation layer. The sixth gate structure may extend in the second direction and may be spaced apart from the fourth gate structure in the first direction. The fifth and sixth gate structures may be connected to each other on the first portion of the isolation layer, and may extend in the second direction.

In at least some example embodiments, the semiconductor integrated circuit may further include fifth and seventh impurity regions, and sixth and eighth impurity regions. The fifth and seventh impurity regions may be at upper portions of the first active region at opposite sides of the fifth gate structure, respectively, and may be doped with impurities of a first conductivity type. The sixth and eighth impurity regions may be at upper portions of the second active region at opposite sides of the sixth gate structure, respectively, and may be doped with impurities of a second conductivity type.

In at least some example embodiments, the semiconductor integrated circuit may further include a ninth contact and a tenth contact. The ninth contact may be on the seventh impurity region, and a supply voltage may be applied to the ninth contact. The tenth contact may be on the eighth impurity region, and may be grounded.

In at least some example embodiments, the semiconductor integrated circuit may further include an eighth lower wiring and a ninth lower wiring. The eighth lower wiring may be on the ninth contact, and apply a supply voltage to the ninth contact. The ninth lower wiring may be on the tenth contact, and may be grounded.

In at least some example embodiments, the semiconductor integrated circuit may further include a seventh gate structure and an eighth gate structure. The seventh gate structure may be on the first active region and the first portion of the isolation layer. The seventh gate structure may extend in the second direction and may be spaced apart from the fifth gate structure in the first direction. The eighth gate structure may be on the second active region and the first portion of the isolation layer. The eighth gate structure may extend in the second direction and may be spaced apart from the sixth gate structure in the first direction. The seventh and eighth gate structures may be connected to each other on the first portion of the isolation layer, and may extend in the second direction.

In at least some example embodiments, the semiconductor integrated circuit may further include first and third impurity regions, and second and fourth impurity regions. The first and third impurity regions may be at upper portions of the first active region at opposite sides of the first gate structure, respectively, and may be doped with impurities of a first conductivity type. The second and fourth impurity regions may be at upper portions of the second active region at opposite sides of the second gate structure, respectively, and may be doped with impurities of a second conductivity type.

In at least some example embodiments, the semiconductor integrated circuit may further include a ninth impurity region at an upper portion of the second active region adjacent to the eighth gate structure. The ninth impurity region may be electrically connected to the fifth gate structure or the sixth gate structure.

In at least some example embodiments, a clock signal may be applied to each of the first to fourth gate structures.

In at least some example embodiments, a first clock signal may be applied to the second and third gate structures, and a second clock signal may be applied to the first and fourth gate structures.

In at least some example embodiments, the second gate structure may extend on a second portion of the isolation layer opposite to the first portion of the isolation layer in the second direction with respect to the second active region.

The semiconductor integrated circuit may further include a twelfth contact on a portion of the second gate structure on the second portion of the isolation layer, a tenth lower wiring on the twelfth contact, a seventh via on the tenth lower wiring, and a fourth upper wiring on the seventh via. The fourth upper wiring may extend in the first direction, and the first clock signal may be applied to the fourth upper wiring.

In at least some example embodiments, the first gate structure may extend on a third portion of the isolation layer opposite to the first portion of the isolation layer in the second direction with respect to the first active region. The semiconductor integrated circuit may further include a thirteenth contact on a portion of the first gate structure on the third portion of the isolation layer, an eleventh lower wiring on the thirteenth contact, an eighth via on the eleventh lower wiring, and a fifth upper wiring on the eighth via. The fifth upper wiring may extend in the first direction, and the second clock signal may be applied to the fifth upper wiring.

At least one other example embodiment provides a semiconductor integrated circuit. The semiconductor integrated circuit includes: first and second active regions; first and third gate structures; second and fourth gate structures; and first to fourth contacts. The first and second active regions are defined by an isolation layer on a substrate and doped with different types of impurities from each other. The first and second active regions extend in a first direction and are spaced apart from each other in a second direction perpendicular or substantially perpendicular to the first direction. The first and third gate structures are on the first active region and a portion of the isolation layer adjacent thereto. The first and third gate structures extend in the second direction and are spaced apart from each other in the first direction. The second and fourth gate structures are on the second active region and a portion of the isolation layer adjacent thereto. The second and fourth gate structures extend in the second direction and are spaced apart from each other in the first direction. The second and fourth gate structures face and are spaced apart from the first and third gate structures, respectively, in the second direction. The first to fourth contacts are on portions of the first to fourth gate structures, respectively, on the isolation layer. The first and fourth contacts are electrically connected to each other, and the second and third contacts are electrically connected to each other. The first and third contacts are spaced apart from a boundary of the first active region in the second direction by the same or substantially the same distance, and the second and fourth contacts are spaced apart from a boundary of the second active region in the second direction by the same or substantially the same distance.

In at least some example embodiments, the first active region may include first and second boundaries in the second direction, and the second active region may include third and fourth boundaries in the second direction. The first and third boundaries may face each other.

In at least some example embodiments, each of the first and third contacts may be closer to the second boundary of the first active region than the first boundary thereof. Each of the second and fourth contacts may be closer to the fourth boundary of the second active region than the third boundary thereof.

In at least some example embodiments, each of the first and third contacts may be closer to the first boundary of the first active region than the second boundary thereof. Each of the second and fourth contacts may be closer to the fourth boundary of the second active region than the third boundary thereof.

In at least some example embodiments, each of the first and third contacts may be closer to the second boundary of the first active region than the first boundary thereof. Each of the second and fourth contacts may be closer to the third boundary of the second active region than the fourth boundary thereof.

In at least some example embodiments, each of the first and third contacts may be closer to the first boundary of the first active region than the second boundary thereof. Each of the second and fourth contacts may be closer to the third boundary of the second active region than the fourth boundary thereof.

In at least some example embodiments, the first and fourth contacts may be electrically connected to each other through a first lower wiring on both of the first and fourth contacts.

In at least some example embodiments, the semiconductor integrated circuit may further include a second lower wiring on the second contact, a third lower wiring on the third contact, a first via on the second lower wiring, a second via on the third lower wiring, and a first upper wiring on both of the first and second vias. The second and third contacts may be electrically connected to each other through the second and third lower wirings, the first and second vias, and the first upper wiring.

In at least some example embodiments, the semiconductor integrated circuit may further include first and third impurity regions, and second and fourth impurity regions. The first and third impurity regions may be at upper portions of the first active region at opposite sides of the first gate structure, respectively, and may be doped with impurities of a first conductivity type. The second and fourth impurity regions may be at upper portions of the second active region at opposite sides of the second gate structure, respectively, and may be doped with impurities of a second conductivity type.

In at least some example embodiments, the first and second impurity regions may be electrically connected to each other, and the third and fourth impurity regions may be electrically connected to each other.

In at least some example embodiments, the semiconductor integrated circuit may further include a fifth gate structure, and a sixth gate structure. The fifth gate structure may be on the first active region and the isolation layer. The fifth gate structure may extend in the second direction and may be spaced apart from the third gate structure in the first direction. The sixth gate structure may be on the second active region and the isolation layer. The sixth gate structure may extend in the second direction and may be spaced apart from the fourth gate structure in the first direction. The fifth and sixth gate structures may be connected to each other on a portion of the isolation layer between the first and second active regions, and may extend in the second direction.

In at least some example embodiments, the semiconductor integrated circuit may further include fifth and seventh impurity regions, and sixth and eighth impurity regions. The fifth and seventh impurity regions may be at upper portions of the first active region at opposite sides of the fifth gate structure, respectively, and may be doped with impurities of a first conductivity type. The sixth and eighth impurity regions may be at upper portions of the second active region at opposite sides of the sixth gate structure, respectively, and may be doped with impurities of a second conductivity type.

In at least some example embodiments, a supply voltage may be applied to the seventh impurity region, and the eighth impurity region may be grounded.

In at least some example embodiments, the semiconductor integrated circuit may further include a seventh gate structure and an eighth gate structure. The seventh gate structure may be on the first active region and the isolation layer. The seventh gate structure may extend in the second direction and may be spaced apart from the fifth gate structure in the first direction. The eighth gate structure may be on the second active region and the isolation layer. The eighth gate structure may extend in the second direction and may be spaced apart from the sixth gate structure in the first direction. The seventh and eighth gate structures may be connected to each other on a portion of the isolation layer between the first and second active regions, and may extend in the second direction.

In at least some example embodiments, the semiconductor integrated circuit may further include first and third impurity regions, and second and fourth impurity regions. The first and third impurity regions may be at upper portions of the first active region at opposite sides of the first gate structure, respectively, and may be doped with impurities of a first conductivity type. The second and fourth impurity regions may be at upper portions of the second active region at opposite sides of the second gate structure, respectively, and may be doped with impurities of a second conductivity type. The seventh and eighth gate structures may be electrically connected to the third and fourth impurity regions, respectively.

In at least some example embodiments, the semiconductor integrated circuit may further include a ninth impurity region on an upper portion of the second active region adjacent to the eighth gate structure. The ninth impurity region may be doped with impurities of the second conductivity type. The ninth impurity region may be electrically connected to the fifth and sixth gate structures.

In at least some example embodiments, a first clock signal may be applied to the second and third gate structures, and a second clock signal may be applied to the first and fourth gate structures.

At least one other example embodiment provides a semiconductor integrated circuit. The semiconductor integrated circuit includes: first and second active regions; first and third gate structures; second and fourth gate structures; a fifth gate structure; a sixth gate structure; a seventh gate structure; an eighth gate structure; and first to fourth contacts. The first and second active regions are defined by an isolation layer on a substrate and doped with different types of impurities from each other. The first and second active regions extend in a first direction and are spaced apart from each other in a second direction perpendicular or substantially perpendicular to the first direction. The first and third gate structures are on the first active region and a portion of the isolation layer adjacent thereto. The first and third gate structures extend in the second direction and are spaced apart from each other in the first direction. The second and fourth gate structures are on the second active region and a portion of the isolation layer adjacent thereto. The second and fourth gate structures extend in the second direction and are spaced apart from each other in the first direction. The second and fourth gate structures face and are spaced apart from the first and third gate structures, respectively, in the second direction. The fifth gate structure is on the first active region and the isolation layer. The fifth gate structure extends in the second direction and is spaced apart from the third gate structure in the first direction. The sixth gate structure is on the second active region and the isolation layer. The sixth gate structure extends in the second direction and is spaced apart from the fourth gate structure in the first direction. The seventh gate structure is on the first active region and the isolation layer. The seventh gate structure extends in the second direction and is spaced apart from the fifth gate structure in the first direction. The eighth gate structure is on the second active region and the isolation layer. The eighth gate structure extends in the second direction and is spaced apart from the sixth gate structure in the first direction. The first to fourth contacts are on portions of the first to fourth gate structures, respectively, on the isolation layer. The fifth and sixth gate structures are connected to each other on the portion of the isolation layer between the first and second active regions, and extend in the second direction. The seventh and eighth gate structures are connected to each other on the portion of the isolation layer between the first and second active regions, and extend in the second direction. The first and fourth contacts are electrically connected to each other, and the second and third contacts are electrically connected to each other. The first and third contacts are spaced apart from a boundary of the first active region in the second direction by the same or substantially the same distance, and the second and fourth contacts are spaced apart from a boundary of the second active region in the second direction by the same or substantially the same distance.

In at least some example embodiments, the semiconductor integrated circuit may further include first and third impurity regions, and second and fourth impurity regions. The first and third impurity regions may be at upper portions of the first active region at opposite sides of the first gate structure, respectively, and may be doped with impurities of a first conductivity type. The second and fourth impurity regions may be at upper portions of the second active region at opposite sides of the second gate structure, respectively, and may be doped with impurities of a second conductivity type. The first and second impurity regions may be electrically connected to each other, and the third and fourth impurity regions may be electrically connected to each other.

In at least some example embodiments, the seventh and eighth gate structures may be electrically connected to the third and fourth impurity regions, respectively.

In at least some example embodiments, the semiconductor integrated circuit may further include fifth and seventh impurity regions, and sixth and eighth impurity regions. The fifth and seventh impurity regions may be at upper portions of the first active region at opposite sides of the fifth gate structure, respectively, and may be doped with impurities of a first conductivity type. The sixth and eighth impurity regions may be at upper portions of the second active region at opposite sides of the sixth gate structure, respectively, and may be doped with impurities of a second conductivity type. A supply voltage may be applied to the seventh impurity region, and the eighth impurity region may be grounded.

In at least some example embodiments, the semiconductor integrated circuit may further include a ninth impurity region at an upper portion of the second active region adjacent to the eighth gate structure. The ninth impurity region may be doped with impurities of the second conductivity type, and may be electrically connected to the fifth and sixth gate structures.

In at least some example embodiments, a first clock signal may be applied to the second and third gate structures, and a second clock signal may be applied to the first and fourth gate structures.

At least one other example embodiment provides a method of manufacturing a semiconductor integrated circuit. In the method, an isolation layer is formed on a substrate to define first and second active regions extending in a first direction and being spaced apart from each other in a second direction perpendicular or substantially perpendicular to the first direction. First and third gate structures are formed on the first active region and a portion of the isolation layer adjacent thereto to extend in the second direction and to be spaced apart from each other in the first direction. Second and fourth gate structures are formed on the second active region and a portion of the isolation layer adjacent thereto to extend in the second direction and to be spaced apart from each other in the first direction. The second and fourth gate structures face and are spaced apart from the first and third gate structures, respectively, in the second direction. First to fourth contacts are formed on portions of the first to fourth gate structures, respectively, on the isolation layer. The first and fourth contacts are electrically connected to each other, and the second and third contacts are electrically connected to each other. The first and third contacts are spaced apart from the first active region in the second direction by the same or substantially the same distance, and the second and fourth contacts are spaced apart from the second active region in the second direction by the same or substantially the same distance.

In at least some example embodiments, after forming the first to fourth gate structures, p-type impurities may be doped into upper portions of the first active region adjacent to the first and third gate structures, and n-type impurities may be doped into upper portions of the second active region adjacent to the second and fourth gate structures.

In at least some example embodiments, when the first and fourth contacts are electrically connected to each other, a first lower wiring may be formed on the first and fourth contacts.

In at least some example embodiments, when the second and third contacts are electrically connected to each other, second and third lower wirings may be formed on the second and third contacts, respectively, first and second vias may be formed on the second and third lower wirings, respectively, and a first upper wiring may be formed on the first and second vias.

In at least some example embodiments, after forming the first to fourth gate structures, impurities of a first conductivity type may be doped into upper portions of the first active region at opposite sides of the first gate structure to form first and third impurity regions, respectively. Impurities of a second conductivity type may be doped into upper portions of the second active region at opposite sides of the second gate structure to form second and fourth impurity regions, respectively.

In at least some example embodiments, after forming the first to fourth impurity regions, fifth and sixth contacts may be formed on the first and second impurity regions, respectively, fourth and fifth lower wirings may be formed on the fifth and sixth contacts, respectively, third and fourth vias may be formed on the fourth and fifth lower wirings, respectively, and a second upper wiring may be formed on the third and fourth vias.

In at least some example embodiments, after forming the first to fourth impurity regions, seventh and eighth contacts may be formed on the third and fourth impurity regions, respectively, sixth and seventh lower wirings may be formed on the seventh and eighth contacts, respectively, fifth and sixth vias may be formed on the sixth and seventh lower wirings, respectively, and a third upper wiring may be formed on the fifth and sixth vias.

At least one other example embodiment provides a semiconductor integrated circuit. The semiconductor integrated circuit includes: first and second active regions; first through fourth gate structures; and first through fourth contacts. The first and second active regions are defined by an isolation layer on a substrate, the first and second active regions are doped with different types of impurities, the first and second active regions extend in a first direction, and the first and second active regions are spaced apart from each other in a second direction. The second direction is substantially perpendicular to the first direction. The first and third gate structures are on the first active region and a first portion of the isolation layer between the first and second active regions, the first and third gate structures extend in the second direction, and the first and third gate structures are spaced apart from each other in the first direction. The second and the fourth gate structures are on the second active region and the first portion of the isolation layer, the second and fourth gate structures extend in the second direction, the second and fourth gate structures are spaced apart from each other in the first direction, and the second and third gate structures face and are spaced apart from the first and third gate structures, respectively, in the second direction. The first to fourth contacts are on portions of the first to fourth gate structures, respectively, on the first portion of the isolation layer, the first and fourth contacts are electrically connected to each other, the second and third contacts are electrically connected to each other, the first and third contacts are spaced apart from the first active region in the second direction by substantially the same distance, and the second and fourth contacts are spaced apart from the second active region in the second direction by substantially the same distance.

The first active region may be doped with p-type impurities, and the second active region may be doped with n-type impurities.

The first and fourth contacts may be electrically connected to each other through a first lower wiring on the first and fourth contacts.

The semiconductor integrated circuit may further include: a second lower wiring on the second contact; a third lower wiring on the third contact; a first via on the second lower wiring; a second via on the third lower wiring; and a first upper wiring on both of the first and second vias. The second and third contacts may be electrically connected to each other through the second and third lower wirings, the first and second vias, and the first upper wiring.

The semiconductor integrated circuit may further include: a first impurity region; a second impurity region; a third impurity region; and a fourth impurity region. The first and third impurity regions may be at upper portions of the first active region at opposite sides of the first gate structure, respectively, and the first and third impurity regions may be doped with impurities of a first conductivity type. The second and fourth impurity regions may be at upper portions of the second active region at opposite sides of the second gate structure, respectively, and the second and fourth impurity regions may be doped with impurities of a second conductivity type.

The semiconductor integrated circuit may further include: fifth and sixth contacts on the first and second impurity regions, respectively, the fifth and sixth contacts being electrically connected to each other.

The semiconductor integrated circuit may further include: a first lower wiring on the fifth contact; a second lower wiring on the sixth contact; a first via on the first lower wiring; a second via on the second lower wiring; and a first upper wiring on both of the first and second vias. The fifth and sixth contacts may be electrically connected to each other through the first and second lower wirings, the first and second vias, and the first upper wiring.

The semiconductor integrated circuit may further include: fifth and sixth contacts on the third and fourth impurity regions, respectively, the fifth and sixth contacts being electrically connected to each other.

The semiconductor integrated circuit may further include: a first lower wiring on the fifth contact; a second lower wiring on the sixth contact; a first via on the first lower wiring; a second via on the second lower wiring; and a first upper wiring on both of the first and second vias. The fifth and sixth contacts may be electrically connected to each other through the first and second lower wirings, the first and second vias, and the first upper wiring.

The semiconductor integrated circuit may further include: a fifth gate structure on the first active region and the first portion of the isolation layer, the fifth gate structure extending in the second direction, and being spaced apart from the third gate structure in the first direction; and a sixth gate structure on the second active region and the first portion of the isolation layer, the sixth gate structure extending in the second direction, and being spaced apart from the fourth gate structure in the first direction. The fifth and sixth gate structures may be connected to each other on the first portion of the isolation layer. The fifth and sixth gate structures may extend in the second direction.

The semiconductor integrated circuit may further include: a first impurity region; a second impurity region; a third impurity region; and a fourth impurity region. The first and third impurity regions may be at upper portions of the first active region at opposite sides of the fifth gate structure, respectively, and the first and third impurity regions may be doped with impurities of a first conductivity type. The second and fourth impurity regions may be at upper portions of the second active region at opposite sides of the sixth gate structure, respectively, and the second and fourth impurity regions may be doped with impurities of a second conductivity type.

The semiconductor integrated circuit may further include: a fifth contact on the third impurity region, the fifth contact being coupled to a supply voltage; and a sixth contact on the fourth impurity region, the sixth contact being grounded.

The semiconductor integrated circuit may further include: a first lower wiring on the fifth contact, the first lower wiring being configured to apply the supply voltage to the fifth contact; and a second lower wiring on the sixth contact, the second lower wiring being grounded.

The semiconductor integrated circuit may further include: a seventh gate structure on the first active region and the first portion of the isolation layer, the seventh gate structure extending in the second direction, and being spaced apart from the fifth gate structure in the first direction; and an eighth gate structure on the second active region and the first portion of the isolation layer, the eighth gate structure extending in the second direction, and being spaced apart from the sixth gate structure in the first direction. The seventh and eighth gate structures may be connected to each other on the first portion of the isolation layer. The seventh and eighth gate structures may extend in the second direction.

The semiconductor integrated circuit may further include: a fifth impurity region; a sixth impurity region; a seventh impurity region; and an eighth impurity region. The fifth and seventh impurity regions may be at upper portions of the first active region at opposite sides of the first gate structure, respectively, the fifth and seventh impurity regions being doped with impurities of a first conductivity type. The sixth and eighth impurity regions may be at upper portions of the second active region at opposite sides of the second gate structure, respectively, the sixth and eighth impurity regions being doped with impurities of a second conductivity type.

The semiconductor integrated circuit may further include: a fifth impurity region at an upper portion of the second active region adjacent to the eighth gate structure. The fifth impurity region may be electrically connected to the fifth gate structure or the sixth gate structure.

Each of the first to fourth gate structures may be configured to receive a clock signal from among a plurality of clock signals.

The second and third gate structures may be configured to receive a first of the plurality of clock signals; and the first and fourth gate structures may be configured to receive a second of the plurality of clock signals.

The second gate structure may extend on a second portion of the isolation layer opposite to the first portion of the isolation layer in the second direction with respect to the second active region. The semiconductor integrated circuit may further include: a fifth contact on a portion of the second gate structure on the second portion of the isolation layer; a first lower wiring on the fifth contact; a first via on the first lower wiring; and a first upper wiring on the first via, the first upper wiring extending in the first direction, and the first upper wiring being configured to receive the first of the plurality of clock signals.

The first gate structure may extend on a third portion of the isolation layer opposite to the first portion of the isolation layer in the second direction with respect to the first active region. The semiconductor integrated circuit may further include: a sixth contact on a portion of the first gate structure on the third portion of the isolation layer; a second lower wiring on the sixth contact; a second via on the second lower wiring; and a second upper wiring on the second via, the second upper wiring extending in the first direction, and the second upper wiring being configured to receive the second of the plurality of clock signals.

At least one other example embodiment provides a semiconductor integrated circuit. The semiconductor integrated circuit may include: first and second active regions; first through fourth gate structures; and first through fourth contacts. The first and second active regions are defined by an isolation layer on a substrate, the first and second active regions are doped with different types of impurities, the first and second active regions extend in a first direction, and the first and second active regions are spaced apart from each other in a second direction. The second direction is substantially perpendicular to the first direction. The first and third gate structures are on the first active region and a portion of the isolation layer adjacent to the first active region, the first and third gate structures extend in the second direction, and the first and third gate structures are spaced apart from each other in the first direction. The second and fourth gate structures are on the second active region and a portion of the isolation layer adjacent to the second active region, the second and fourth gate structures extend in the second direction, the second and fourth gate structures are spaced apart from each other in the first direction, and the second and fourth gate structures face and are spaced apart from the first and third gate structures, respectively, in the second direction. The first through fourth contacts are on portions of the first to fourth gate structures, respectively, the first and fourth contacts are electrically connected to each other, the second and third contacts are electrically connected to each other, the first and third contacts are spaced apart from a boundary of the first active region in the second direction by substantially the same distance, and the second and fourth contacts are spaced apart from a boundary of the second active region in the second direction by substantially the same distance.

The first active region may include first and second boundaries in the second direction. The second active region may include third and fourth boundaries in the second direction. The first and third boundaries may face each other.

Each of the first and third contacts may be closer to the second boundary of the first active region than the first boundary of the first active region, and each of the second and fourth contacts may be closer to the fourth boundary of the second active region than the third boundary of the second active region.

Each of the first and third contacts may be closer to the first boundary of the first active region than the second boundary of the first active region, and each of the second and fourth contacts may be closer to the fourth boundary of the second active region than the third boundary of the second active region.

Each of the first and third contacts may be closer to the second boundary of the first active region than the first boundary of the first active region, each of the second and fourth contacts may be closer to the third boundary of the second active region than the fourth boundary of the second active region.

Each of the first and third contacts may be closer to the first boundary of the first active region than the second boundary of the first active region, and each of the second and fourth contacts may be closer to the third boundary of the second active region than the fourth boundary of the second active region.

The first and fourth contacts may be electrically connected to each other through a first lower wiring on both of the first and fourth contacts.

The semiconductor integrated circuit may further include: a second lower wiring on the second contact; a third lower wiring on the third contact; a first via on the second lower wiring; a second via on the third lower wiring; and a first upper wiring on both of the first and second vias. The second and third contacts may be electrically connected to each other through the second and third lower wirings, the first and second vias, and the first upper wiring.

The semiconductor integrated circuit may further include: a first impurity region; a second impurity region; a third impurity region; and a fourth impurity region. The first and third impurity regions may be at upper portions of the first active region at opposite sides of the first gate structure, respectively, and the first and third impurity regions may be doped with impurities of a first conductivity type. The second and fourth impurity regions may be at upper portions of the second active region at opposite sides of the second gate structure, respectively, and the second and fourth impurity regions may be doped with impurities of a second conductivity type.

The first and second impurity regions may be electrically connected to each other, and the third and fourth impurity regions may be electrically connected to each other.

The semiconductor integrated circuit may further include: a fifth gate structure on the first active region and the isolation layer, the fifth gate structure extending in the second direction, and being spaced apart from the third gate structure in the first direction; and a sixth gate structure on the second active region and the isolation layer, the sixth gate structure extending in the second direction, and being spaced apart from the fourth gate structure in the first direction. The fifth and sixth gate structures may be connected to each other on a portion of the isolation layer between the first and second active regions, and the fifth and sixth gate structures may extend in the second direction.

The semiconductor integrated circuit may further include: a first impurity region; a second impurity region; a third impurity region; and a fourth impurity region. The first and third impurity regions may be at upper portions of the first active region at opposite sides of the fifth gate structure, respectively, and the first and third impurity regions may be doped with impurities of a first conductivity type. The second and fourth impurity regions may be at upper portions of the second active region at opposite sides of the sixth gate structure, respectively, and the second and fourth impurity regions may be doped with impurities of a second conductivity type.

The third impurity region may be configured to receive a supply voltage, and the fourth impurity region may be grounded.

The semiconductor integrated circuit may further include: a seventh gate structure on the first active region and the isolation layer, the seventh gate structure extending in the second direction, and being spaced apart from the fifth gate structure in the first direction; and an eighth gate structure on the second active region and the isolation layer, the eighth gate structure extending in the second direction, and being spaced apart from the sixth gate structure in the first direction. The seventh and eighth gate structures may be connected to each other on the portion of the isolation layer between the first and second active regions, and the seventh and eighth gate structures may extend in the second direction.

The semiconductor integrated circuit may further include: a fifth impurity region; a sixth impurity region; a seventh impurity region; and an eighth impurity region. The fifth and seventh impurity regions may be at upper portions of the first active region at opposite sides of the first gate structure, respectively, and the fifth and seventh impurity regions may be doped with impurities of the first conductivity type. The sixth and eighth impurity regions may be at upper portions of the second active region at opposite sides of the second gate structure, respectively, and the sixth and eighth impurity regions may be doped with impurities of the second conductivity type. The seventh and eighth gate structures may be electrically connected to the seventh and eighth impurity regions, respectively.

The semiconductor integrated circuit may further include: a fifth impurity region on an upper portion of the second active region adjacent to the eighth gate structure, the fifth impurity region being doped with impurities of the second conductivity type. The fifth impurity region may be electrically connected to the fifth and sixth gate structures.

The second and third gate structures may be configured to receive a first clock signal, and the first and fourth gate structures may be configured to receive a second clock signal.

At least one other example embodiment provides a semiconductor integrated circuit. The semiconductor integrated circuit includes: first and second active regions; first through eighth gate structures; and first through fourth contacts. The first and second active regions are defined by an isolation layer on a substrate, the first and second active regions are doped with different types of impurities, the first and second active regions extend in a first direction, and the first and second active regions are spaced apart from each other in a second direction. The second direction is substantially perpendicular to the first direction. The first and third gate structures are on the first active region and a portion of the isolation layer adjacent to the first active region, the first and third gate structures extend in the second direction, and the first and third gate structures are spaced apart from each other in the first direction. The second and fourth gate structures are on the second active region and a portion of the isolation layer adjacent to the second active region, the second and fourth gate structures extend in the second direction, the second and fourth gate structures are spaced apart from each other in the first direction, and the second and fourth gate structures face and are spaced apart from the first and third gate structures, respectively, in the second direction. The fifth gate structure is on the first active region and the isolation layer, the fifth gate structure extends in the second direction, and is spaced apart from the third gate structure in the first direction. The sixth gate structure is on the second active region and the isolation layer, the sixth gate structure extends in the second direction, and is spaced apart from the fourth gate structure in the first direction. The fifth and sixth gate structures are connected to each other on a portion of the isolation layer between the first and second active regions, and the fifth and sixth gate structures extend in the second direction. The seventh gate structure is on the first active region and the isolation layer, the seventh gate structure extends in the second direction, and is spaced apart from the fifth gate structure in the first direction. The eighth gate structure is on the second active region and the isolation layer, the eighth gate structure extends in the second direction, and is spaced apart from the sixth gate structure in the first direction. The seventh and eighth gate structures are connected to each other on the portion of the isolation layer between the first and second active regions, and the seventh and eighth gate structures extend in the second direction. The first through fourth contacts are on portions of the first to fourth gate structures, respectively, the first and fourth contacts are electrically connected to each other, the second and third contacts are electrically connected to each other, the first and third contacts are spaced apart from a boundary of the first active region in the second direction by substantially the same distance, and the second and fourth contacts are spaced apart from a boundary of the second active region in the second direction by substantially the same distance.

The semiconductor integrated circuit may further include: a first impurity region; a second impurity region; a third impurity region; and a fourth impurity region. The first and third impurity regions may be at upper portions of the first active region at opposite sides of the first gate structure, respectively, and the first and third impurity regions may be doped with impurities of a first conductivity type. The second and fourth impurity regions may be at upper portions of the second active region at opposite sides of the second gate structure, respectively, and the second and fourth impurity regions may be doped with impurities of a second conductivity type. The first and second impurity regions may be electrically connected to each other, and the third and fourth impurity regions may be electrically connected to each other.

The seventh and eighth gate structures may be electrically connected to the third and fourth impurity regions, respectively.

The semiconductor integrated circuit may further include: a fifth impurity region; a sixth impurity region; a seventh impurity region; and an eighth impurity region. The fifth and seventh impurity regions may be at upper portions of the first active region at opposite sides of the fifth gate structure, respectively, and the fifth and seventh impurity regions may be doped with impurities of the first conductivity type. The sixth and eighth impurity regions may be at upper portions of the second active region at opposite sides of the sixth gate structure, respectively, and the sixth and eighth impurity regions may be doped with impurities of the second conductivity type. The seventh impurity region may be configured to receive a supply voltage, and the eighth impurity region may be grounded.

The semiconductor integrated circuit may further include: a ninth impurity region at an upper portion of the second active region adjacent to the eighth gate structure, the ninth impurity region being doped with impurities of the second conductivity type. The ninth impurity region may be electrically connected to the fifth and sixth gate structures.

The second and third gate structures may be configured to receive a first clock signal, and the first and fourth gate structures may be configured to receive a second clock signal.

At least one other example embodiment provides a method of manufacturing a semiconductor integrated circuit. The method includes: forming an isolation layer on a substrate to define first and second active regions, the first and second active regions extending in a first direction and being spaced apart from each other in a second direction, the second direction being substantially perpendicular to the first direction; forming gate structures on the first active region, the second active region, and portions of the isolation layer, wherein first and third gate structures are formed on the first active region and a portion of the isolation layer adjacent to the first active region, the first and third gate structures extend in the second direction, and the first and third gate structures are spaced apart from each other in the first direction, and second and fourth gate structures are formed on the second active region and a portion of the isolation layer adjacent to the second active region, the second and fourth gate structures extend in the second direction, and the second and fourth gate structures are spaced apart from each other in the first direction, and the second and fourth gate structures face and are spaced apart from the first and third gate structures, respectively, in the second direction; forming first, second, third, and fourth contacts on portions of the first, second, third, and fourth gate structures, respectively; and electrically connecting the first and fourth contacts to each other and the second and third contacts to each other. The first and third contacts are spaced apart from the first active region in the first direction by substantially the same distance, and the second and fourth contacts are spaced apart from the second active region in the second direction by substantially the same distance.

The method may further include: doping, with p-type impurities, upper portions of the first active region adjacent to the first and third gate structures; and doping, with n-type impurities, upper portions of the second active region adjacent to the second and fourth gate structures.

The electrically connecting the first and fourth contacts to each other may include forming a first lower wiring on the first and fourth contacts.

The electrically connecting the second and third contacts to each other may include: forming first and second lower wirings on the second and third contacts, respectively; forming first and second vias on the first and second lower wirings, respectively; and forming a first upper wiring on the first and second vias.

The method may further include: doping, with impurities of a first conductivity type, upper portions of the first active region at opposite sides of the first gate structure to form first and third impurity regions, respectively; and doping, with impurities of a second conductivity type, upper portions of the second active region at opposite sides of the second gate structure to form second and fourth impurity regions, respectively.

The method may further include: forming fifth and sixth contacts on the first and second impurity regions, respectively; forming first and second lower wirings on the fifth and sixth contacts, respectively; forming first and second vias on the first and second lower wirings, respectively; and forming a first upper wiring on the first and second vias.

The method may further include: forming fifth and sixth contacts on the third and fourth impurity regions, respectively; forming first and second lower wirings on the fifth and sixth contacts, respectively; forming first and second vias on the first and second lower wirings, respectively; and forming a first upper wiring on the first and second vias.

At least one other example embodiment provides a semiconductor integrated circuit. The semiconductor integrated circuit includes: an inverter circuit; a transmission circuit including a first transmission transistor and a second transmission transistor, an output terminal of the transmission circuit being coupled to an input terminal of the inverter circuit; a logic transistor circuit connected in parallel with the inverter circuit, the logic transistor circuit including a plurality of logic transistors connected in series between a supply voltage and ground; a first contact connected between a first wiring and a gate structure of the first transmission transistor; a second contact connected between the first wiring and a gate structure of a first of the plurality of logic transistors; a third contact connected between a second wiring and a gate structure of the second transmission transistor; and a fourth contact connected between the second wiring and a gate structure of a second of the plurality of logic transistors. The first contact and the fourth contact are spaced apart from an active region of the first transmission transistor and the second of the plurality of logic transistors by a first distance, and the second contact and the third contact are spaced apart from an active region of the second transmission transistor and the first of the plurality of logic transistors by a second distance.

The first distance and the second distance may be the same or substantially the same.

The first transmission transistor and the first of the plurality of logic transistors may be configured to receive a first clock signal. The second transmission transistor and the second of the plurality of logic transistors may be configured to receive a second clock signal.

The first transmission transistor and the second of the plurality of logic transistors may be PMOS transistors. The second transmission transistor and the first of the plurality of logic transistors may be NMOS transistor.

The first contact and the fourth contact may be spaced apart from a first boundary of the active region of the first transmission transistor and the second of the plurality of logic transistors by the first distance, and the first boundary may have a first linear shape. The second contact and the third contact may be spaced apart from a second boundary of the active region of the second transmission transistor and the first of the plurality of logic transistors by the second distance, and the second boundary may have a second linear shape.

Semiconductor integrated circuits in accordance with one or more example embodiments may include PMOS and NMOS gates that may be cross-coupled through contacts, lower wirings, vias and/or upper wirings. Thus, circuits including cross-coupled PMOS and NMOS gates, e.g., a clock latch circuit may be easily implemented with little or without increasing the area.

BRIEF DESCRIPTION OF THE DRAWINGS

Example embodiments will be more clearly understood from the following detailed description taken in conjunction with the accompanying drawings. FIGS. 1 to 38 represent non-limiting, example embodiments as described herein.

FIG. 1 is an equivalent circuit diagram of a semiconductor integrated circuit in accordance with example embodiments;

FIGS. 2A, 2B, 2C and 3 are plan views illustrating layouts of region X shown in FIG. 1, in accordance with example embodiments;

FIGS. 4 to 6 are plan views illustrating layouts of region X shown in FIG. 1 in accordance with other example embodiments; and FIGS. 7 to 38 are plan views and cross-sectional views illustrating stages of a method of manufacturing a semiconductor integrated circuit in accordance with example embodiments.

DETAILED DESCRIPTION

Figure 1:
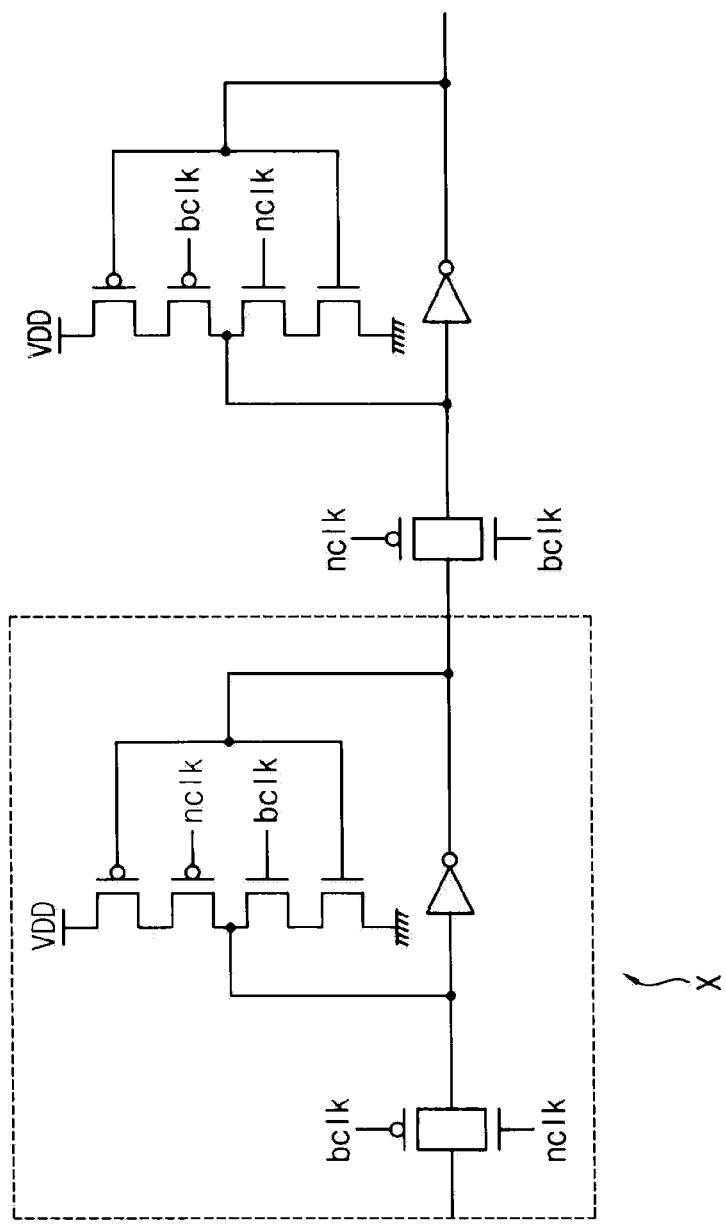

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this description will be thorough and complete, and will fully convey the scope of inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure is illustrated in a cross-sectional view, an electronic device may include a plurality of the device structures, as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is an equivalent circuit diagram of a semiconductor integrated circuit in accordance with example embodiments, and FIGS. 2A, 2B, 2C and 3 are plan views illustrating example layouts of a region X shown in FIG. 1.

In at least some example embodiments, the semiconductor integrated circuit may be a clock latch circuit, and thus may include two circuits connected to each other in series, one of which is shown in the region X. Hereinafter, for convenience of explanation, only the layout of a structure of the circuit shown in the region X will be illustrated, however, those skilled in the art may understand layouts of other parts of the clock latch circuit not shown herein. For convenience of explanation, some elements of the semiconductor integrated circuit, e.g., spacers are not shown in FIGS. 2 to 6.

Referring to FIGS. 1 and 2A, the semiconductor integrated circuit may include first and second active regions 102 and 104, an isolation layer 110, first to fourth gate structures 151, 152, 153 and 154, and first to fourth contacts 281, 282, 283 and 284 on a substrate 100. The first and fourth gate structures 151 and 154 are configured to receive signal bclk, whereas the second and third gate structures 152 and 153 receive signal nclk.

The semiconductor integrated circuit may further include fifth to eighth gate structures 155, 156, 157 and 158, first to tenth impurity regions 221, 222, 223, 224, 225, 226, 227, 228, 229 and 230, fifth to fifteenth contacts 285, 286, 287, 288, 289, 290, 291, 292, 293, 294 and 295, first to twelfth lower wirings 301, 302, 303, 304, 305, 306, 307, 308, 309, 310, 311 and 312, first to eighth vias 341, 342, 343, 344, 345, 346, 347 and 348, and first to fifth upper wirings 351, 352, 353, 354 and 355.

Figure 13:
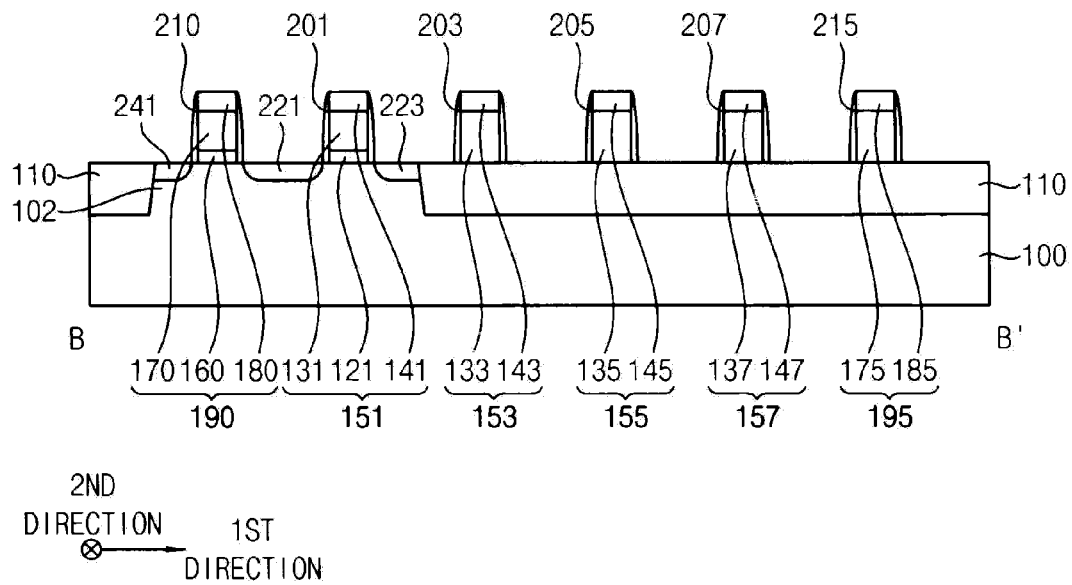
Figure 14:
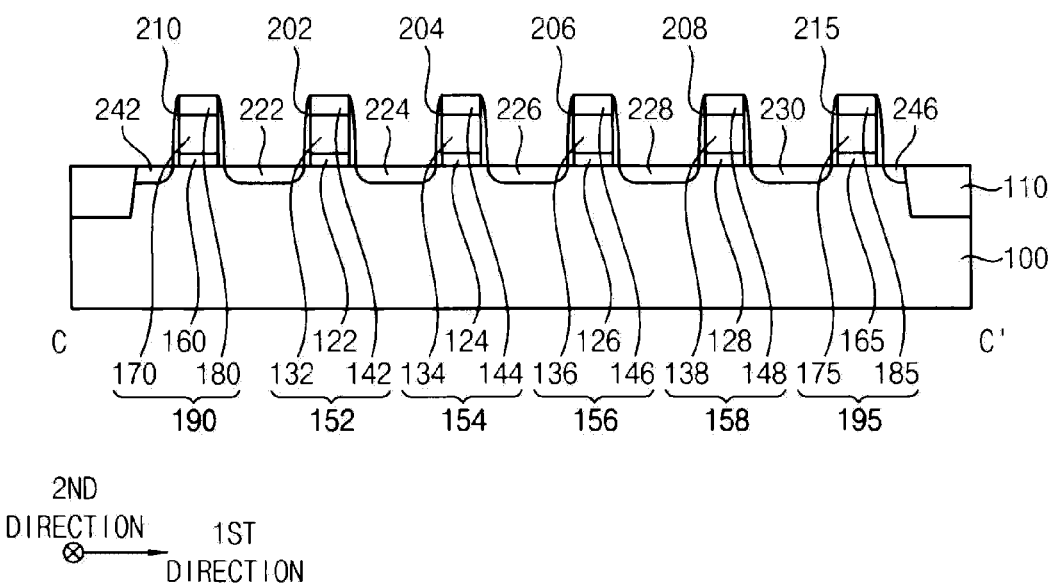

Furthermore, the semiconductor integrated circuit may include ninth and tenth gate structures 190 and 195, eleventh to fourteenth impurity regions 241, 242, 245 and 246, a first insulating interlayer 250 (refer to FIGS. 15 to 17), a second insulating interlayer 320 (refer to FIGS. 25 to 28), and first to tenth spacers 201, 202, 203, 204, 205, 206, 207, 208, 210 and 215 (refer to FIGS. 12 to 14).

The substrate 100 may include a semiconductor material, e.g., silicon, germanium, etc., or a III-V compound semiconductor material, e.g., GaP, GaAs, GaSb, etc. In some embodiments, the substrate 100 may be a silicon-on-insulator (SOI) substrate, or a germanium-on-insulator (GOI) substrate.

Referring to the isolation layer 110 on the substrate 100, a field region of which a top surface may be covered by the isolation layer 110 and the first and second active regions 102 and 104 of which top surfaces may not be covered by the isolation layer 110 may be defined in the substrate 100. The isolation layer 110 may include an oxide, e.g., silicon oxide.

Each of the first and second active regions 102 and 104 may extend in a first direction parallel or substantially parallel to a top surface of the substrate 100, and a plurality of first active regions 102 and a plurality of second active regions 104 may be formed in a second direction parallel or substantially parallel to the top surface of the substrate 100 and perpendicular or substantially perpendicular to the first direction.

At least a portion of each of the first and second active regions 102 and 104 may be doped with impurities, and the first and second active regions 102 and 104 may be doped with different types of impurities. In at least some example embodiments, the first, third, fifth, seventh, ninth, eleventh and thirteenth impurity regions 221, 223, 225, 227, 229, 241 and 245 in the first active region 102 may be doped with p-type impurities, e.g., boron, aluminum, etc., and the second, fourth, sixth, eighth, tenth, twelfth and fourteenth impurity regions 222, 224, 226, 228, 230, 242 and 246 in the second active region 104 may be doped with n-type impurities, e.g., phosphorous, arsenic, etc. Thus, the first active region 102 may be a positive-channel metal oxide semiconductor (PMOS) region in which PMOS transistors may be formed, and the second active region 104 may be a negative-channel metal oxide semiconductor (NMOS) region in which NMOS transistors may be formed.

The first and third gate structures 151 and 153 may be spaced apart from each other in the first direction. Each of the first and third gate structures 151 and 153 may extend in the second direction, and may be formed on the first active region 102, and a first portion of the isolation layer 110 between the first and second active regions 102 and 104. However, each of the first and third gate structures 151 and 153 may further extend in the second direction to be also formed on a third portion of the isolation layer 110 that may be opposite to the first portion of the isolation layer 110 in the second direction with respect to the first active region 102.

The second and fourth gate structures 152 and 154 may be spaced apart from each other in the first direction. Each of the second and fourth gate structures 152 and 154 may extend in the second direction, and may be formed on the second active region 104, and the first portion of the isolation layer 110 between the first and second active regions 102 and 104. However, each of the second and fourth gate structures 152 and 154 may further extend in the second direction to be also formed on a second portion of the isolation layer 110 that may be opposite to the first portion of the isolation layer 110 in the second direction with respect to the second active region 104.

In at least some example embodiments, the second and fourth gate structures 152 and 154 may face and be spaced apart from the first and third gate structures 151 and 153, respectively, in the second direction.

The fifth gate structure 155 may be spaced apart from the third gate structure 153 in the first direction, and may extend in the second direction to be formed on the first active region 102 and the first portion of the isolation layer 110. The fifth gate structure 155 may further extend in the second direction to be also formed on the third portion of the isolation layer 110 opposite to the first portion of the isolation layer 110 in the second direction with respect to the first active region 102.

The sixth gate structure 156 may be spaced apart from the fourth gate structure 154 in the first direction, and may extend in the second direction to be formed on the second active region 104 and the first portion of the isolation layer 110. The sixth gate structure 156 may further extend in the second direction to be also formed on the second portion of the isolation layer 110 opposite to the first portion of the isolation layer 110 in the second direction with respect to the second active region 104.

In at least some example embodiments, the fifth and sixth gate structures 155 and 156 may be connected to each other on the first portion of the isolation layer 110, which may extend in the second direction as a whole.

The seventh gate structure 157 may be spaced apart from the fifth gate structure 155 in the first direction, and may extend in the second direction to be formed on the first active region 102 and the first portion of the isolation layer 110. The seventh gate structure 157 may further extend in the second direction to be also formed on the third portion of the isolation layer 110 opposite to the first portion of the isolation layer 110 in the second direction with respect to the first active region 102.

The eighth gate structure 158 may be spaced apart from the sixth gate structure 156 in the first direction, and may extend in the second direction to be formed on the second active region 104 and the first portion of the isolation layer 110. The eighth gate structure 158 may further extend in the second direction to be also formed on the second portion of the isolation layer 110 opposite to the first portion of the isolation layer 110 in the second direction with respect to the second active region 104.

In at least some example embodiments, the seventh and eighth gate structures 157 and 158 may be connected to each other on the first portion of the isolation layer 110, which may extend in the second direction as a whole.

The ninth gate structure 190 may extend in the second direction to be formed on the first and second active regions 102 and 104 and the isolation layer 110. The ninth gate structure 190 may be spaced apart from the first and second gate structures 151 and 152 in the first direction to be opposite to the third and fourth gate structures 153 and 154, respectively, with respect to the first and second gate structures 151 and 152, respectively. Additionally, the tenth gate structure 195 may extend in the second direction to be formed on the first and second active regions 102 and 104 and the isolation layer 110. The tenth gate structure 195 may be spaced apart from the seventh and eighth gate structures 157 and 158 in the first direction to be opposite to the fifth and sixth gate structures 155 and 156, respectively, with respect to the seventh and eighth gate structures 157 and 158, respectively.

As illustrated above, the ninth, first, third, fifth, seventh and tenth gate structures 190, 151, 153, 155, 157 and 195 may be disposed in the first direction on the first active region 102 and a portion of the isolation layer 110 adjacent thereto, and a distance therebetween may be the same, substantially the same, or different from each other. Likewise, the ninth, second, fourth, sixth, eighth and tenth gate structures 190, 152, 154, 156, 158 and 195 may be disposed in the first direction on the second active region 104 and a portion of the isolation layer 110 adjacent thereto, and a distance therebetween may be the same, substantially the same, or different from each other.

The first to eighth gate structures 151, 152, 153, 154, 155, 156, 157 and 158 may directly correspond to elements included in the equivalent circuit diagram of FIG. 1, however, the ninth and tenth gate structures 190 and 195 may not directly correspond to the elements included in the equivalent circuit diagram of FIG. 1, and may correspond to elements of other circuits connected to the clock latch circuit.

Each of the gate structures 151, 152, 153, 154, 155, 156, 157, 158, 190 and 195 may include a gate insulation layer pattern, a gate electrode and a gate mask sequentially stacked on the substrate 100 and the isolation layer 110. The gate insulation layer pattern may be formed only on the active regions 102 and 104 of the substrate 100, or may be also formed on the isolation layer 110. FIGS. 1 and 2 show that the gate insulation layer pattern is formed only on the active regions 102 and 104 of the substrate 100.

Referring to FIGS. 10, 11, 13 and 14 together with FIGS. 1 and 2A, the first gate structure 151 may include a first gate insulation layer pattern 121, a first gate electrode 131 and a first gate mask 141 sequentially stacked, the second gate structure 152 may include a second gate insulation layer pattern 122, a second gate electrode 132 and a second gate mask 142 sequentially stacked, the third gate structure 153 may include a third gate insulation layer pattern 123, a third gate electrode 133 and a third gate mask 143 sequentially stacked, the fourth gate structure 154 may include a fourth gate insulation layer pattern 124, a fourth gate electrode 134 and a fifth gate mask 144 sequentially stacked, the fifth gate structure 155 may include a fifth gate insulation layer pattern 125, a fifth gate electrode 135 and a fifth gate mask 145 sequentially stacked, the sixth gate structure 156 may include a sixth gate insulation layer pattern 126, a sixth gate electrode 136 and a sixth gate mask 146 sequentially stacked, the seventh gate structure 157 may include a seventh gate insulation layer pattern 127, a seventh gate electrode 137 and a seventh gate mask 147 sequentially stacked, the eighth gate structure 158 may include an eighth gate insulation layer pattern 128, an eighth gate electrode 138 and an eighth gate mask 148 sequentially stacked, the ninth gate structure 190 may include a ninth gate insulation layer pattern 160, a ninth gate electrode 170 and a ninth gate mask 180 sequentially stacked, and the tenth gate structure 195 may include a tenth gate insulation layer pattern 165, a tenth gate electrode 175 and a tenth gate mask 185 sequentially stacked.

The first to tenth gate insulation layer patterns 121, 122, 123, 124, 125, 126, 127, 128, 160 and 165 may include an oxide, e.g., silicon oxide, the first to tenth gate electrodes 131, 132, 133, 134, 135, 136, 137, 138, 170 and 175 may include a conductive material, e.g., doped polysilicon, a metal, a metal nitride, etc., and the first to tenth gate masks 141, 412, 143, 144, 145, 146, 147, 148, 180 and 185 may include a nitride, e.g., silicon nitride.

Referring to FIGS. 12 to 14 together with FIGS. 1 and 2A, first to tenth spacers 201, 202, 203, 204, 205, 206, 207, 208, 210 and 215 may be formed on opposite sidewalls of the respective gate structures 151, 152, 153, 154, 155, 156, 157, 158, 190 and 195. The first to tenth spacers 201, 202, 203, 204, 205, 206, 207, 208, 210 and 215 may include a nitride, e.g., silicon nitride.

In at least some example embodiments, a portion of the first active region 102 on which the first gate structure 151 is formed may have a width in the second direction greater than that of a portion of the first active region 102 on which the third gate structure 153 is formed. Thus, FIG. 2A shows that a width of a portion of the first active region 102 on which the first and ninth gate structures 153 and 190 are formed is greater than that of the first active region 102 on which the third, fifth, seventh and tenth gate structures 153, 155, 157 and 195 are formed. Additionally, a portion of the second active region 104 on which the second gate structure 152 is formed may have a width in the second direction greater than that of a portion of the second active region 104 on which the fourth gate structure 154 is formed. Thus, FIG. 2 shows that a width of a portion of the second active region 104 on which the second and ninth gate structures 152 and 190 are formed is greater than that of the second active region 104 on which the fourth, sixth, eighth and tenth gate structures 154, 156, 158 and 195 are formed.

However, inventive concepts may not be limited thereto. Thus, FIG. 3 shows a width of each of the third and fourth active regions 103 and 105 in the second direction is constant or substantially constant along the first direction regardless of the relative location with respect to the gate structures 151, 152, 153, 154, 155, 156, 157, 158, 190 and 195, which may be included in inventive concepts. Hereinafter, for convenience of explanation, only the first and second active regions 102 and 104 having the shapes shown in FIG. 2A will be illustrated.

The first active region 102 may have a first boundary adjacent to the first portion of the isolation layer 110, and a second boundary opposite to the first boundary in the second direction. In at least some example embodiments, the first boundary may have a linear shape (e.g., more uniform, not crooked) in the first direction. Additionally, the second active region 104 may have a third boundary adjacent to the first portion of the isolation layer 110, and a fourth boundary opposite to the third boundary in the second direction. In at least some example embodiments, the third boundary may have a linear shape (e.g., more uniform, not crooked) in the first direction.

The first, third, fifth, seventh and ninth impurity regions 221, 223, 225, 227 and 229 may be formed at upper portions of the first active region 102 between the ninth, first, third, fifth, seventh and tenth gate structures 190, 151, 153, 155, 157 and 195, respectively, in this order. In at least some example embodiments, the first, third, fifth, seventh and ninth impurity regions 221, 223, 225, 227 and 229 may be doped with p-type impurities. Additionally, the second, fourth, sixth, eighth and tenth impurity regions 222, 224, 226, 228 and 230 may be formed at upper portions of the second active region 104 between the ninth, second, fourth, sixth, eighth and tenth gate structures 190, 152, 154, 156, 158 and 195, respectively, in this order. In at least some example embodiments, the second, fourth, sixth, eighth and tenth impurity regions 222, 224, 226, 228 and 230 may be doped with n-type impurities.

The eleventh and twelfth impurity regions 241 and 242 may be formed at upper portions of the first and second active regions 102 and 104, respectively, adjacent to the ninth gate structure 190, and may be doped with p-type and n-type impurities, respectively. Additionally, the thirteenth and fourteenth impurity regions 245 and 246 may be formed at upper portions of the first and second active regions 102 and 104, respectively, adjacent to the tenth gate structure 195, and may be doped with p-type and n-type impurities, respectively.

Each of the first to tenth gate structures 151, 152, 153, 154, 155, 156, 157, 158, 190 and 195 together with some of the first to fourteenth impurity regions 221, 222, 223, 224, 225, 226, 227, 228, 229, 230, 241, 242, 245 and 246 may form a PMOS transistor or an NMOS transistor, and each of the first to fourteenth impurity regions 221, 222, 223, 224, 225, 226, 227, 228, 229, 230, 241, 242, 245 and 246 may serve as a source/drain region of the PMOS transistor or the NMOS transistor.

Figure 18:
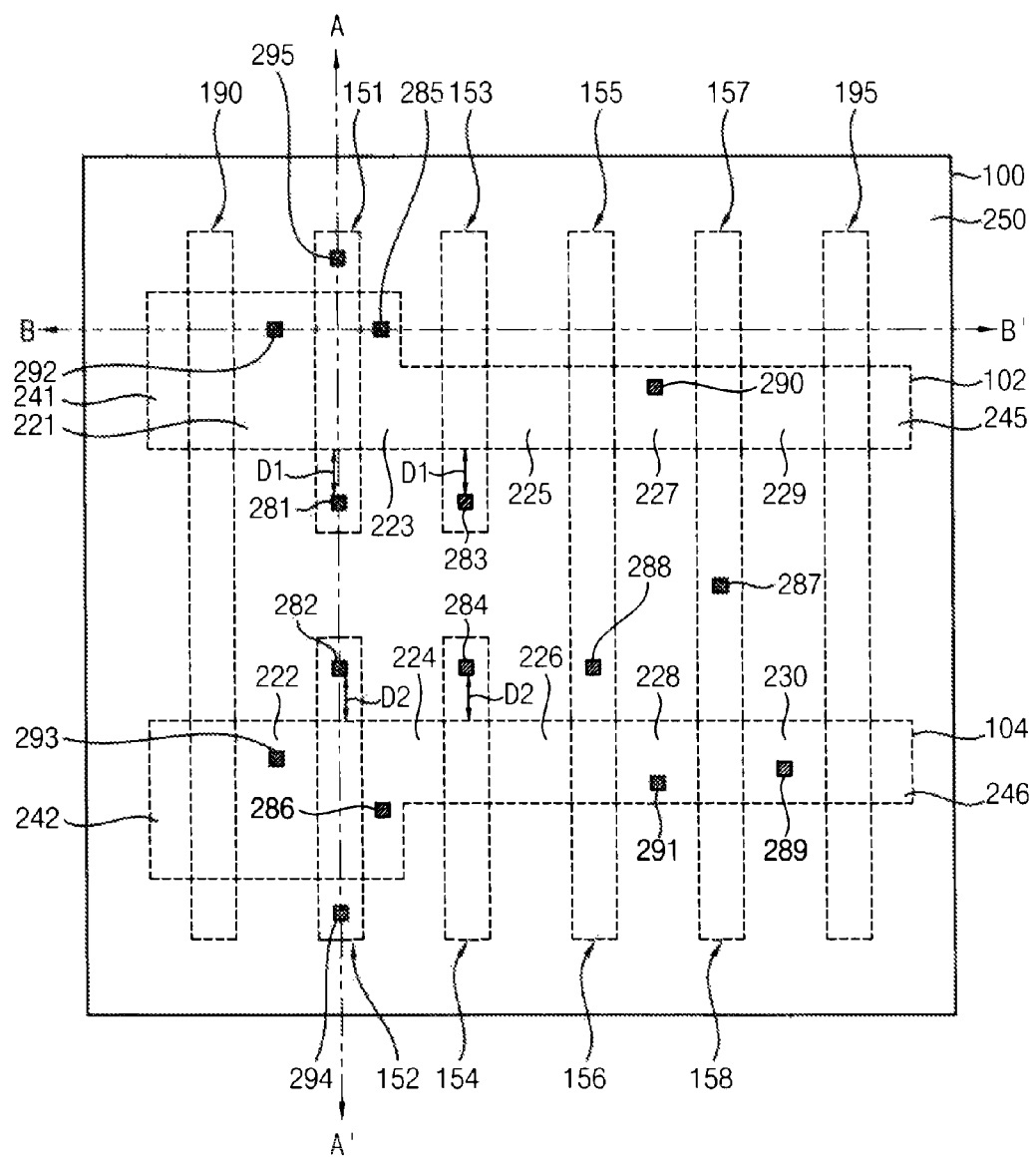
Figure 19:
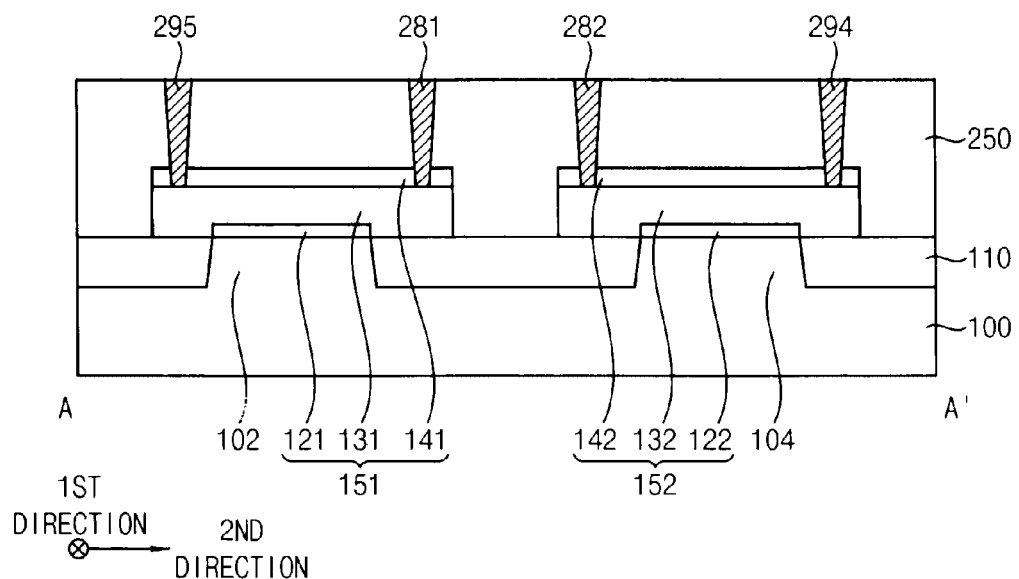
Figure 20:
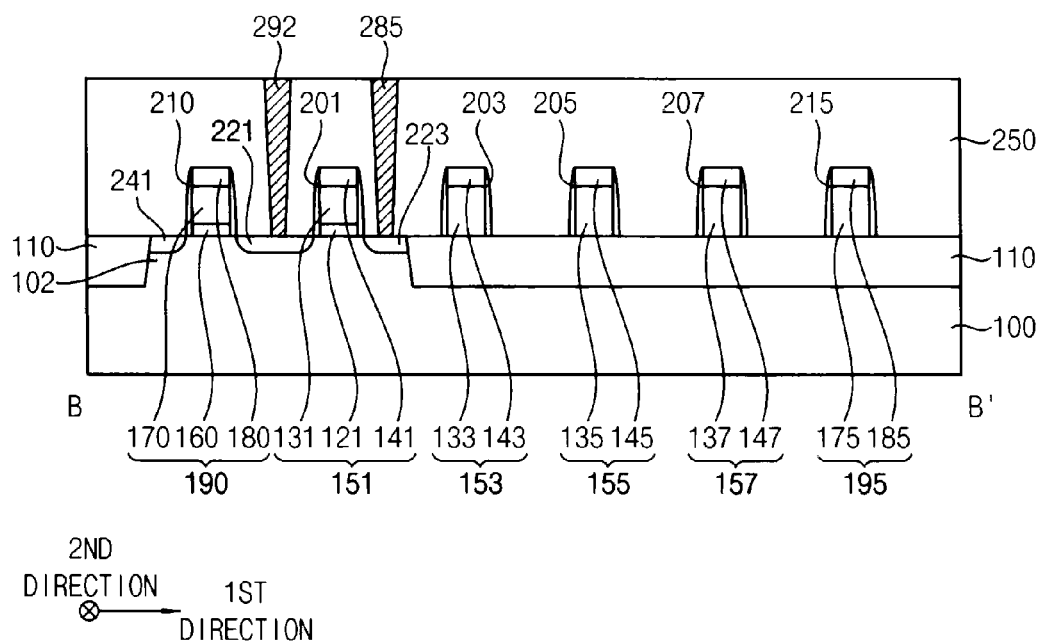
Figure 21:
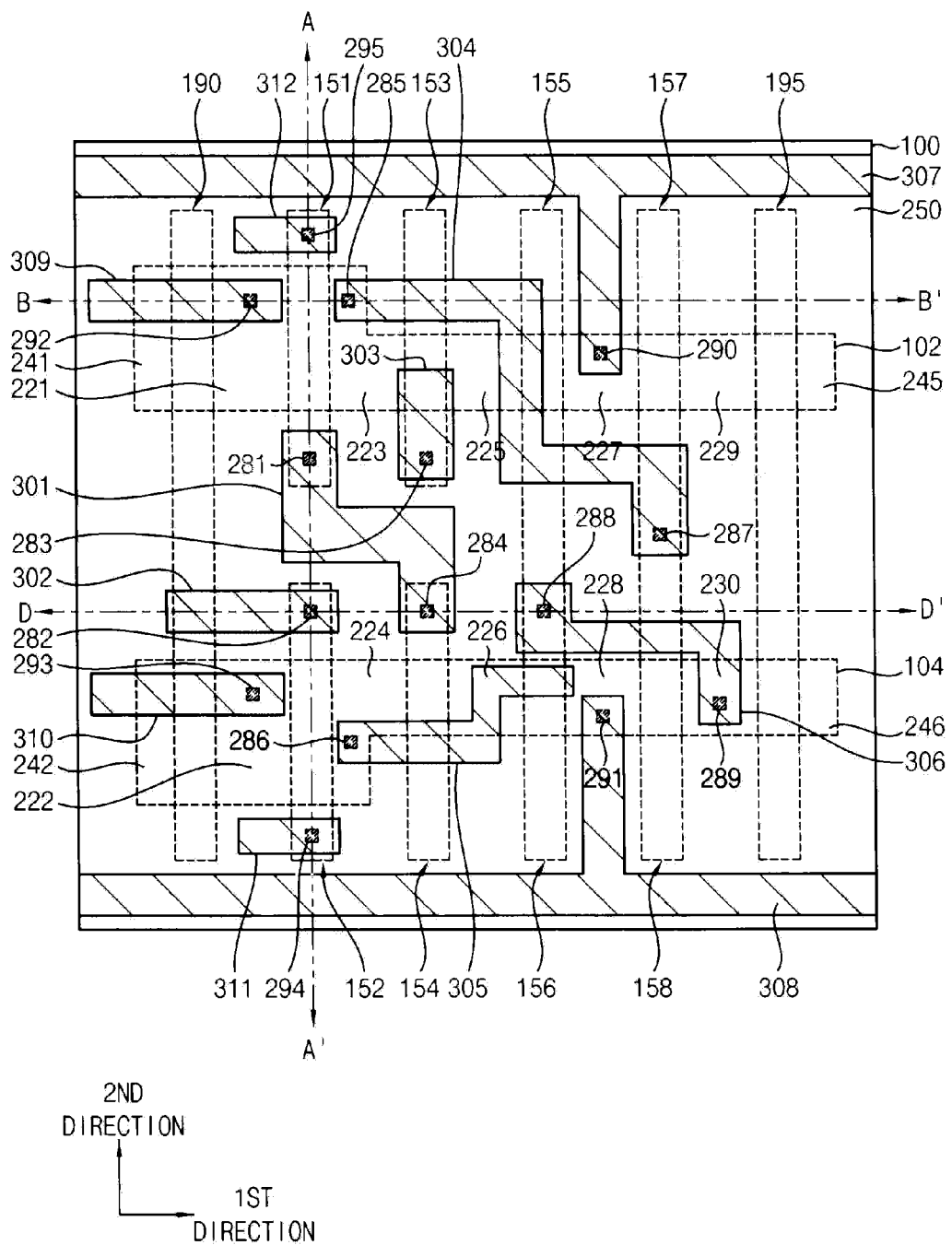
Figure 24:
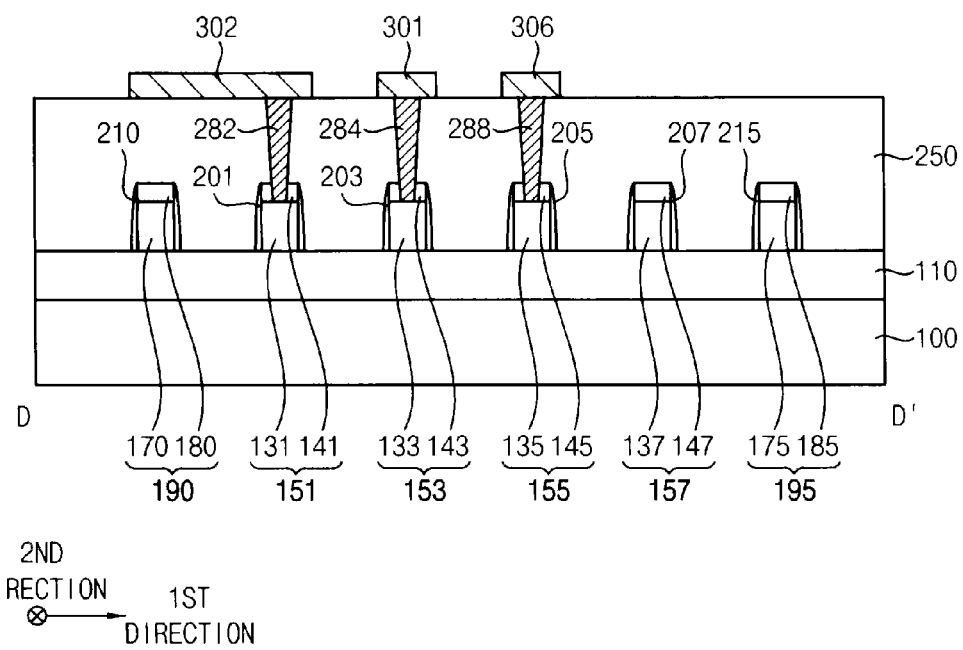
Figure 26:
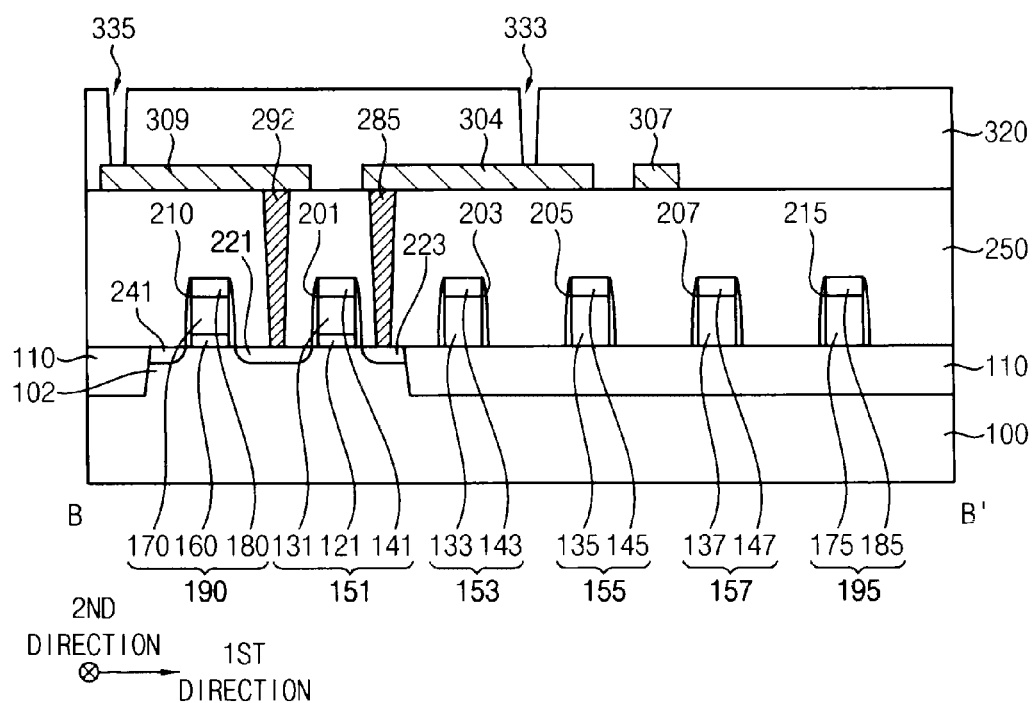
Figure 27:
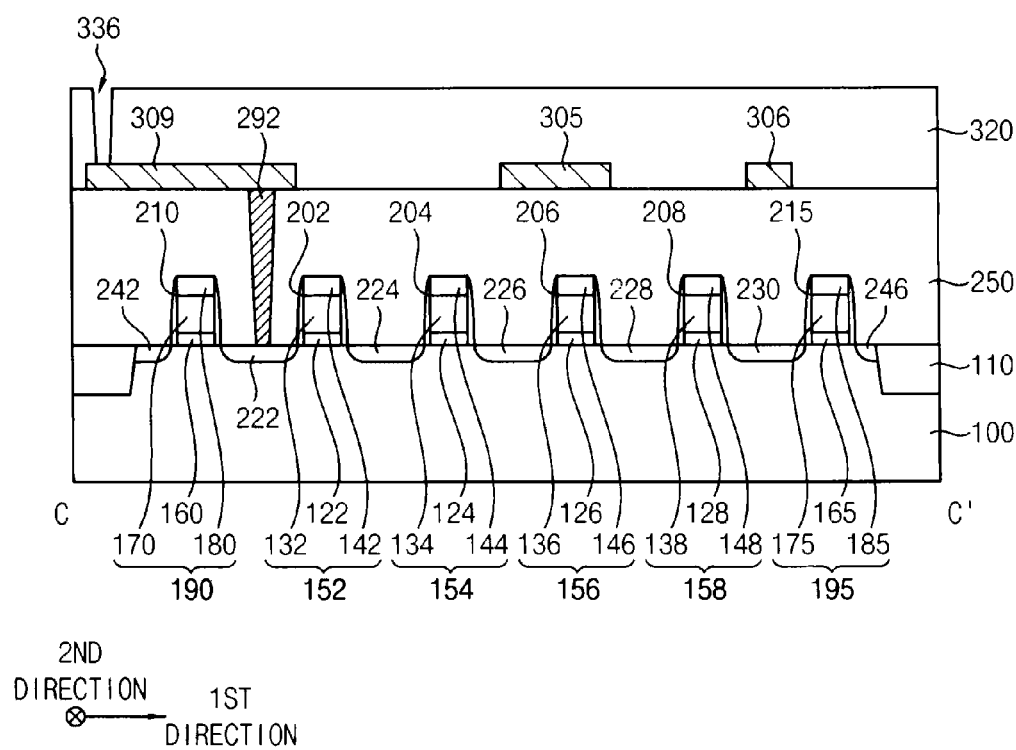
Figure 28:
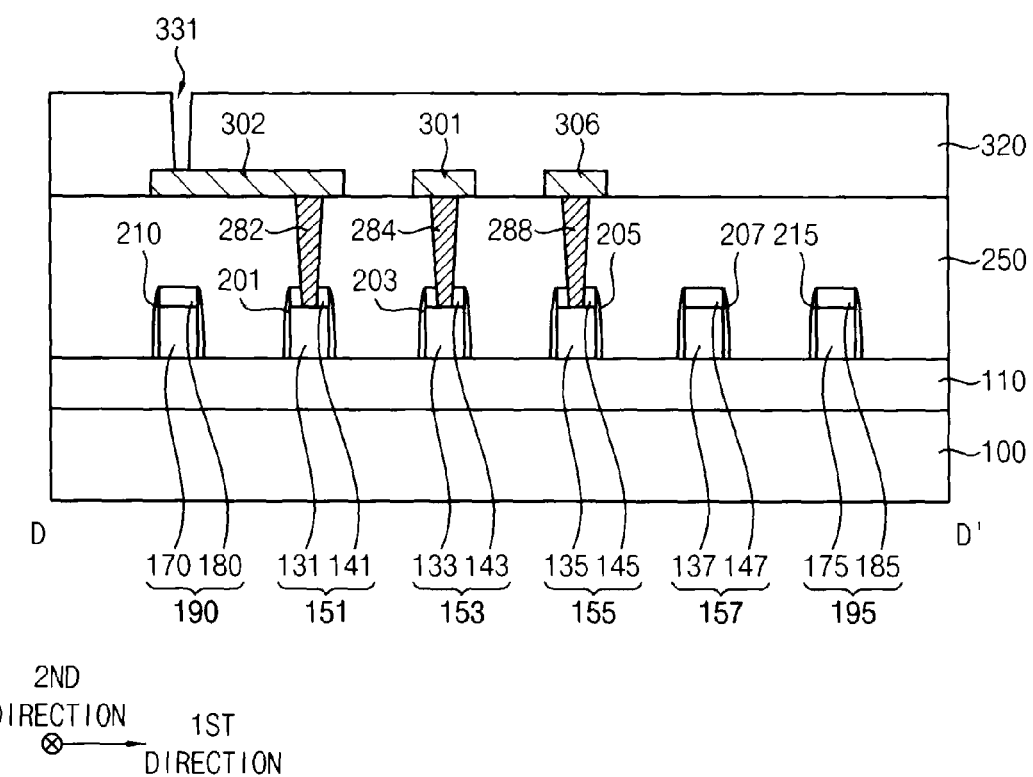
Figure 29:
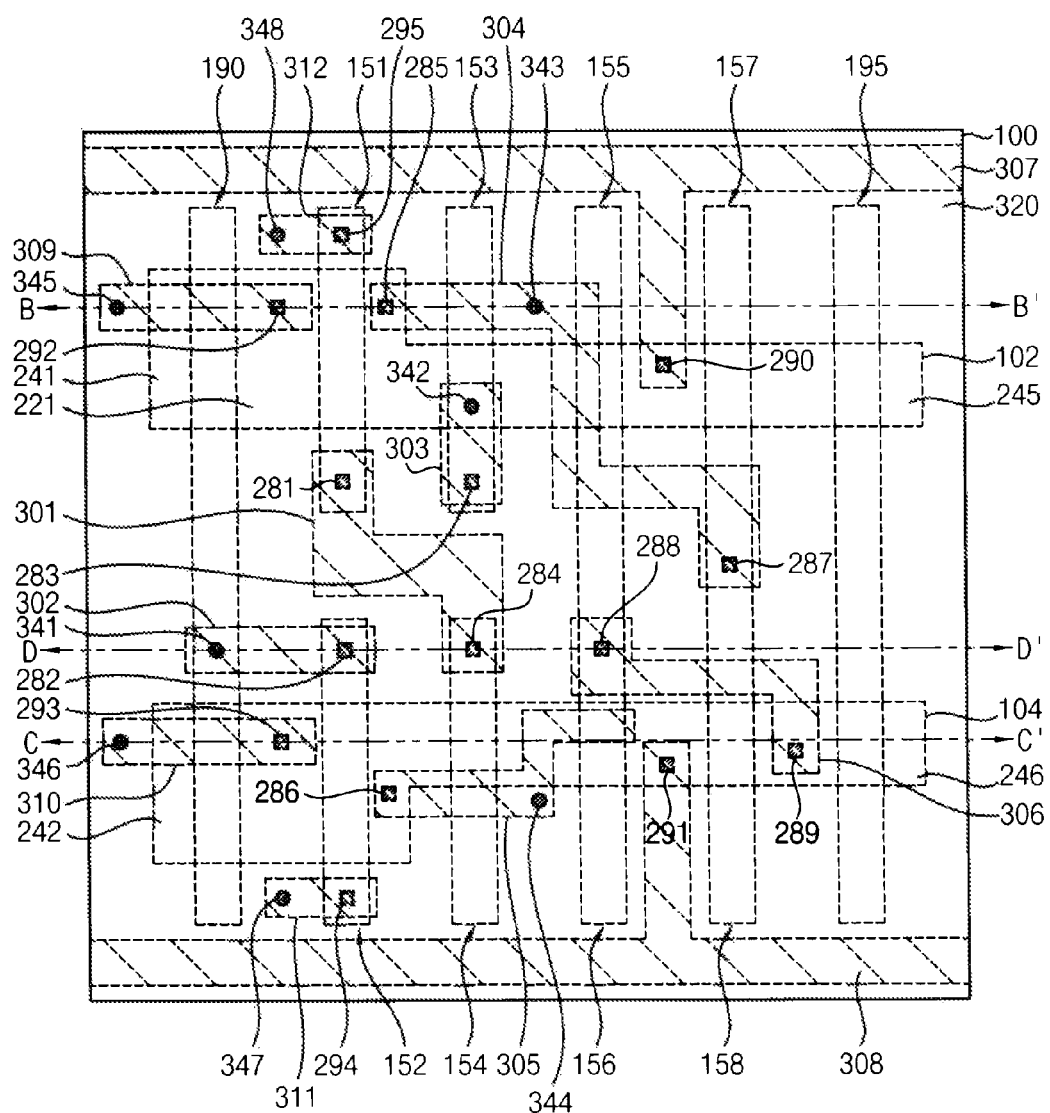
Figure 30:
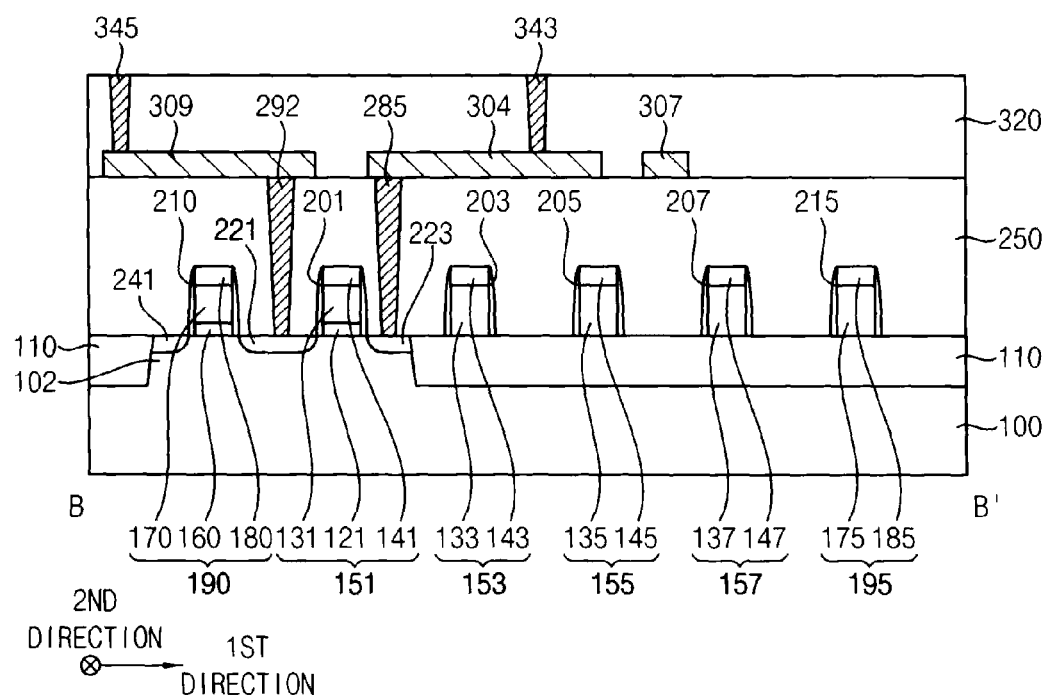
Figure 31:
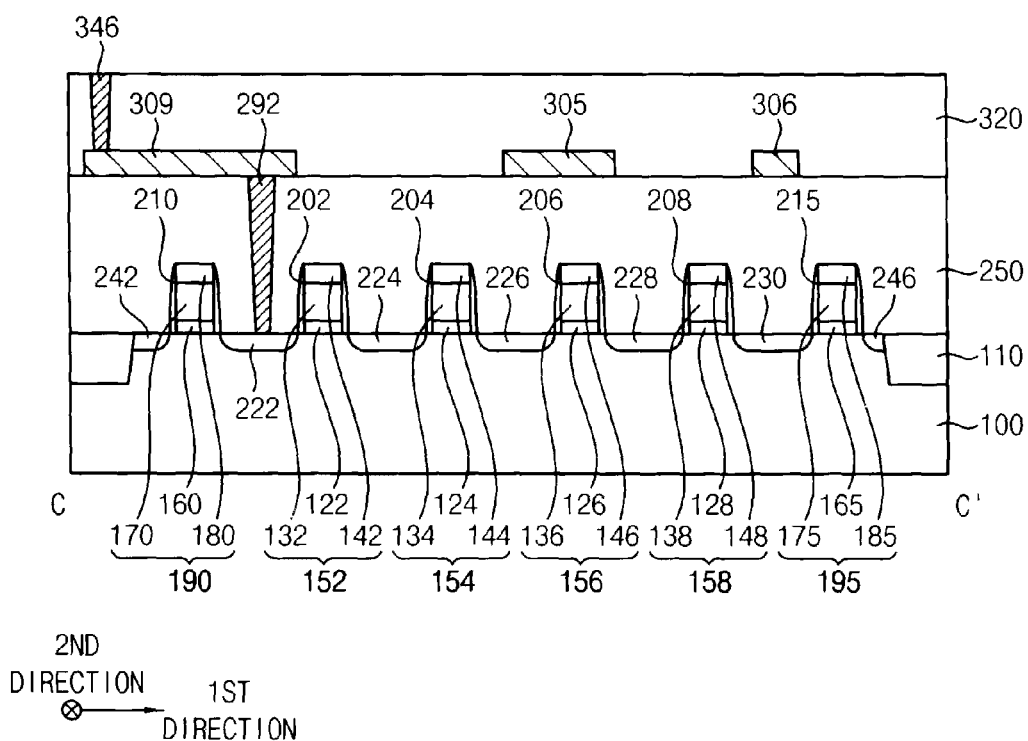
Figure 32:
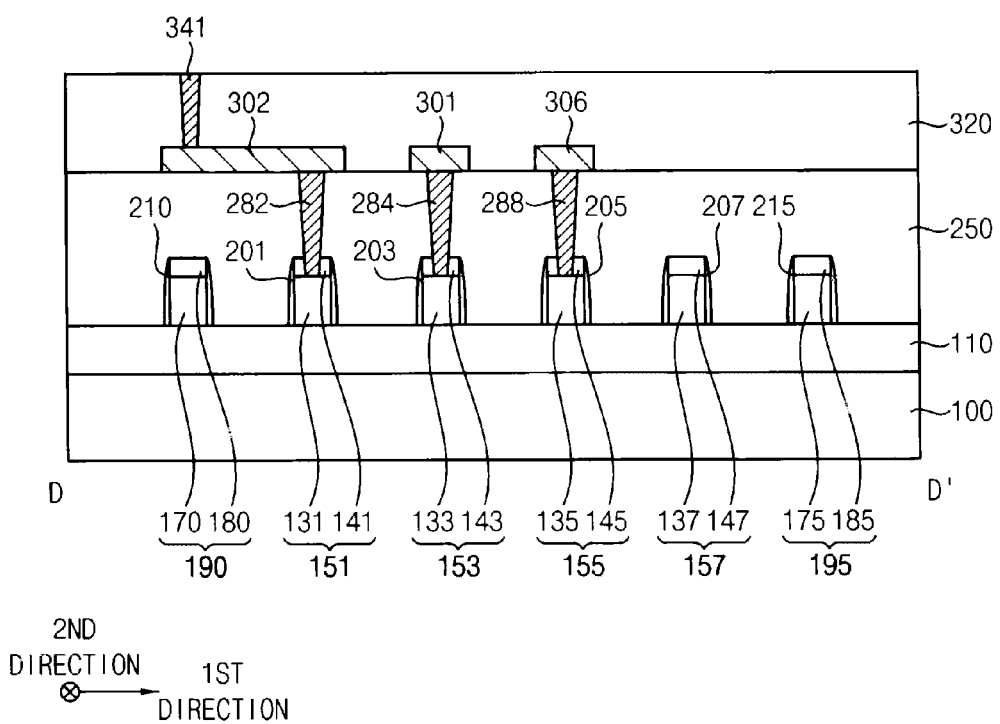
Figure 33:
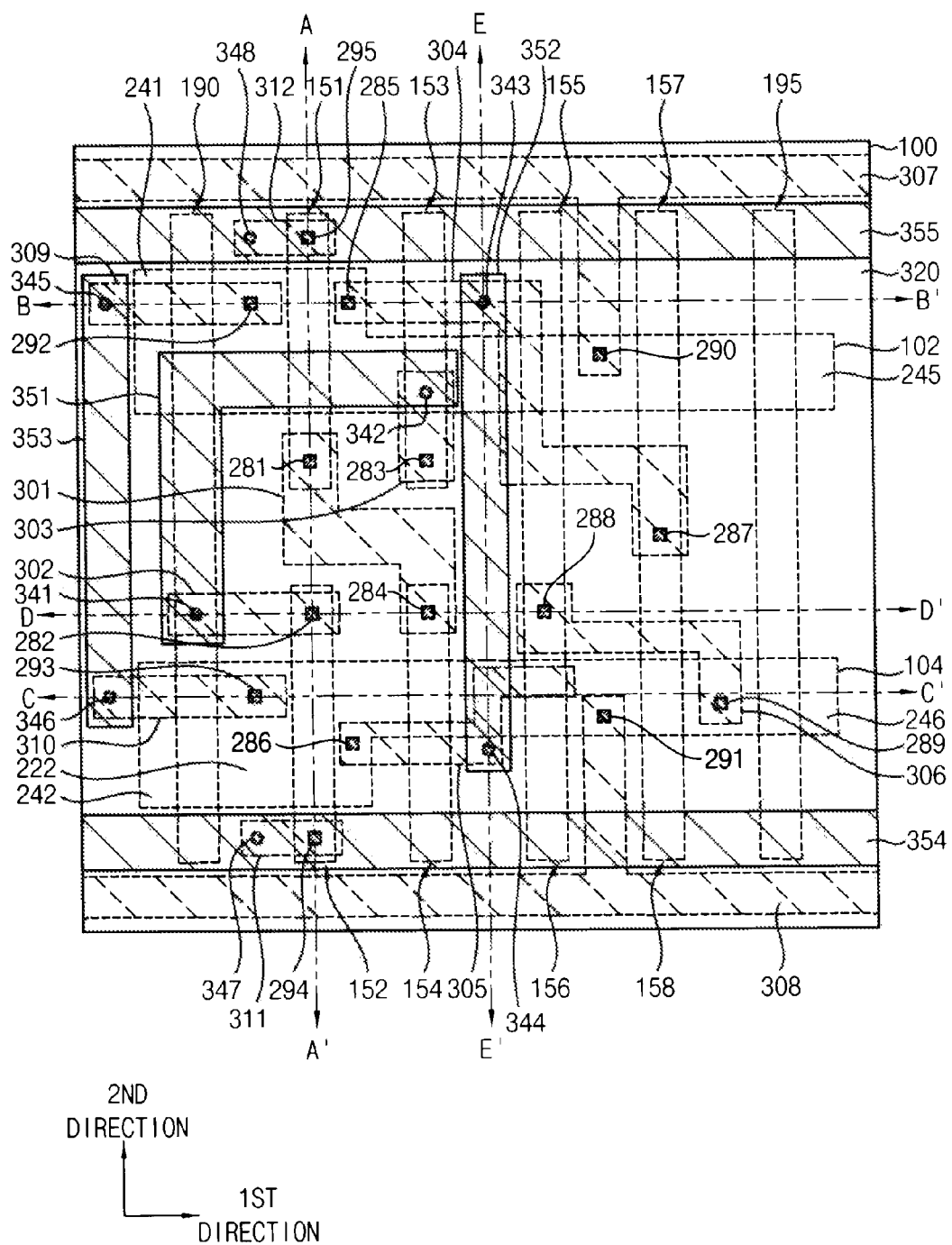
Figure 34:
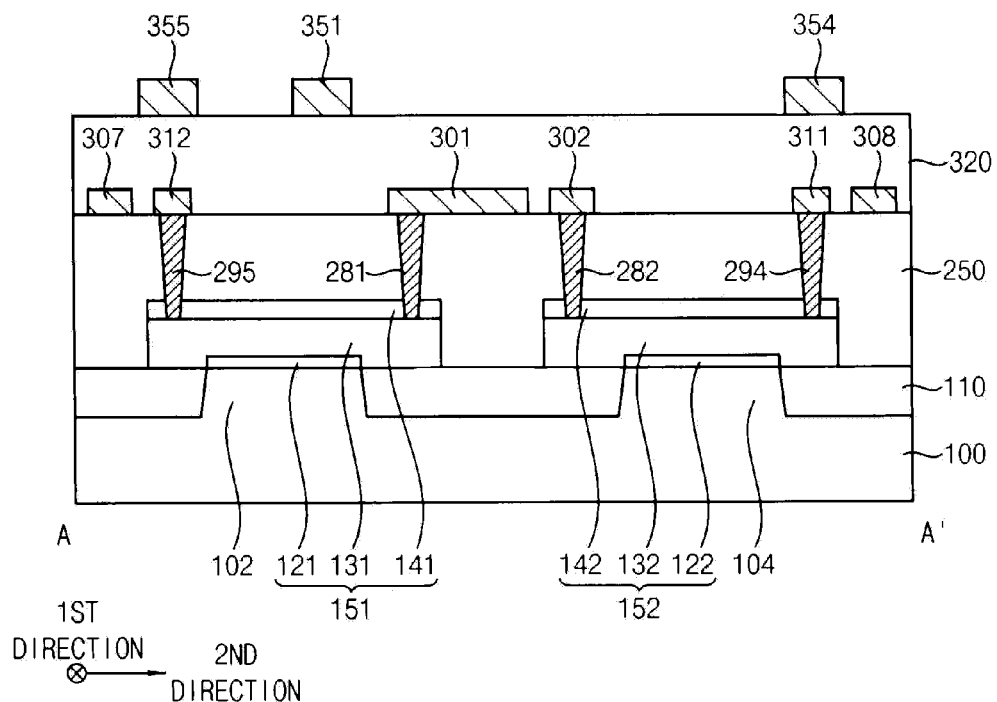
Figure 35:
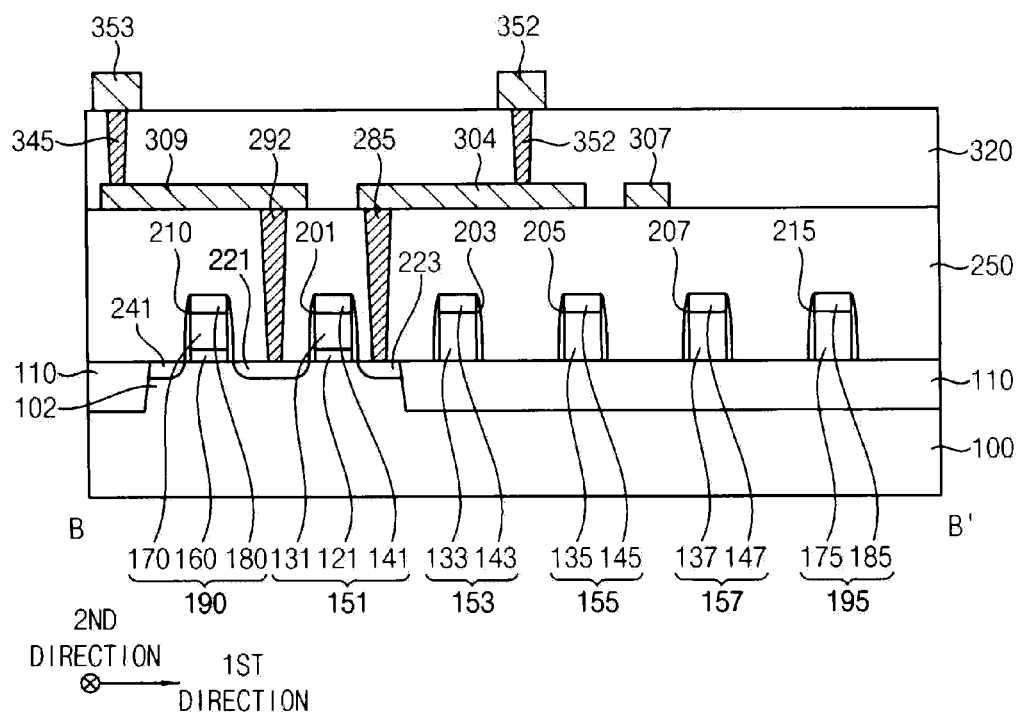
Figure 36:
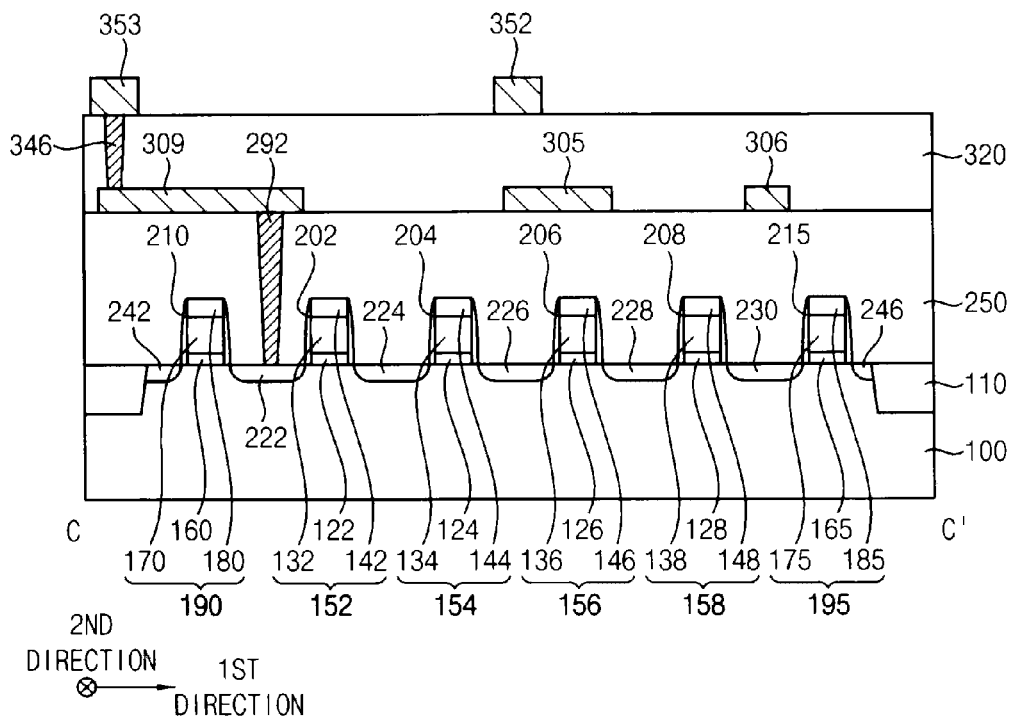
Figure 37:
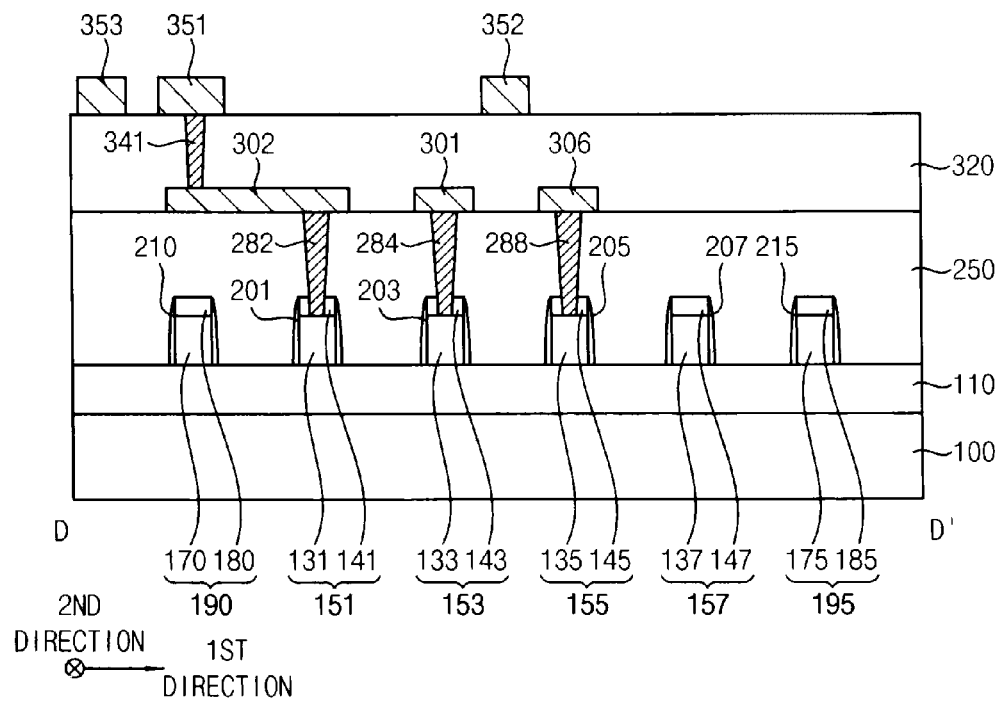

Referring to FIGS. 18 to 20 together with FIGS. 1 and 2A, the first insulating interlayer 250 may be formed on the substrate 100 and the isolation layer 110 to cover the transistors, and each of the first to fifteenth contacts 281, 282, 283, 284, 285, 286, 287, 288, 289, 290, 291, 292, 293, 294 and 295 may be formed through the first insulating interlayer 250 to be electrically connected to the gate structures 151, 152, 153, 154, 155, 156, 157, 158, 190 and 195, or the impurity regions 221, 222, 223, 224, 225, 226, 227, 228, 229, 230, 241, 242, 245 and 246. Thus, when each of the first to fifteenth contacts 281, 282, 283, 284, 285, 286, 287, 288, 289, 290, 291, 292, 293, 294 and 295 is formed on the gate structures 151, 152, 153, 154, 155, 156, 157, 158, 190 and 195, it may contact a top surface of each of the gate structures 151, 152, 153, 154, 155, 156, 157, 158, 190 and 195.

The first insulating interlayer 250 may include an oxide, e.g., silicon oxide, and the first to fifteenth contacts 281, 282, 283, 284, 285, 286, 287, 288, 289, 290, 291, 292, 293, 294 and 295 may include, e.g., doped polysilicon, a metal, a metal nitride, a metal silicide, etc.

The first to fourth contacts 281, 282, 283 and 284 may be formed on a portion of the respective first to fourth gate structures 151, 152, 153 and 154 on the first portion of the isolation layer 110.

In at least some example embodiments, each of the first and third contacts 281 and 283 may be spaced apart from the first boundary of the first active region 102 in the second direction by a first distance D1. That is, for example, the first and third contacts 281 and 283 may be spaced apart from the first active region 102 in the second direction by the same or substantially the same distance. Additionally, each of the second and fourth contacts 282 and 284 may be spaced apart from the third boundary of the second active region 104 in the second direction by a second distance D2. That is, for example, the second and fourth contacts 282 and 284 may be spaced apart from the second active region 104 in the second direction by the same or substantially the same distance. The first and second distances D1 and D2 may be the same, substantially the same, or different from each other.

In at least some example embodiments, as the first and third boundaries of the first and second active regions 102 and 104 have the linear shapes not crooked in the first direction, the first and third contacts 281 and 283 may be aligned with each other in the first direction, and the second and fourth contacts 282 and 284 may be aligned with each other in the first direction.

The fifth and sixth contacts 285 and 286 may be formed on the third and fourth impurity regions 223 and 224, respectively, the seventh contact 287 may be formed on the seventh gate structure 157 or the eighth gate structure 158, and the eighth contact 288 may be formed on the fifth gate structure 155 or the sixth gate structure 156. The ninth to eleventh contacts 289, 290 and 291 may be formed on the tenth, seventh and eighth impurity regions 230, 227 and 228, respectively, and the twelfth and thirteenth contacts 292 and 293 may be formed on the first and second impurity regions 221 and 222, respectively.

The fourteenth and fifteenth contacts 294 and 295 may be formed on portions of the second and first gate structures 152 and 151 on the second and third portions of the isolation layer 110, respectively. However, inventive concepts may not be limited thereto, and the fourteenth and fifteenth contacts 294 and 295 may be also formed on other portions of the second and first gate structures 152 and 151, respectively.

Referring to FIGS. 21 to 24 together with FIGS. 1 and 2A, the first to twelfth lower wirings 301, 302, 303, 304, 305, 306, 307, 308, 309, 310, 311 and 312 may be formed on the first insulating interlayer 250, and contact top surfaces of some of the first to fifteenth contacts 281, 282, 283, 284, 285, 286, 287, 288, 289, 290, 291, 292, 293, 294 and 295 to be electrically connected thereto.

The first to twelfth lower wirings 301, 302, 303, 304, 305, 306, 307, 308, 309, 310, 311 and 312 may include a metal, a metal nitride, a metal silicide, etc., and may include a single layer or a plurality of layers. In at least one example embodiment, each of the first to twelfth lower wirings 301, 302, 303, 304, 305, 306, 307, 308, 309, 310, 311 and 312 may include a metal pattern and a barrier layer pattern covering a bottom and a sidewall thereof.

The first lower wiring 301 may contact top surfaces of the first and fourth contacts 281 and 284. As the first and fourth contacts 281 and 284 may be formed on the portions of the first and fourth gate structures 151 and 154, respectively, on the first portion of the isolation layer 110, the first and fourth contacts 281 and 284 may not be opposite to each other in the first direction or in the second direction. In at least one example embodiment, the first lower wiring 301 may include a portion extending in the first direction and a portion extending in the second direction.

The second and third lower wirings 302 and 303 may contact top surfaces of the second and third contacts 282 and 283, respectively. In at least one example embodiment, the second lower wiring 302 may extend in the first direction, and the third lower wiring 303 may extend in the second direction.

The fourth lower wiring 304 may commonly contact top surfaces of the fifth and seventh contacts 285 and 287. In at least one example embodiment, the fourth lower wiring 304 may include a portion extending in the first direction and a portion extending in the second direction.

The fifth lower wiring 305 may contact a top surface of the sixth contact 286. In at least one example embodiment, the fifth lower wiring 305 may include a portion extending in the first direction and a portion extending in the second direction.

The sixth lower wiring 306 may commonly contact top surfaces of the eighth and ninth contacts 288 and 289. In at least one example embodiment, the sixth lower wiring 306 may include a portion extending in the first direction and a portion extending in the second direction.

The seventh and eighth lower wirings 307 and 308 may contact top surfaces of the tenth and eleventh contacts 290 and 291, respectively. In at least one example embodiment, each of the seventh and eighth lower wirings 307 and 308 may extend in the first direction, and a portion of each of the seventh and eighth lower wirings 307 and 308 may extend in the second direction to contact top surfaces of the tenth and eleventh contacts 290 and 291, respectively.

The ninth and tenth lower wirings 309 and 310 may contact top surfaces of the twelfth and thirteenth contacts 292 and 293, respectively. In at least one example embodiment, each of the ninth and tenth lower wirings 309 and 310 may extend in the first direction.

The eleventh and twelfth lower wirings 311 and 312 may contact top surfaces of the fourteenth and fifteenth contacts 294 and 295, respectively. In at least one example embodiment, each of the eleventh and twelfth lower wirings 311 and 312 may extend in the first direction.

Referring to FIGS. 29 to 32 together with FIGS. 1 and 2A, the second insulating interlayer 320 may be formed on the first insulating interlayer 250, and cover the first to twelfth lower wirings 301, 302, 303, 304, 305, 306, 307, 308, 309, 310, 311 and 312. Each of the first to eighth vias 341, 342, 343, 344, 345, 346, 347 and 348 may be formed through the second insulating interlayer 320, and may be formed on some of the first to twelfth lower wirings 301, 302, 303, 304, 305, 306, 307, 308, 309, 310, 311 and 312 to be electrically connected thereto.

The second insulating interlayer 320 may include an oxide, e.g., silicon oxide, and the first to eighth vias 341, 342, 343, 344, 345, 346, 347 and 348 may include doped polysilicon, a metal, a metal nitride, a metal silicide, etc.

The first and second vias 341 and 342 may contact top surface of the second and third lower wirings 302 and 303, respectively, and the third and fourth vias 343 and 344 may contact top surfaces of the fourth and fifth lower wirings 304 and 305, respectively. The fifth and sixth vias 345 and 346 may contact top surfaces of the ninth and tenth lower wirings 309 and 310, and the seventh and eighth vias 347 and 348 may contact top surfaces of the eleventh and twelfth lower wirings 311 and 312, respectively.

Referring to FIGS. 33 to 38 together with FIGS. 1 and 2A, the first to fifth upper wirings 351, 352, 353, 354 and 355 may be formed on the second insulating interlayer 320, and contact top surfaces of some of the first to eighth vias 341, 342, 343, 344, 345, 346, 347 and 348 to be electrically connected thereto.

The first to fifth upper wirings 351, 352, 353, 354 and 355 may include a metal, a metal nitride, a metal silicide, etc., and may include a single layer or a plurality of layers. In at least one example embodiment, each of the first to fifth upper wirings 351, 352, 353, 354 and 355 may include a metal pattern and a barrier layer pattern covering a bottom and a sidewall thereof.

The first upper wiring 351 may commonly contact top surfaces of the first and second vias 341 and 342. In at least one example embodiment, the first upper wiring 351 may include a portion extending in the first direction and a portion extending in the second direction.

The second upper wiring 352 may commonly contact top surfaces of the third and fourth vias 343 and 344. In at least one example embodiment, the second upper wiring 352 may extend in the second direction.

The third upper wiring 353 may commonly contact top surfaces of the fifth and sixth vias 345 and 346. In at least one example embodiment, the third upper wiring 353 may extend in the second direction.

The fourth and fifth upper wirings 354 and 355 may contact top surfaces of the seventh and eighth vias 347 and 348, respectively. In at least one example embodiment, each of the fourth and fifth upper wirings 354 and 355 may extend in the first direction.

As illustrated above, the semiconductor integrated circuit may include the gate structures 151, 152, 153, 154, 155, 156, 157, 158, 190 and 195, the impurity regions 221, 222, 223, 224, 225, 226, 227, 228, 229, 230, 241, 242, 245 and 246, the contacts 281, 282, 283, 284, 285, 286, 287, 288, 289, 290, 291, 292, 293, 294 and 295, the lower wirings 301, 302, 303, 304, 305, 306, 307, 308, 309, 310, 311 and 312, the vias 341, 342, 343, 344, 345, 346, 347 and 348, and the upper wirings 351, 352, 353, 354 and 355, and at least some of the above elements may be electrically connected to each other to form the equivalent circuit shown in FIG. 1.

The semiconductor integrated circuit may include a PMOS gate and an NMOS gate that may be cross-coupled to each other through the contacts, the lower wirings, the vias and/or the upper wirings, and thus a circuit having PMOS and NMOS gates cross-coupled to each other, e.g., a clock latch circuit, may be implemented with little, minimal or no increase of area.

In at least some example embodiments, the first gate structure 151 and the first and third impurity regions 221 and 223 may form a PMOS transistor of a transmission gate, and the second gate structure 152 and the second and fourth impurity regions 222 and 224 may form an NMOS transistor of the transmission gate.

Accordingly, the first and second impurity regions 221 and 222 serving as a source/drain region of the transmission gate may be electrically connected to each other through the twelfth and thirteenth contacts 292 and 293, the ninth and tenth lower wirings 309 and 310, the fifth and sixth vias 345 and 346, and the third upper wiring 353. Additionally, the third and fourth impurity regions 223 and 224 serving as a source/drain region of the transmission gate may be electrically connected to each other through the fifth and sixth contacts 285 and 286, the fourth and fifth lower wirings 304 and 305, the third and fourth vias 343 and 344, and the second upper wiring 352.

The second and third gate structures 152 and 153 to which a first signal, e.g., an nclock signal, may be commonly applied may be electrically connected to each other through the second and third contacts 282 and 283, the second and third lower wirings 302 and 303, the first and second vias 341 and 342, and the first upper wiring 351, and may be electrically connected to the fourth upper wiring 354 through the fourteenth contact 294, the eleventh lower wiring 311 and the seventh via 347.

The first and fourth gate structures 151 and 154 to which a second signal, e.g., a bclock signal, may be commonly applied may be electrically connected to each other through the first and fourth contacts 281 and 284, and the first lower wiring 301, and may be electrically connected to the fifth upper wiring 355 through the fifteenth contact 295, the twelfth lower wiring 312 and the eighth via 348.

The PMOS transistor including the fifth gate structure 155, which may share the fifth impurity region 225 as a source/drain region with the third gate structure 153, may include the seventh impurity region 227 as another source/drain region, and a drain supply voltage VDD may be applied thereto. That is, the seventh lower wiring 307 applying the drain supply voltage VDD may be electrically connected to the seventh impurity region 227 through the tenth contact 290.

Additionally, the NMOS transistor including the sixth gate structure 156, which may share the sixth impurity region 226 as a source/drain region with the fourth gate structure 154, may include the eighth impurity region 228 as another source/drain region, which may be grounded. That is, for example, the eighth lower wiring 308 applying a source supply voltage VSS to an element so that the element may be grounded may be electrically connected to the eighth impurity region 228 through the eleventh contact 291.

The seventh gate structure 157 and the seventh and ninth impurity regions 227 and 229 may form a PMOS transistor of an inverter circuit, and the eighth gate structure 158 and the eighth and tenth impurity regions 228 and 230 may form an NMOS transistor of the inverter circuit. An input terminal of the inverter circuit may be electrically connected to the third and fourth impurity regions 223 and 224, and an output terminal of the inverter circuit may be electrically connected to the fifth and sixth gate structures 155 and 156.

More particularly, for example, the input terminal of the inverter circuit, e.g., the seventh and eighth gate structures 157 and 158, may be electrically connected to the third and fourth impurity regions 223 and 224 through the fifth to seventh contacts 285, 286 and 287, the fourth and fifth lower wirings 304 and 305, and the second upper wiring 352. Additionally, the output terminal of the inverter circuit, e.g., the tenth impurity region 230, may be electrically connected to the fifth and sixth gate structures 155 and 156 through the eighth and ninth contacts 288 and 289, and the sixth lower wiring 306.

The layout of the elements for implementing the equivalent circuit shown in FIG. 1 may not be limited to that of FIG. 2A. For example, even though FIG. 2A shows that the elements are electrically connected to each other through the contacts and the lower wirings, the elements may be electrically connected to each other through the vias and the upper wirings in addition thereto. Additionally, even though FIG. 2A shows that the elements are electrically connected to each other through the contacts, the lower wirings, the vias and the upper wirings, some of the elements may be electrically connected to each other through only the contacts and the lower writings.

Referring to FIG. 2B, the second and third lower wirings 302 and 303 may contact the top surfaces of the second and third contacts 282 and 283, respectively, but may not extend in the first and second directions. That is, for example, the second and third lower wirings may have relatively small, but sufficient, areas for contacting the second and third contacts 282 and 283, respectively, and the first and second vias 341 and 342 may be formed on the top surfaces of the second and third lower wirings, respectively. The first upper wiring 351 may not be formed in the same level with the first lower wiring 301, and thus may overlap the first lower wiring 301 in a plan view. In at least one example embodiment, the first upper wiring 351 may include a portion extending in the first direction and a portion extending in the second direction, and may commonly contact the top surfaces of the first and second vias 341 and 342.

Figure 2C:
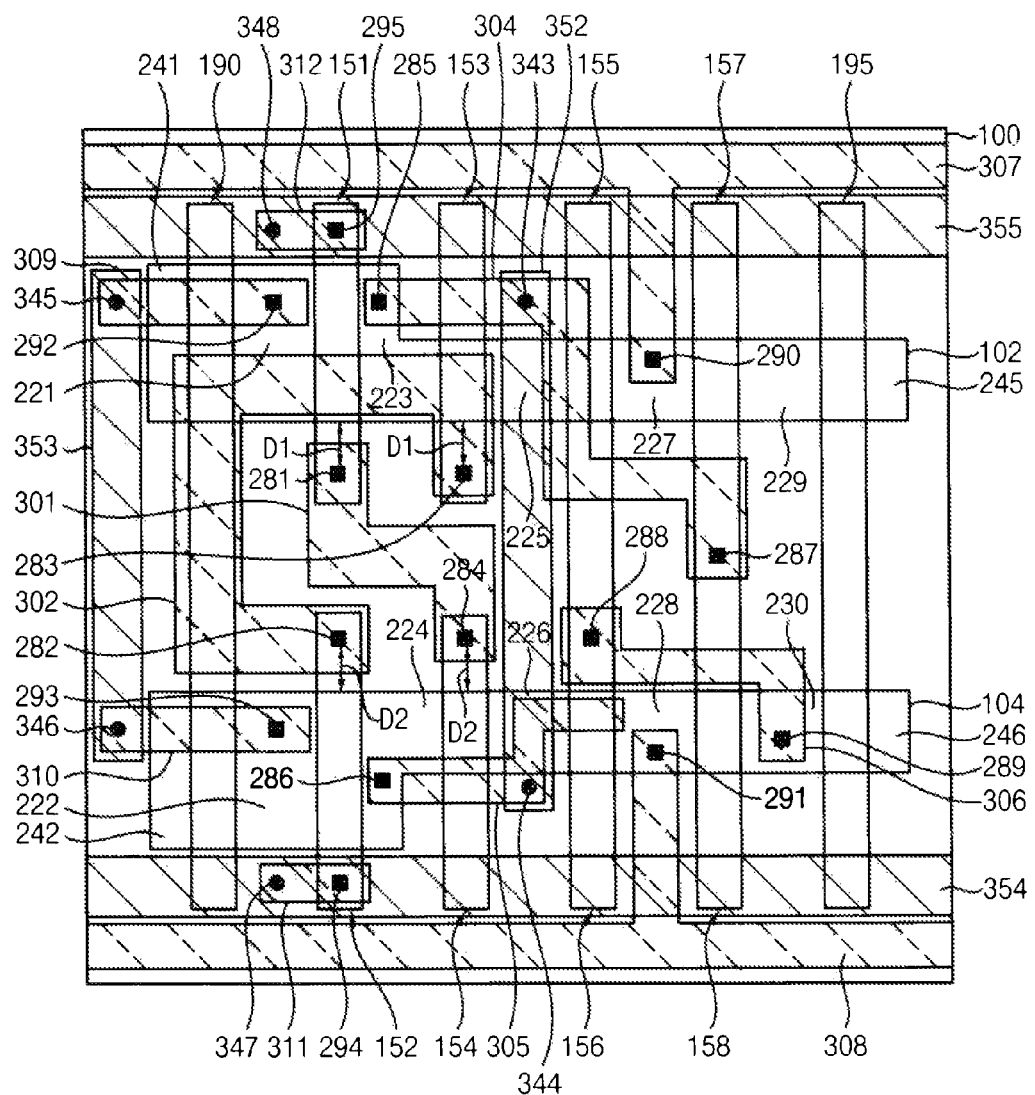

Referring to FIG. 2C, the second lower wiring 302 may commonly contact the top surfaces of the second and third contacts 282 and 283, and may not contact the first lower wiring 301. Unlike that of FIG. 2A, the second and third contacts 282 and 283 may be electrically connected to each other not through the lower wirings, the vias and the upper wirings, but through only the lower wirings. Accordingly, in at least one example embodiment, the second lower wiring 302 may include a portion extending in the first direction and a portion extending in the second direction, and may commonly contact the top surfaces of the second and third contacts 282 and 283. However, the second and third contacts 282 and 283 may be electrically connected to each other through only the second lower wiring 302, and thus the third lower wiring 303, the first and second vias 341 and 342, and the first upper wiring 351 may not be formed.

Until now, the layout of the clock latch circuit, which may be a circuit having the gate structures of the PMOS transistor and the NMOS transistor cross-coupled to each other, has been illustrated, however, inventive concepts may not be limited thereto. Rather, inventive concepts may include any circuit having gate structures of PMOS and NMOS transistors that may be cross-coupled to each other.

Figure 6:
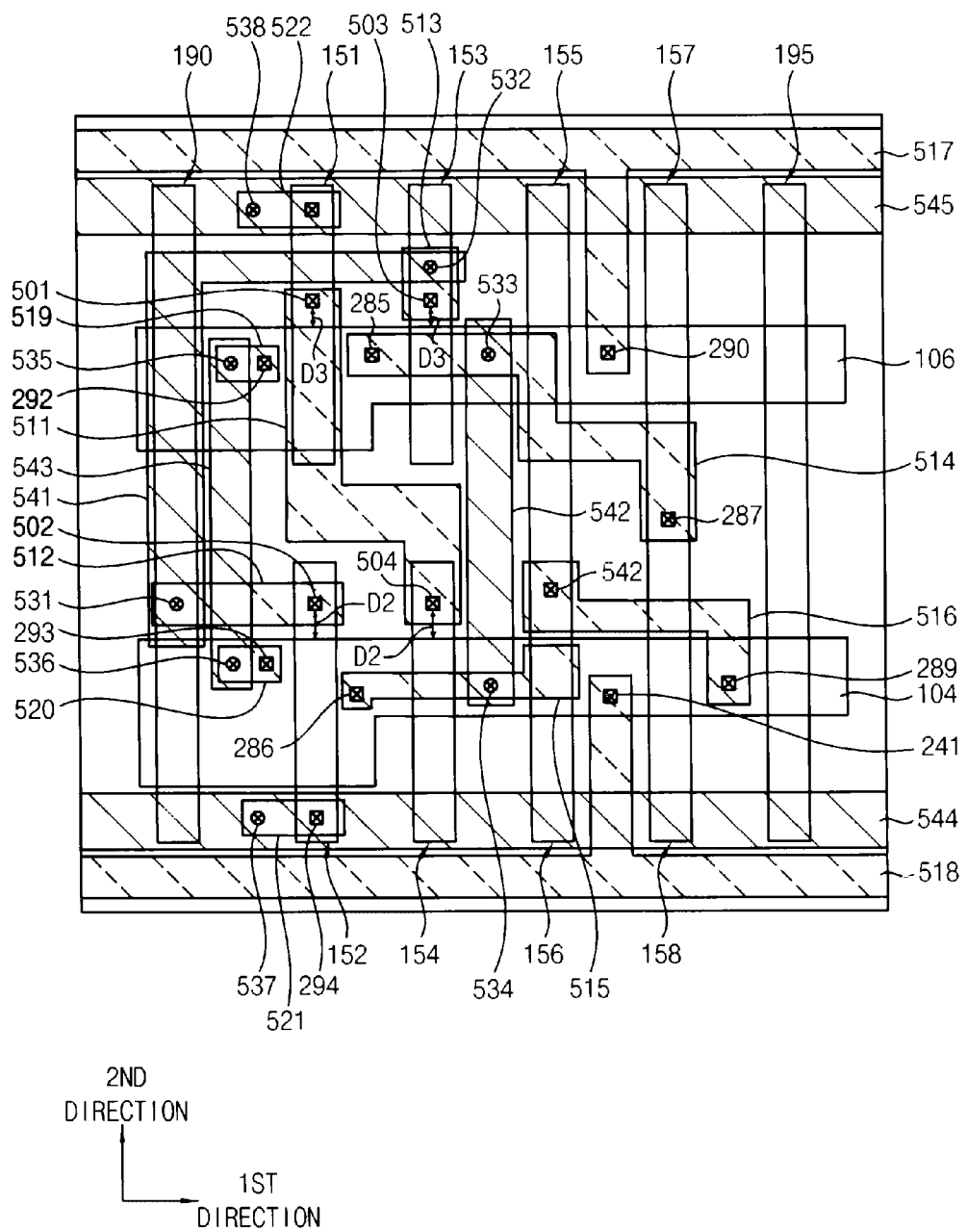

FIGS. 4 to 6 are plan views illustrating layouts of region X shown in FIG. 1 in accordance with other example embodiments. The equivalent circuit shown in FIG. 1 may be implemented by the layouts of the circuit shown in FIGS. 4 to 6, which may be substantially the same as or similar to that of FIG. 2A, except for the position of some contacts, and the shapes of the active regions and the corresponding lower and upper wirings. Thus, like reference numerals refer to like elements, and detailed descriptions thereon may be omitted below in the interest of brevity.

Referring to FIG. 4, the semiconductor integrated circuit may include fifth and sixth active regions 106 and 108, the first to tenth gate structures 151, 152, 153, 154, 155, 156, 157, 158, 190 and 195, sixteenth to nineteenth contacts 401, 402, 403 and 404, the fifth to fifteenth contacts 285, 286, 287, 288, 289, 290, 291, 292, 293, 294 and 295, thirteenth to twenty-fourth lower wirings 411, 412, 413, 414, 415, 416, 417, 418, 419, 420, 421 and 422, ninth to sixteenth vias 431, 432, 433, 434, 435, 436, 437 and 438, and sixth to tenth upper wirings 441, 442, 443, 444 and 445.

Each of the fifth and sixth active regions 106 and 108 may extend in the first direction, and the fifth and sixth active regions 106 and 108 may be spaced apart from each other in the second direction. At least a portion of each of the fifth and sixth active regions 106 and 108 may be doped with p-type and n-type impurities, respectively.

In at least some example embodiments, a portion of the fifth active region 106 on which the first gate structure 151 is formed may have a width in the second direction greater than that of a portion of the fifth active region 106 on which the third gate structure 153 is formed. Thus, FIG. 4 shows that a width of a portion of the fifth active region 106 on which the first and ninth gate structures 153 and 190 are formed is greater than that of the fifth active region 106 on which the third, fifth, seventh and tenth gate structures 153, 155, 157 and 195 are formed. Additionally, a portion of the sixth active region 108 on which the second gate structure 152 is formed may have a width in the second direction greater than that of a portion of the sixth active region 108 on which the fourth gate structure 154 is formed. Thus, FIG. 4 shows that a width of a portion of the sixth active region 108 on which the second and ninth gate structures 152 and 190 are formed is greater than that of the sixth active region 108 on which the fourth, sixth, eighth and tenth gate structures 154, 156, 158 and 195 are formed.

The fifth active region 106 may have a first boundary adjacent to the first portion of the isolation layer 110, and a second boundary opposite to the first boundary in the second direction. In at least some example embodiments, the second boundary may have a linear shape (e.g., more uniform, not crooked) in the first direction. Additionally, the sixth active region 108 may have a third boundary adjacent to the first portion of the isolation layer 110, and a fourth boundary opposite to the third boundary in the second direction. In at least some example embodiments, the fourth boundary may have a linear shape (e.g., more uniform, not crooked) in the first direction.

The sixteenth and eighteenth contacts 401 and 403 may be formed on a portion of the respective first and third gate structures 151 and 153 on the third portion of the isolation layer 110. In at least some example embodiments, each of the sixteenth and eighteenth contacts 401 and 403 may be spaced apart from the second boundary of the fifth active region 106 in the second direction by a third distance D3. That is, for example, the sixteenth and eighteenth contacts 401 and 403 may be spaced apart from the fifth active region 106 in the second direction by the same or substantially the same distance. Additionally, each of the seventeenth and nineteenth contacts 402 and 404 may be spaced apart from the fourth boundary of the sixth active region 108 in the second direction by a fourth distance D4. That is, for example, the seventeenth and nineteenth contacts 402 and 404 may be spaced apart from the sixth active region 108 in the second direction by the same or substantially the same distance. The third and fourth distances D3 and D4 may be the same, substantially the same or different from each other.

In at least some example embodiments, as the second and fourth boundaries of the fifth and sixth active regions 106 and 108 have linear shapes (e.g., more uniform, not crooked) in the first direction, the sixteenth and eighteenth contacts 401 and 403 may be aligned with each other in the first direction, and the seventeenth and nineteenth contacts 402 and 404 may be aligned with each other in the first direction.

The thirteenth to twenty-fourth lower wirings 411, 412, 413, 414, 415, 416, 417, 418, 419, 420, 421 and 422 may correspond to the first to twelfth lower wirings 301, 302, 303, 304, 305, 306, 307, 308, 309, 310, 311 and 312, respectively, shown in FIG. 2, the ninth to sixteenth vias 431, 432, 433, 434, 435, 436, 437 and 438 may correspond to the first to eighth vias 341, 342, 343, 344, 345, 346, 347 and 348, respectively, shown in FIG. 2, and the sixth to tenth upper wirings 441, 442, 443, 444 and 445 may correspond to the first to fifth upper wirings 351, 352, 353, 354 and 355, respectively, shown in FIG. 2. That is, for example, according to the change of the locations of the first to fourth contacts 281, 282, 283 and 284, the shapes of the thirteenth to twenty-fourth lower wirings 411, 412, 413, 414, 415, 416, 417, 418, 419, 420, 421 and 422, the ninth to sixteenth vias 431, 432, 433, 434, 435, 436, 437 and 438, and the sixth to tenth upper wirings 441, 442, 443, 444 and 445, which may be formed on or over the first to fourth contacts 281, 282, 283 and 284, may be partially changed.

Referring to FIG. 5, the semiconductor integrated circuit may include the first and sixth active regions 102 and 108, the first to tenth gate structures 151, 152, 153, 154, 155, 156, 157, 158, 190 and 195, twentieth to twenty-third contacts 451, 452, 453 and 454, the fifth to fifteenth contacts 285, 286, 287, 288, 289, 290, 291, 292, 293, 294 and 295, twenty-fifth to thirty-sixth lower wirings 461, 462, 463, 464, 465, 466, 467, 468, 469, 470, 471 and 472, seventeenth to twenty-fourth vias 481, 482, 483, 484, 485, 486, 487 and 488, and eleventh to fifteenth upper wirings 491, 492, 493, 494 and 495.

The twentieth and twenty-second contacts 451 and 453 may be formed on a portion of the respective first and third gate structures 151 and 153 on the first portion of the isolation layer 110. In at least some example embodiments, each of the twentieth and twenty-second contacts 451 and 453 may be spaced apart from the first boundary of the first active region 102 in the second direction by the first distance D1. The twenty-first and twenty-third contacts 452 and 454 may be formed on a portion of the respective second and fourth gate structures 152 and 154 on the second portion of the isolation layer 110. In at least some example embodiments, each of the twenty-first and twenty-third contacts 452 and 454 may be spaced apart from the fourth boundary of the sixth active region 108 in the second direction by the fourth distance D4.

In at least some example embodiments, as the first and third boundaries of the first and sixth active regions 102 and 108 have linear shapes (e.g., more uniform, not crooked) in the first direction, the twentieth and twenty-second contacts 451 and 453 may be aligned with each other in the first direction, and the twenty-first and twenty-third contacts 452 and 454 may be aligned with each other in the first direction.

The twenty-fifth to thirty-sixth lower wirings 461, 462, 463, 464, 465, 466, 467, 468, 469, 470, 471 and 472 may correspond to the first to twelfth lower wirings 301, 302, 303, 304, 305, 306, 307, 308, 309, 310, 311 and 312, respectively, shown in FIG. 2, the seventeenth to twenty-fourth vias 481, 482, 483, 484, 485, 486, 487 and 488 may correspond to the first to eighth vias 341, 342, 343, 344, 345, 346, 347 and 348, respectively, shown in FIG. 2, and the sixth to tenth upper wirings 441, 442, 443, 444 and 445 may correspond to the first to fifth upper wirings 351, 352, 353, 354 and 355, respectively, shown in FIG. 2.

Referring to FIG. 6, the semiconductor integrated circuit may include the fifth and second active regions 106 and 104, the first to tenth gate structures 151, 152, 153, 154, 155, 156, 157, 158, 190 and 195, twenty-fourth to twenty-seventh contacts 501, 502, 503 and 504, the fifth to fifteenth contacts 285, 286, 287, 288, 289, 290, 291, 292, 293, 294 and 295, thirty-seventh to forty-eighth lower wirings 511, 512, 513, 514, 515, 516, 517, 518, 519, 520, 521 and 522, twenty-fifth to thirty-second vias 531, 532, 533, 534, 535, 536, 537 and 538, and sixteenth to twentieth upper wirings 541, 542, 543, 544 and 545.

The twenty-fourth and twenty-sixth contacts 501 and 503 may be formed on a portion of the respective first and third gate structures 151 and 153 on the third portion of the isolation layer 110. In at least some example embodiments, each of the twenty-fourth and twenty-sixth contacts 501 and 503 may be spaced apart from the second boundary of the fifth active region 106 in the second direction by the third distance D3. The twenty-fifth and twenty-seventh contacts 502 and 504 may be formed on a portion of the respective second and fourth gate structures 152 and 154 on the first portion of the isolation layer 110. In at least some example embodiments, each of the twenty-fifth and twenty-seventh contacts 502 and 504 may be spaced apart from the third boundary of the second active region 104 in the second direction by the second distance D2.

In at least some example embodiments, as the second and third boundaries of the fifth and second active regions 106 and 104 have linear shapes (e.g., more uniform, not crooked) in the first direction, the twenty-fourth and twenty-sixth contacts 501 and 503 may be aligned with each other in the first direction, and the twenty-fifth and twenty-seventh contacts 502 and 504 may be aligned with each other in the first direction.

The thirty-seventh to forty-eighth lower wirings 511, 512, 513, 514, 515, 516, 517, 518, 519, 520, 521 and 522 may correspond to the first to twelfth lower wirings 301, 302, 303, 304, 305, 306, 307, 308, 309, 310, 311 and 312, respectively, shown in FIG. 2, the twenty-fifth to thirty-second vias 531, 532, 533, 534, 535, 536, 537 and 538 may correspond to the first to eighth vias 341, 342, 343, 344, 345, 346, 347 and 348, respectively, shown in FIG. 2, and the sixteenth to twentieth upper wirings 541, 542, 543, 544 and 545 may correspond to the first to fifth upper wirings 351, 352, 353, 354 and 355, respectively, shown in FIG. 2.

Figure 38:
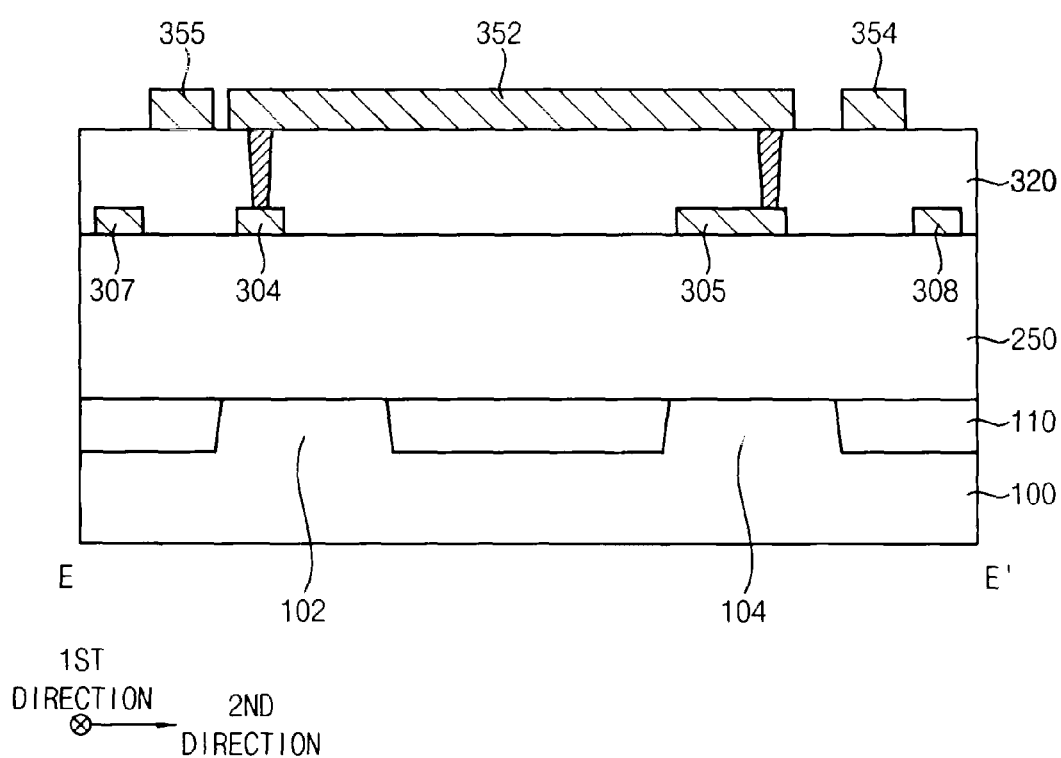

FIGS. 7 to 38 are plan views and cross-sectional views illustrating stages of a method of manufacturing a semiconductor integrated circuit in accordance with example embodiments. More particularly, FIGS. 7, 9, 12, 15, 18, 21, 25, 29 and 33 are plan views, and FIGS. 8, 10-11, 13-14, 16-17, 19-20, 22-24, 26-28, 30-32 and 34-38 are cross-sectional views. FIGS. 8, 10, 16, 19, 22 and 34 are cross-sectional views taken along a line A-A' of corresponding plan views, FIGS. 11, 13, 17, 20, 23, 26, 30 and 35 are cross-sectional views taken along a line B-B' of corresponding plan views, FIGS. 14, 27, 31 and 36 are cross-sectional views taken along a line C-C' of corresponding plan views, FIGS. 24, 28, 32 and 37 are cross-sectional views taken along a line D-D' of corresponding plan views, and FIG. 38 is a cross-sectional view taken along a line E-E' of a corresponding plan view.

Figure 7:
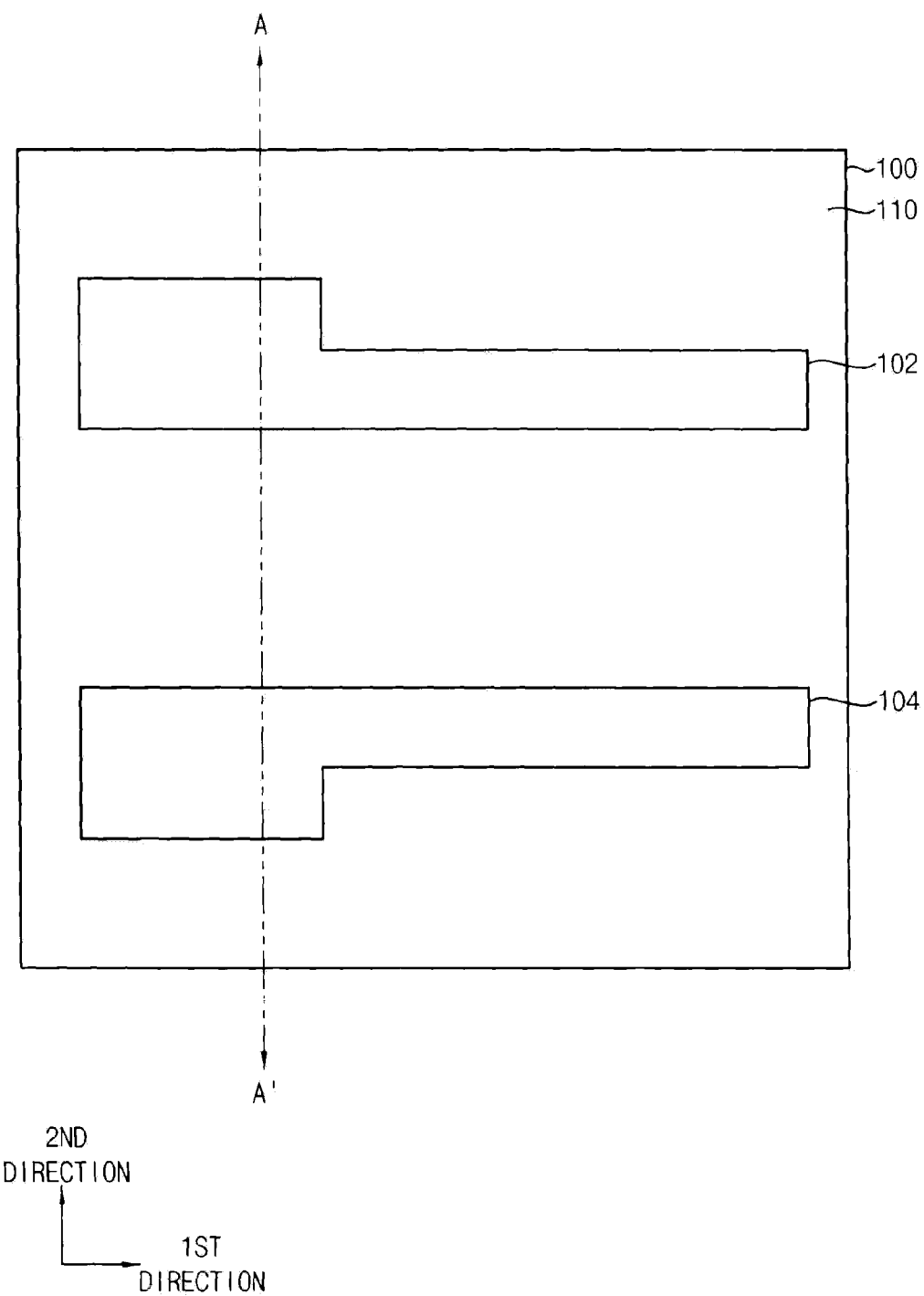
Figure 8:
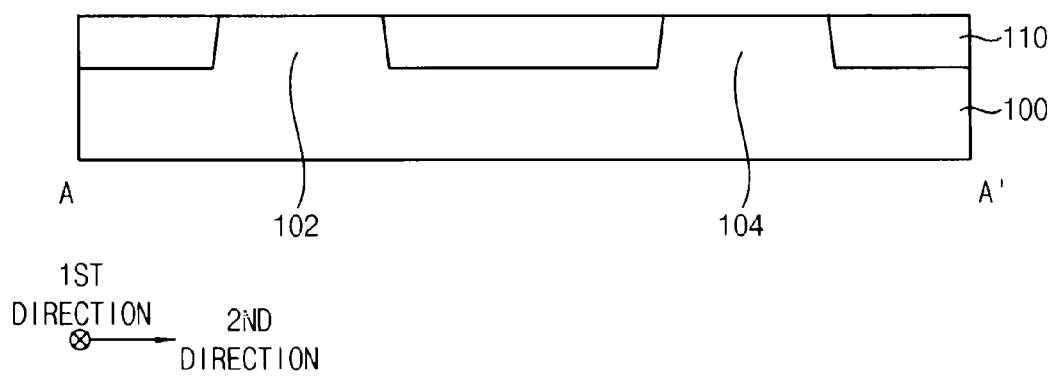

Referring to FIGS. 7 and 8, an upper portion of a substrate 100 may be partially etched to form a trench (not shown), and an isolation layer 110 may be formed to fill the trench.

In at least some example embodiments, the isolation layer 110 may be formed by forming an insulation layer on the substrate 100 to sufficiently fill the trench, and planarizing the insulation layer until a top surface of the substrate 100 may be exposed. The insulation layer may be formed to include an oxide, e.g., silicon oxide.

As the isolation layer 110 may be formed on the substrate 100, a field region of which a top surface may be covered by the isolation layer 110 and first and second active regions 102 and 104 of which a top surface may not be covered by the isolation layer 110 may be defined in the substrate 100.

In at least some example embodiments, each of the first and second active regions 102 and 104 may extend in a first direction parallel or substantially parallel to a top surface of the substrate 100, and the first and second active regions 102 and 104 may be spaced apart from each other in a second direction parallel or substantially parallel to the top surface of the substrate 100 and perpendicular or substantially perpendicular to the first direction.

In at least some example embodiments, a width of each of the first and second active regions 102 and 104 in the second direction may be formed to vary in the first direction. However, inventive concepts may not be limited thereto, and the width of each of the first and second active regions 102 and 104 in the second direction may be formed to be constant in the first direction.

The isolation layer 110 may include a first portion between the first and second active regions 102 and 104, a second portion opposite to the first portion of the isolation layer 110 in the second direction with respect to the second active region 104, and a third portion opposite to the first portion of the isolation layer 110 in the second direction with respect to the first active region 102.

The first active region 102 may have a first boundary adjacent to the first portion of the isolation layer 110, and a second boundary adjacent to the third portion of the isolation layer 110. In at least some example embodiments, the first boundary may have a linear shape (e.g., more uniform, not crooked) in the first direction. Additionally, the second active region 104 may have a third boundary adjacent to the first portion of the isolation layer 110, and a fourth boundary adjacent to the second portion of the isolation layer 110. In at least some example embodiments, the third boundary may have a linear shape (e.g., more uniform, not crooked) in the first direction.

Figure 9:
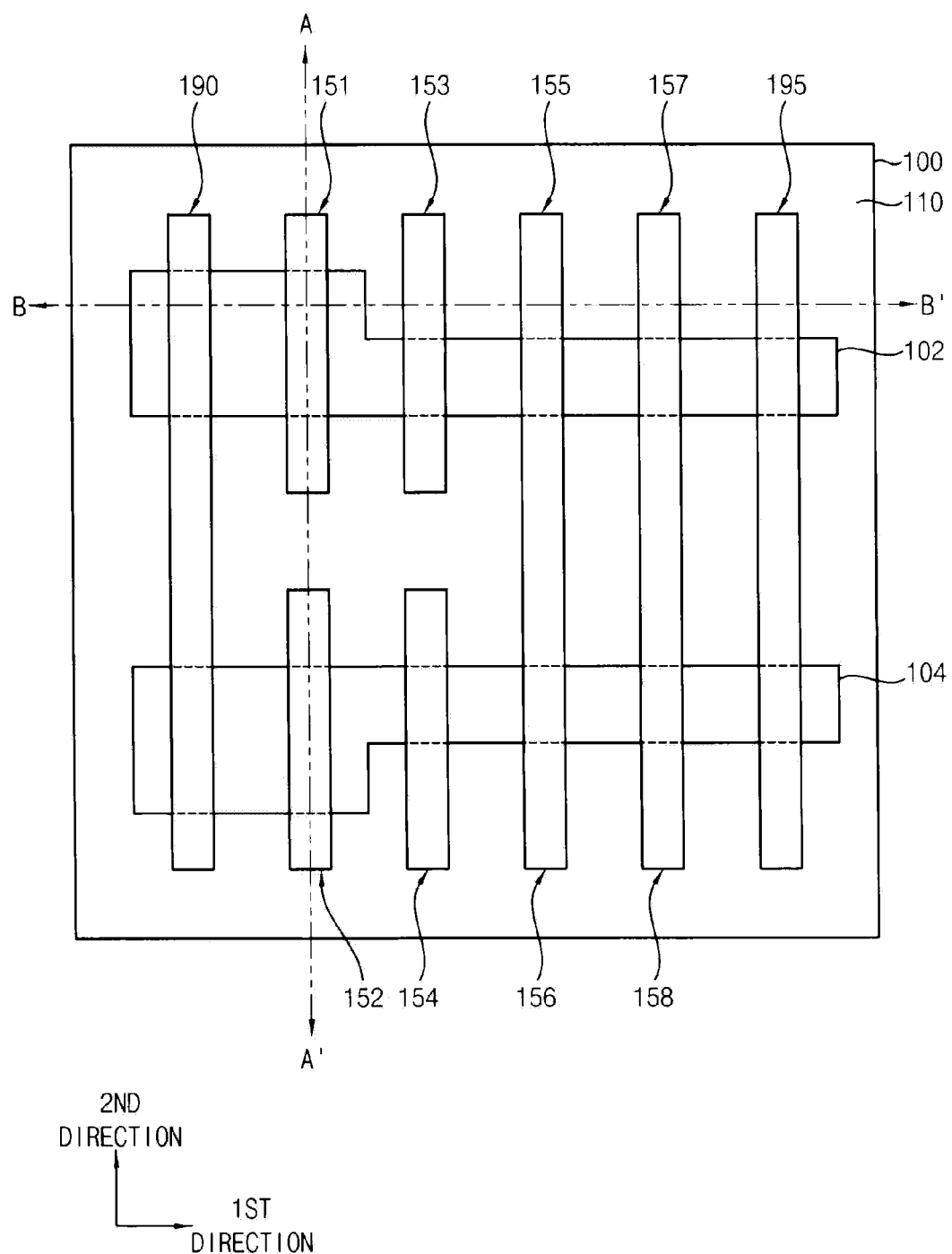
Figure 10:
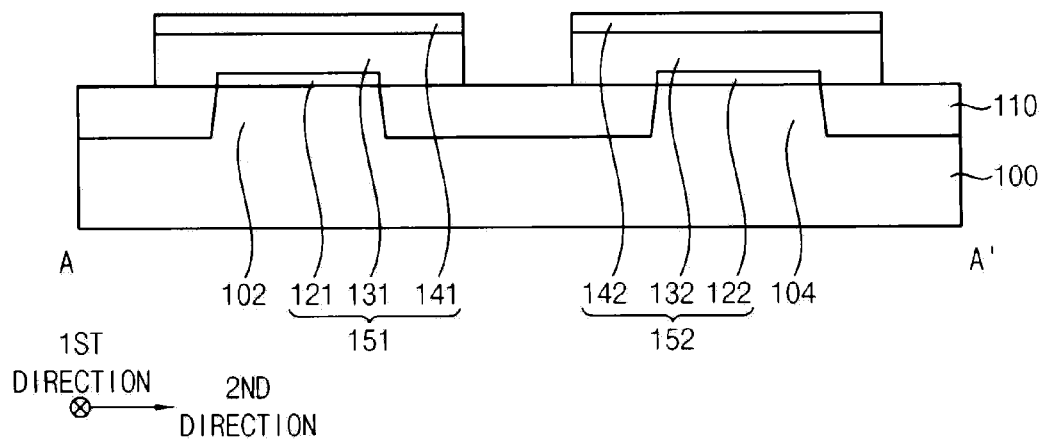
Figure 11:
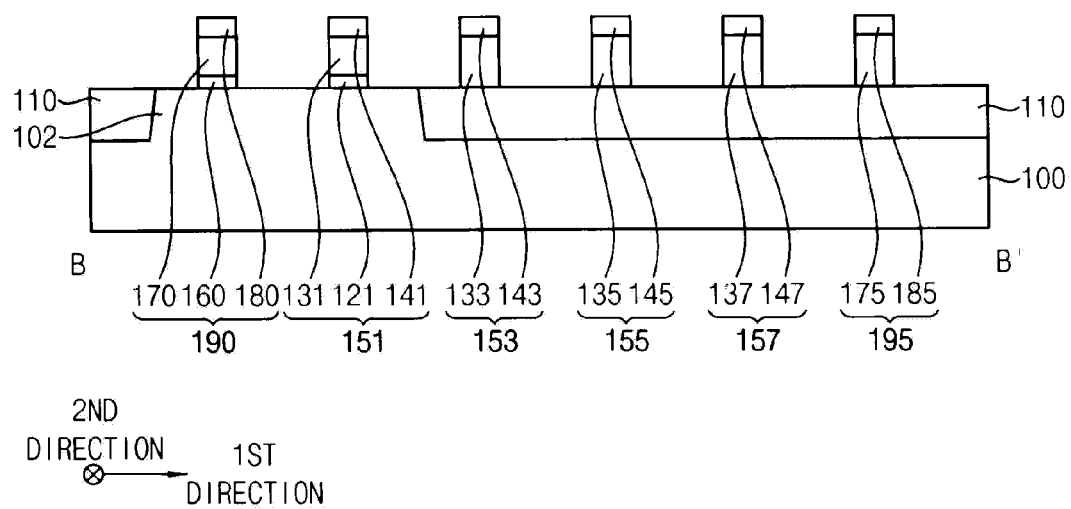

Referring to FIGS. 9 to 11, a gate insulation layer, a gate electrode layer and a gate mask layer may be sequentially formed on the first and second active regions 102 and 104 of the substrate 100 and the isolation layer 110, and may be patterned to form gate structures 151, 152, 153, 154, 155, 156, 157, 158, 190 and 195.

The gate insulation layer may be formed to include an oxide, e.g., silicon oxide, the gate electrode layer may be formed to include, e.g., doped polysilicon, a metal, a metal nitride, etc., and the gate mask layer may be formed to include a nitride, e.g., silicon nitride.

In at least one example embodiment, the gate insulation layer may be formed by a thermal oxidation process on an upper portion of the substrate 100, and in this case, may be formed only on the first and second active regions 102 and 104. Alternatively, the gate insulation layer may be formed by a chemical vapor deposition (CVD) process, an atomic layer deposition (ALD) process, etc., and in this case, may be formed not only on the first and second active regions 102 and 104, but also on the isolation layer 110.

Each of the first, third, fifth and seventh gate structures 151, 153, 155 and 157 may extend in the second direction on the first active region 102 and a portion of the isolation layer 110 adjacent thereto, and the first, third, fifth and seventh gate structures 151, 153, 155 and 157 may be formed to be spaced apart from each other in the first direction. Additionally, each of the second, fourth, sixth and eighth gate structures 152, 154, 156 and 158 may extend in the second direction on the second active region 104 and a portion of the isolation layer 110 adjacent thereto, and the second, fourth, sixth and eighth gate structures 152, 154, 156 and 158 may be formed to be spaced apart from each other in the first direction.

The first and second gate structures 151 and 152 may be spaced apart from and face each other in the second direction, and the third and fourth gate structures 153 and 154 may be spaced apart from and face each other in the second direction. The fifth and sixth gate structures 155 and 156 may face each other in the second direction, and may contact each other on the first portion of the isolation layer 110. The seventh and eighth gate structures 157 and 158 may face each other in the second direction, and may contact each other on the first portion of the isolation layer 110.

The ninth gate structure 190 may extend in the second direction on the first and second active regions 102 and 104 and the isolation layer 110, and may be spaced apart from the first and second gate structures 151 and 152 in the first direction. Additionally, the tenth gate structure 195 may extend in the second direction on the first and second active regions 102 and 104 and the isolation layer 110, and may be spaced apart from the seventh and eighth gate structures 157 and 157 in the first direction.

The first gate structure 151 may include a first gate insulation layer pattern 121, a first gate electrode 131 and a first gate mask 141 sequentially stacked, the second gate structure 152 may include a second gate insulation layer pattern 122, a second gate electrode 132 and a second gate mask 142 sequentially stacked, the third gate structure 153 may include a third gate insulation layer pattern 123, a third gate electrode 133 and a third gate mask 143 sequentially stacked, the fourth gate structure 154 may include a fourth gate insulation layer pattern 124, a fourth gate electrode 134 and a fifth gate mask 144 sequentially stacked, the fifth gate structure 155 may include a fifth gate insulation layer pattern 125, a fifth gate electrode 135 and a fifth gate mask 145 sequentially stacked, the sixth gate structure 156 may include a sixth gate insulation layer pattern 126, a sixth gate electrode 136 and a sixth gate mask 146 sequentially stacked, the seventh gate structure 157 may include a seventh gate insulation layer pattern 127, a seventh gate electrode 137 and a seventh gate mask 147 sequentially stacked, the eighth gate structure 158 may include an eighth gate insulation layer pattern 128, an eighth gate electrode 138 and an eighth gate mask 148 sequentially stacked, the ninth gate structure 190 may include a ninth gate insulation layer pattern 160, a ninth gate electrode 170 and a ninth gate mask 180 sequentially stacked, and the tenth gate structure 195 may include a tenth gate insulation layer pattern 165, a tenth gate electrode 175 and a tenth gate mask 185 sequentially stacked.

Referring to FIGS. 12 to 14, a spacer layer may be formed on the substrate 100 and the isolation layer 110 to cover the gate structures 151, 152, 153, 154, 155, 156, 157, 158, 190 and 195, and may be anisotropically etched to form first to tenth spacers 201, 202, 203, 204, 205, 206, 207, 208, 210 and 215 on opposite sidewalls of respective first to tenth gate structures 151, 152, 153, 154, 155, 156, 157, 158, 190 and 195 in the first direction.

The spacer layer may be formed to include a nitride, e.g., silicon nitride, silicon oxycarbonitride, etc.

Hereinafter, for convenience of explanation, the spacers 201, 202, 203, 204, 205, 206, 207, 208, 210 and 215 will not be illustrated in plan views.

Upper portions of the first and second active regions 102 and 104 not covered by the gate structures 151, 152, 153, 154, 155, 156, 157, 158, 190 and 195 may be doped with impurities to form first to fourteenth impurity regions 221, 222, 223, 224, 225, 226, 227, 228, 229, 230, 241, 242, 245 and 246.

In at least some example embodiments, after forming a first mask (not shown) covering the second active region 104, an ion implantation process may be performed using the first mask and the gate structures 151, 152, 153, 154, 155, 156, 157, 158, 190 and 195 as an ion implantation mask to form the first, third, fifth, seventh and ninth impurity regions 221, 223, 225, 227 and 229 at upper portions of the first active region 102 between the ninth, first, third, fifth, seventh and tenth gate structures 190, 151, 153, 155, 157 and 195 doped with p-type impurities and to form the eleventh and thirteenth impurity regions 241 and 245 at upper portions of the first active region 102 outside of the ninth and tenth gate structures 190 and 195 doped with p-type impurities.

After removing the first mask, after forming a second mask (not shown) covering the first active region 102, an ion implantation process may be performed using the second mask and the gate structures 151, 152, 153, 154, 155, 156, 157, 158, 190 and 195 as an ion implantation mask to form the second, fourth, sixth, eighth and tenth impurity regions 222, 224, 226, 228 and 230 at upper portions of the second active region 104 between the ninth, second, fourth, sixth, eighth and tenth gate structures 190, 152, 154, 156, 158 and 195 doped with n-type impurities and to form the twelfth and fourteenth impurity regions 242 and 246 at upper portions of the second active region 104 outside of the ninth and tenth gate structures 190 and 195 doped with n-type impurities.

Each of the first to tenth gate structures 151, 152, 153, 154, 155, 156, 157, 158, 190 and 195 together with some of the first to fourteenth impurity regions 221, 222, 223, 224, 225, 226, 227, 228, 229, 230, 241, 242, 245 and 246 may form a PMOS transistor or an NMOS transistor.

Figure 15:
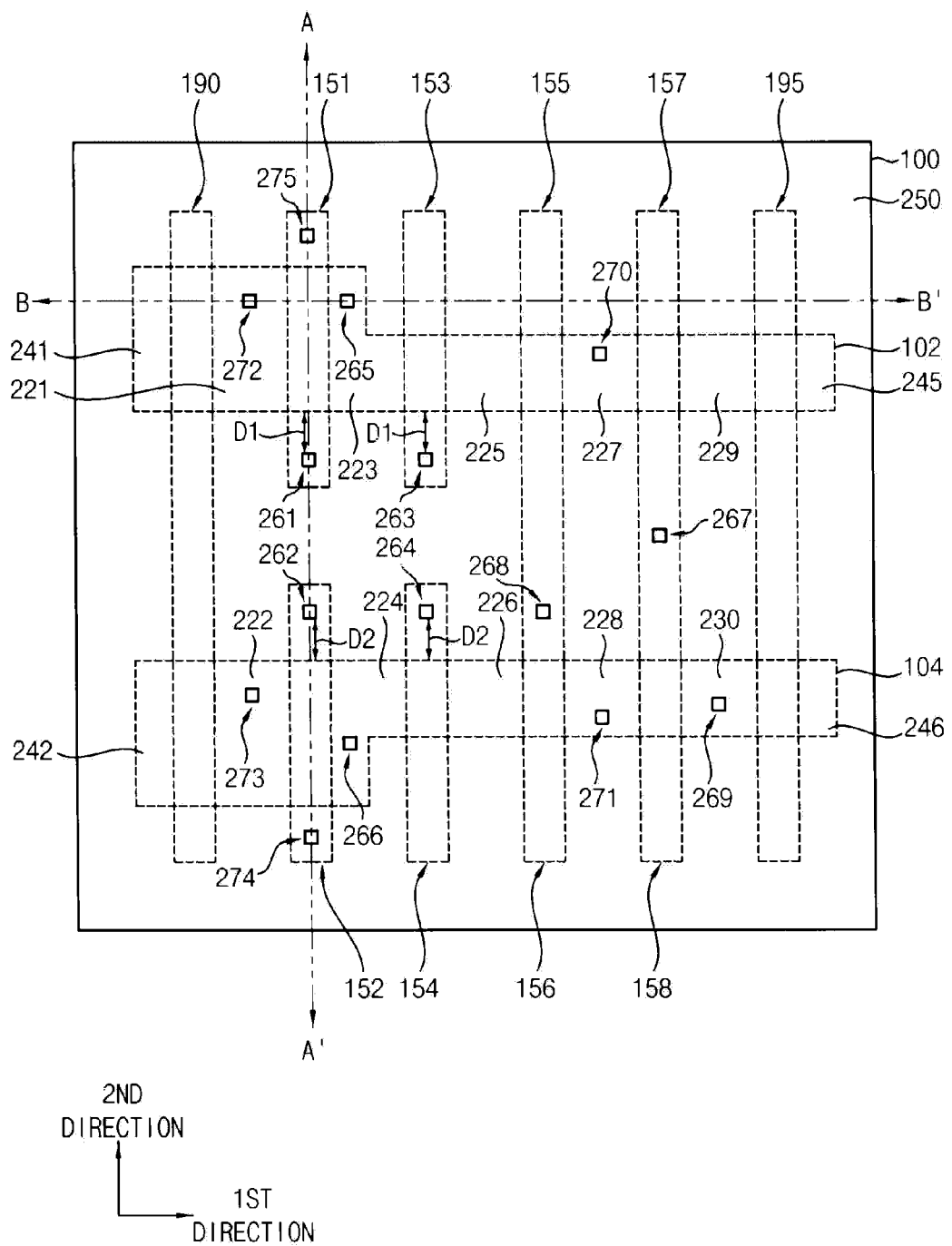
Figure 16:
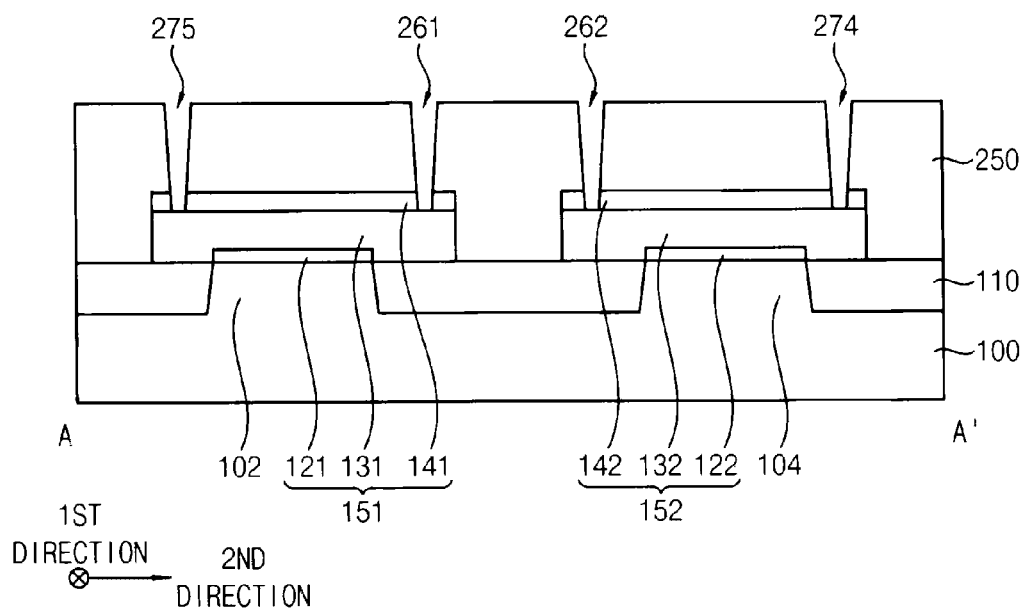
Figure 17:
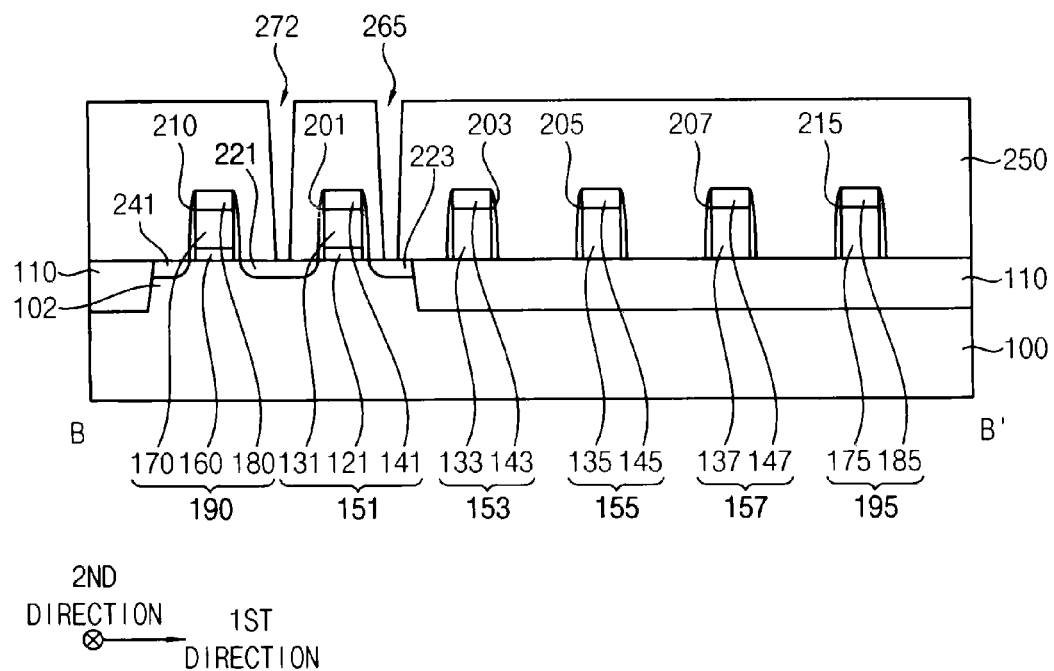

Referring to FIGS. 15 to 17, a first insulating interlayer 250 may be formed on the substrate 100 and the isolation layer 110 to sufficiently cover the transistors, and partially etched to form first to fifteenth openings 261, 262, 263, 264, 265, 266, 267, 268, 269, 270, 271, 272, 273, 274 and 275 exposing some of top surfaces of the first to tenth gate electrodes 131, 132, 133, 134, 135, 136, 137, 138, 170 and 175 of the first to tenth gate structures 151, 152, 153, 154, 155, 156, 157, 158, 190 and 195, respectively, or some of top surfaces of the first to fourteenth impurity regions 221, 222, 223, 224, 225, 226, 227, 228, 229, 230, 241, 242, 245 and 246.

The first insulating interlayer 250 may be formed to include an oxide, e.g., silicon oxide.

More particularly, for example, the first to fourth openings 261, 262, 263 and 264 may expose the top surfaces of the first to fourth gate electrodes 131, 132, 133 and 134, respectively, on the first portion of the isolation layer 110. In at least some example embodiments, each of the first and third openings 261 and 263 may be spaced apart from the first boundary of the first active region 102 by a first distance D1, and each of the second fourth openings 262 and 264 may be spaced apart from the third boundary of the second active region 104 by a second distance D2.

The fifth and sixth openings 265 and 266 may expose the top surfaces of the third and fourth impurity regions 223 and 224, respectively, the seventh opening 267 may expose the top surface of the seventh gate electrode 137 or the eighth gate electrode 138, and the eighth opening 268 may expose the top surface of the fifth gate electrode 135 or the sixth gate electrode 136.

The ninth to thirteenth openings 269, 270, 271, 272 and 273 may expose the top surfaces of the tenth, seventh, eighth, first and second impurity regions 230, 227, 228, 221 and 222, respectively, and the fourteenth and fifteenth openings 274 and 275 may expose the top surfaces of the second and first gate electrodes 132 and 131, respectively.

Referring to FIGS. 18 to 20, after forming a first conductive layer on the first insulating interlayer 250 to fill the first to fifteenth openings 261, 262, 263, 264, 265, 266, 267, 268, 269, 270, 271, 272, 273, 274 and 275, the first conductive layer may be planarized until a top surface of the first insulating interlayer 250 may be exposed to form first to fifteenth contacts 281, 282, 283, 284, 285, 286, 287, 288, 289, 290, 291, 292, 293, 294 and 295 filling the first to fifteenth openings 261, 262, 263, 264, 265, 266, 267, 268, 269, 270, 271, 272, 273, 274 and 275, respectively.

The first conductive layer may be formed to include, e.g., doped polysilicon, a metal, a metal nitride and/or a metal silicide.

Referring to FIGS. 21 to 24, a second conductive layer may be formed on the first insulating interlayer 250 and the first to fifteenth contacts 281, 282, 283, 284, 285, 286, 287, 288, 289, 290, 291, 292, 293, 294 and 295 and patterned to form first to twelfth lower wirings 301, 302, 303, 304, 305, 306, 307, 308, 309, 310, 311 and 312. The second conductive layer may be formed to include, e.g., a metal, a metal nitride and/or a metal silicide.

Alternatively, the first to twelfth lower wirings 301, 302, 303, 304, 305, 306, 307, 308, 309, 310, 311 and 312 may be formed by a damascene process.

More particularly, for example, an insulating interlayer (not shown) may be formed on the first insulating interlayer 250 and the first to fifteenth contacts 281, 282, 283, 284, 285, 286, 287, 288, 289, 290, 291, 292, 293, 294 and 295, and partially etched to form trenches (not shown). The second conductive layer may be formed on the insulating interlayer to sufficiently fill the trenches, and planarized until a top surface of the insulating interlayer may be exposed to form the first to twelfth lower wirings 301, 302, 303, 304, 305, 306, 307, 308, 309, 310, 311 and 312. In this case, before forming the second conductive layer, a barrier layer (not shown) may be formed, and the second conductive layer may be formed on the barrier layer, and thus the lower wiring may be formed to include a barrier layer pattern (not shown) and a conductive pattern (not shown) sequentially stacked.

Upper wirings may be also formed subsequently by a damascene process, however, for convenience of explanation, only a method of forming the upper wirings by the patterning process will be illustrated.

The first lower wiring 301 may contact top surfaces of the first and fourth contacts 281 and 284, and may include a portion extending in the first direction and a portion extending in the second direction. The second and third lower wirings 302 and 303 may contact top surfaces of the second and third contacts 282 and 283, respectively. The second lower wiring 302 may extend in the first direction, and the third lower wiring 303 may extend in the second direction.

The fourth lower wiring 304 may commonly contact top surfaces of the fifth and seventh contacts 285 and 287, and may include a portion extending in the first direction and a portion extending in the second direction. The fifth lower wiring 305 may contact a top surface of the sixth contact 286, and may include a portion extending in the first direction and a portion extending in the second direction. The sixth lower wiring 306 may commonly contact top surfaces of the eighth and ninth contacts 288 and 289, and may include a portion extending in the first direction and a portion extending in the second direction.

The seventh and eighth lower wirings 307 and 308 may contact top surfaces of the tenth and eleventh contacts 290 and 291, respectively, and each of the seventh and eighth lower wirings 307 and 308 may include a portion extending in the first direction and a portion extending in the second direction. The ninth and tenth lower wirings 309 and 310 may contact top surfaces of the twelfth and thirteenth contacts 292 and 293, respectively, and each of the ninth and tenth lower wirings 309 and 310 and may extend in the first direction. The eleventh and twelfth lower wirings 311 and 312 may contact top surfaces of the fourteenth and fifteenth contacts 294 and 295, respectively, and each of the eleventh and twelfth lower wirings 311 and 312 may extend in the first direction.

If only the lower wirings 301, 302, 303, 304, 305, 306, 307, 308, 309, 310, 311 and 312 are formed to contact corresponding contacts, the shapes thereof may not be limited to those illustrated in FIGS. 21 to 24.

Referring to FIGS. 25 to 28, a second insulating interlayer 320 may be formed on the first insulating interlayer 250 and the lower wirings 301, 302, 303, 304, 305, 306, 307, 308, 309, 310, 311 and 312, and partially etched to form sixteenth to twenty-third openings 331, 332, 333, 334, 335, 336, 337 and 338 exposing top surfaces of some of the first to twelfth lower wirings 301, 302, 303, 304, 305, 306, 307, 308, 309, 310, 311 and 312.

The second insulating interlayer 320 may be formed to include an oxide, e.g., silicon oxide.

More particularly, for example, the sixteenth and seventeenth openings 331 and 332 may expose the top surfaces of the second and third lower wirings 302 and 303, respectively, and the eighteenth and nineteenth openings 333 and 334 may expose the top surfaces of the fourth and fifth lower wirings 304 and 305, respectively. The twentieth and twenty-first openings 335 and 336 may expose the top surfaces of the ninth and tenth lower wirings 309 and 310, respectively, and the twenty-second and twenty-third openings 337 and 338 may expose the top surfaces of the eleventh and twelfth lower wirings 311 and 312, respectively.

Referring to FIGS. 29 to 32, a third conductive layer may be formed on the second insulating interlayer 320 to fill the sixteenth to twenty-third openings 331, 332, 333, 334, 335, 336, 337 and 338, and planarized until a top surface of the second insulating interlayer 320 may be exposed to form first to eighth vias 341, 342, 343, 344, 345, 346, 347 and 348 filling the sixteenth to twenty-third openings 331, 332, 333, 334, 335, 336, 337 and 338, respectively. The third conductive layer may be formed to include, e.g., doped polysilicon, a metal, a metal nitride and/or a metal silicide.

Referring to FIGS. 33 to 38, a fourth conductive layer may be formed on the second insulating interlayer 320 and the first to eighth vias 341, 342, 343, 344, 345, 346, 347 and 348, and patterned to form first to fifth upper wirings 351, 352, 353, 354 and 355. The fourth conductive layer may be formed to include, e.g., doped polysilicon, a metal, a metal nitride and/or a metal silicide.

The first upper wiring 351 may commonly contact top surfaces of the first and second vias 341 and 342, and may include a portion extending in the first direction and a portion extending in the second direction. The second upper wiring 352 may commonly contact top surfaces of the third and fourth vias 343 and 344, and may extend in the second direction. The third upper wiring 353 may commonly contact top surfaces of the fifth and sixth vias 345 and 346, and may extend in the second direction. The fourth and fifth upper wirings 354 and 355 may contact top surfaces of the seventh and eighth vias 347 and 348, respectively, and each of the fourth and fifth upper wirings 354 and 355 may extend in the first direction.

If only the upper wirings 351, 352, 353, 354 and 355 are formed to contact corresponding vias, the shapes thereof may not be limited to those illustrated in FIGS. 33 to 38.

A protective layer (not shown) may be further formed on the second insulating interlayer 320 to cover the upper wirings 351, 352, 353, 354 and 355, and thus the semiconductor integrated circuit may be completed. Alternatively, other vias and upper wirings may be further formed to be electrically connected to the upper wirings 351, 352, 353, 354 and 355.

Semiconductor integrated circuits and/or methods of manufacturing the same may be applied to any circuit having cross-coupled PMOS and NMOS gates, e.g., a clock latch circuit. Thus, inventive concepts may be applied to any circuit including the clock latch circuit, or other circuits having the cross-coupled structures. For example, semiconductor integrated circuits and/or methods of manufacturing the same may be applied to logic devices, e.g., central processing units (CPUs), microprocessor units (MPUs), application processors (APs), etc., volatile memory devices, e.g., static random access memory (SRAM) devices, dynamic random access memory (DRAM) devices, etc., or non-volatile memory devices, e.g., flash memory devices, phase-change random access memory (PRAM) devices, magnetoresistive random access memory (MRAM) devices, resistive random access memory (RRAM) devices, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of inventive concepts. Accordingly, all such modifications are intended to be included within the scope of inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor integrated circuit, comprising:
   first and second active regions defined by an isolation layer on a substrate, the first and second active regions being doped with different types of impurities, the first and second active regions extending in a first direction, and the first and second active regions being spaced apart from each other in a second direction, the second direction being substantially perpendicular to the first direction, wherein
      a first portion of the first active region has a first width in the second direction, and a second portion of the first active region has a second width in the second direction, the first width different from the second width;
   a first gate structure, a second gate structure, a third gate structure, and a fourth gate structure, wherein
      the first gate structure is on the first portion of the first active region and a first portion of the isolation layer between the first and second active regions,
      the third gate structure is on the second portion of the first active region and the first portion of the isolation layer between the first and second active regions,
      the first and third gate structures extend in the second direction, and the first and third gate structures are spaced apart from each other in the first direction, and
      the second and the fourth gate structures are on the second active region and the first portion of the isolation layer, the second and fourth gate structures extend in the second direction, the second and fourth gate structures are spaced apart from each other in the first direction, and the second and fourth gate structures face and are spaced apart from the first and third gate structures, respectively, in the second direction; and
   a first contact, a second contact, a third contact, and a fourth contact, the first to fourth contacts between the first and second active regions, and the first to fourth contacts being on portions of the first to fourth gate structures, respectively, wherein
      the first and fourth contacts are electrically connected to each other,
      the second and third contacts are electrically connected to each other,
      the first and third contacts are spaced apart from the first active region in the second direction by substantially the same distance, and
      the second and fourth contacts are spaced apart from the second active region in the second direction by substantially the same distance.

2. The semiconductor integrated circuit of claim 1, wherein
   the first active region is doped with p-type impurities; and
   the second active region is doped with n-type impurities.

3. The semiconductor integrated circuit of claim 1, wherein the first and fourth contacts are electrically connected to each other through a first lower wiring on the first and fourth contacts.

4. The semiconductor integrated circuit of claim 1, further comprising:
   a first impurity region, a second impurity region, a third impurity region, and a fourth impurity region, wherein
      the first and third impurity regions are at upper portions of the first active region at opposite sides of the first gate structure, respectively, and the first and third impurity regions are doped with impurities of a first conductivity type, and
      the second and fourth impurity regions are at upper portions of the second active region at opposite sides of the second gate structure, respectively, and the second and fourth impurity regions are doped with impurities of a second conductivity type.

5. The semiconductor integrated circuit of claim 1, further comprising:
   a fifth gate structure on the first active region and the first portion of the isolation layer, the fifth gate structure extending in the second direction, and being spaced apart from the third gate structure in the first direction; and
   a sixth gate structure on the second active region and the first portion of the isolation layer, the sixth gate structure extending in the second direction, and being spaced apart from the fourth gate structure in the first direction, wherein
      the fifth and sixth gate structures are connected to each other on the first portion of the isolation layer, and
      the fifth and sixth gate structures extend in the second direction.

6. The semiconductor integrated circuit of claim 1, wherein each of the first to fourth gate structures is configured to receive a clock signal from among a plurality of clock signals.

7. The semiconductor integrated circuit of claim 3, further comprising:
   a second lower wiring on the second contact;
   a third lower wiring on the third contact;
   a first via on the second lower wiring;
   a second via on the third lower wiring; and a first upper wiring on both of the first and second vias, wherein
the second and third contacts are electrically connected to each other through the second and third lower wirings, the first and second vias, and the first upper wiring.

8. The semiconductor integrated circuit of claim 4, further comprising:
fifth and sixth contacts on the first and second impurity regions, respectively, the fifth and sixth contacts being electrically connected to each other.

9. The semiconductor integrated circuit of claim 4, further comprising:
fifth and sixth contacts on the third and fourth impurity regions, respectively, the fifth and sixth contacts being electrically connected to each other.

10. A semiconductor integrated circuit, comprising:
first and second active regions defined by an isolation layer on a substrate, the first and second active regions being doped with different types of impurities, the first and second active regions extending in a first direction, and the first and second active regions being spaced apart from each other in a second direction, the second direction being substantially perpendicular to the first direction, wherein
a first portion of the first active region has a first width in the second direction, and a second portion of the first active region has a second width in the second direction, the first width different from the second width;
a first gate structure, a second gate structure, a third gate structure, and a fourth gate structure, wherein
the first gate structure is on the first portion of the first active region and a first portion of the isolation layer adjacent to the first active region,
the third gate structure is on the second portion of the first active region and the first portion of the isolation layer adjacent to the first active region,
the first and third gate structures extend in the second direction, and the first and third gate structures are spaced apart from each other in the first direction, and
the second and fourth gate structures are on the second active region and a second portion of the isolation layer adjacent to the second active region, the second and fourth gate structures extend in the second direction, the second and fourth gate structures are spaced apart from each other in the first direction, and the second and fourth gate structures face and are spaced apart from the first and third gate structures, respectively, in the second direction; and
a first contact, a second contact, a third contact, and a fourth contact, the first to fourth contacts being on portions of the first to fourth gate structures, respectively, wherein
the first and fourth contacts are electrically connected to each other,
the second and third contacts are electrically connected to each other,
the first and third contacts are spaced apart from a same first boundary at a same first side of the first active region in the second direction by substantially the same distance, and
the second and fourth contacts are spaced apart from a same second boundary at a same second side of the second active region in the second direction by substantially the same distance.

11. The semiconductor integrated circuit of claim 10, wherein
the first active region includes first and second boundaries in the second direction;
the second active region includes third and fourth boundaries in the second direction; and
the first and third boundaries face each other.

12. The semiconductor integrated circuit of claim 10, wherein the first and fourth contacts are electrically connected to each other through a first lower wiring on both of the first and fourth contacts.

13. The semiconductor integrated circuit of claim 10, further comprising:
a first impurity region, a second impurity region, a third impurity region, and a fourth impurity region, wherein
the first and third impurity regions are at upper portions of the first active region at opposite sides of the first gate structure, respectively, and the first and third impurity regions are doped with impurities of a first conductivity type, and
the second and fourth impurity regions are at upper portions of the second active region at opposite sides of the second gate structure, respectively, and the second and fourth impurity regions are doped with impurities of a second conductivity type.

14. The semiconductor integrated circuit of claim 10, further comprising:
a fifth gate structure on the first active region and the isolation layer, the fifth gate structure extending in the second direction, and being spaced apart from the third gate structure in the first direction; and
a sixth gate structure on the second active region and the isolation layer, the sixth gate structure extending in the second direction, and being spaced apart from the fourth gate structure in the first direction, wherein
the fifth and sixth gate structures are connected to each other on a portion of the isolation layer between the first and second active regions, and
the fifth and sixth gate structures extend in the second direction.

15. The semiconductor integrated circuit of claim 10, wherein
the second and third gate structures are configured to receive a first clock signal; and
the first and fourth gate structures are configured to receive a second clock signal.

16. A semiconductor integrated circuit comprising:
an inverter circuit;
a transmission circuit including a first transmission transistor and a second transmission transistor, an output terminal of the transmission circuit being coupled to an input terminal of the inverter circuit;
a logic transistor circuit connected in parallel with the inverter circuit, the logic transistor circuit including a plurality of logic transistors connected in series between a supply voltage and ground;
a first contact connected between a first wiring and a gate structure of the first transmission transistor, the gate structure of the first transmission transistor on a first portion of a first active region;
a second contact connected between the first wiring and a gate structure of a first of the plurality of logic transistors, the gate structure of the first of the plurality of logic transistors on a second active region;
a third contact connected between a second wiring and a gate structure of the second transmission transistor, the gate structure of the second transmission transistor on the second active region; and a fourth contact connected between the second wiring and a gate structure of a second of the plurality of logic transistors, the gate structure of the second of the plurality of logic transistors on a second portion of the first active region, wherein the first contact and the fourth contact are spaced apart from the first active region by a first distance in a first direction, the first portion of the first active region has a first width in the first direction, the second portion of the first active region has a second width in the first direction, the first width different is different from the second width, the second contact and the third contact are spaced apart from the second active region by a second distance in the first direction, the first contact and the fourth contact are spaced apart by the first distance in the first direction from a same first boundary at a same first side of the first active region, and the second contact and the third contact are spaced apart by the second distance in the first direction from a same second boundary at a same second side of the second active region.

17. The semiconductor integrated circuit of claim 16, wherein the first distance and the second distance are the same.

18. The semiconductor integrated circuit of claim 16, wherein the first transmission transistor and the first of the plurality of logic transistors are configured to receive a first clock signal; and the second transmission transistor and the second of the plurality of logic transistors are configured to receive a second clock signal.

19. The semiconductor integrated circuit of claim 16, wherein the first transmission transistor and the second of the plurality of logic transistors are PMOS transistors; and the second transmission transistor and the first of the plurality of logic transistors are NMOS transistor.

20. The semiconductor integrated circuit of claim 16, wherein the first boundary has a first linear shape; and
the second boundary has a second linear shape.

* * * * *